US010756096B2

(12) United States Patent
Paul et al.

(10) Patent No.: US 10,756,096 B2
(45) Date of Patent: Aug. 25, 2020

(54) INTEGRATED CIRCUIT STRUCTURE WITH COMPLEMENTARY FIELD EFFECT TRANSISTOR AND BURIED METAL INTERCONNECT AND METHOD

(71) Applicant: GLOBALFOUNDRIES INC., Grand Cayman (KY)

(72) Inventors: Bipul C. Paul, Mechanicville, NY (US); Ruilong Xie, Niskayuna, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 104 days.

(21) Appl. No.: 16/152,454

(22) Filed: Oct. 5, 2018

(65) Prior Publication Data

US 2020/0111798 A1  Apr. 9, 2020

(51) Int. Cl.
*H01L 21/84* (2006.01)
*H01L 27/092* (2006.01)
(Continued)

(52) U.S. Cl.
CPC .... *H01L 27/1108* (2013.01); *H01L 21/76805* (2013.01); *H01L 21/76816* (2013.01);
(Continued)

(58) Field of Classification Search
None
See application file for complete search history.

(56) References Cited

U.S. PATENT DOCUMENTS 7,601,570 B2  10/2009  Damlencourt
8,173,993 B2   5/2012  Bangsaruntip et al.
(Continued)

OTHER PUBLICATIONS

Zheng et al., "FinFET Evolution Toward Stacked-Nanowire FET for CMOS Technology Scaling," IEEE Transactions on Electron Devices, vol. 62, Issue 12, 2015, Abstract.
(Continued)

*Primary Examiner* — Joseph C. Nicely
*Assistant Examiner* — Lamont B Koo
(74) *Attorney, Agent, or Firm* — Gibb & Riley, LLC; Anthony J. Canale

(57) ABSTRACT

Disclosed are structures with a complementary field effect transistor (CFET) and a buried metal interconnect that electrically connects a source/drain region of a lower-level transistor of the CFET with another device. The structure can include a memory cell with first and second CFETs, where each CFET includes a pull-up transistor stacked on and having a common gate with a pull-down transistor and each pull-down transistor has a common source/drain region with a pass-gate transistor. The metal interconnect connects a lower-level source/drain region of the first CFET (i.e., the common source/drain region of first pass-gate and pull-up transistors) to the common gate of the second CFET (i.e., to the common gate of second pull-down and pull-up transistors). Formation methods include forming an interconnect placeholder during lower-level source/drain region formation. After upper-level source/drain regions and replacement metal gates are formed, the interconnect placeholder is exposed, removed and replaced with a metal interconnect.

20 Claims, 40 Drawing Sheets

(51) Int. Cl.
*H01L 27/11* (2006.01)
*H01L 23/528* (2006.01)
*H01L 21/768* (2006.01)
*H01L 29/423* (2006.01)
*H01L 29/78* (2006.01)
*H01L 29/06* (2006.01)

(52) U.S. Cl.
CPC .. *H01L 21/76843* (2013.01); *H01L 21/76883* (2013.01); *H01L 23/5283* (2013.01); *H01L 29/0673* (2013.01); *H01L 29/42392* (2013.01); *H01L 29/7853* (2013.01)

(56) References Cited

U.S. PATENT DOCUMENTS

| | | | |
|---|---|---|---|
| 8,492,220 | B2 | 7/2013 | Erickson et al. |
| 8,679,902 | B1 | 3/2014 | Basker et al. |
| 9,324,842 | B2 | 4/2016 | Zang et al. |
| 9,437,501 | B1 | 9/2016 | Cheng et al. |
| 9,685,564 | B2 | 6/2017 | Sengupta et al. |
| 2007/0007601 | A1 | 1/2007 | Hsu et al. |
| 2008/0135949 | A1 | 6/2008 | Lo et al. |
| 2011/0254013 | A1* | 10/2011 | Xiao ................ H01L 21/84 257/76 |
| 2016/0111513 | A1 | 4/2016 | Liu et al. |
| 2017/0005106 | A1 | 1/2017 | Zhang |
| 2017/0005190 | A1 | 1/2017 | Chang et al. |
| 2017/0040321 | A1 | 2/2017 | Mitard |
| 2017/0077232 | A1 | 3/2017 | Balakrishnan et al. |
| 2019/0074362 | A1* | 3/2019 | Lee ................ H01L 29/66553 |
| 2019/0164846 | A1* | 5/2019 | Leib ................ H01L 21/31144 |

OTHER PUBLICATIONS

Gaillardon et al., "Nanowire Systems: Technology and Design," Philosophical Transactions of The Royal Society A, 372: Jan. 2, 2013, http://dx.doi.org/10.1098/rsta.2013.0102, pp. 1-15.

APA Citation: "World's First Vertically Stacked Gate-All-Around Si Nanowire CMOS Transistors," IMEC, 2016, Retrieved Jun. 14, 2017 from https://phys.org/news/2016-12-world-vertically-stacked-gateall-around-si.html, pp. 1-2.

Sachetto et al., "Vertically-Stacked Gate-All-Around Polysilicon Nanowire FETs with Sub-Im Gates Patterned by Nanostencil Lithography," Microelectronic Engineering, vol. 98, 2012, pp. 355-358.

* cited by examiner

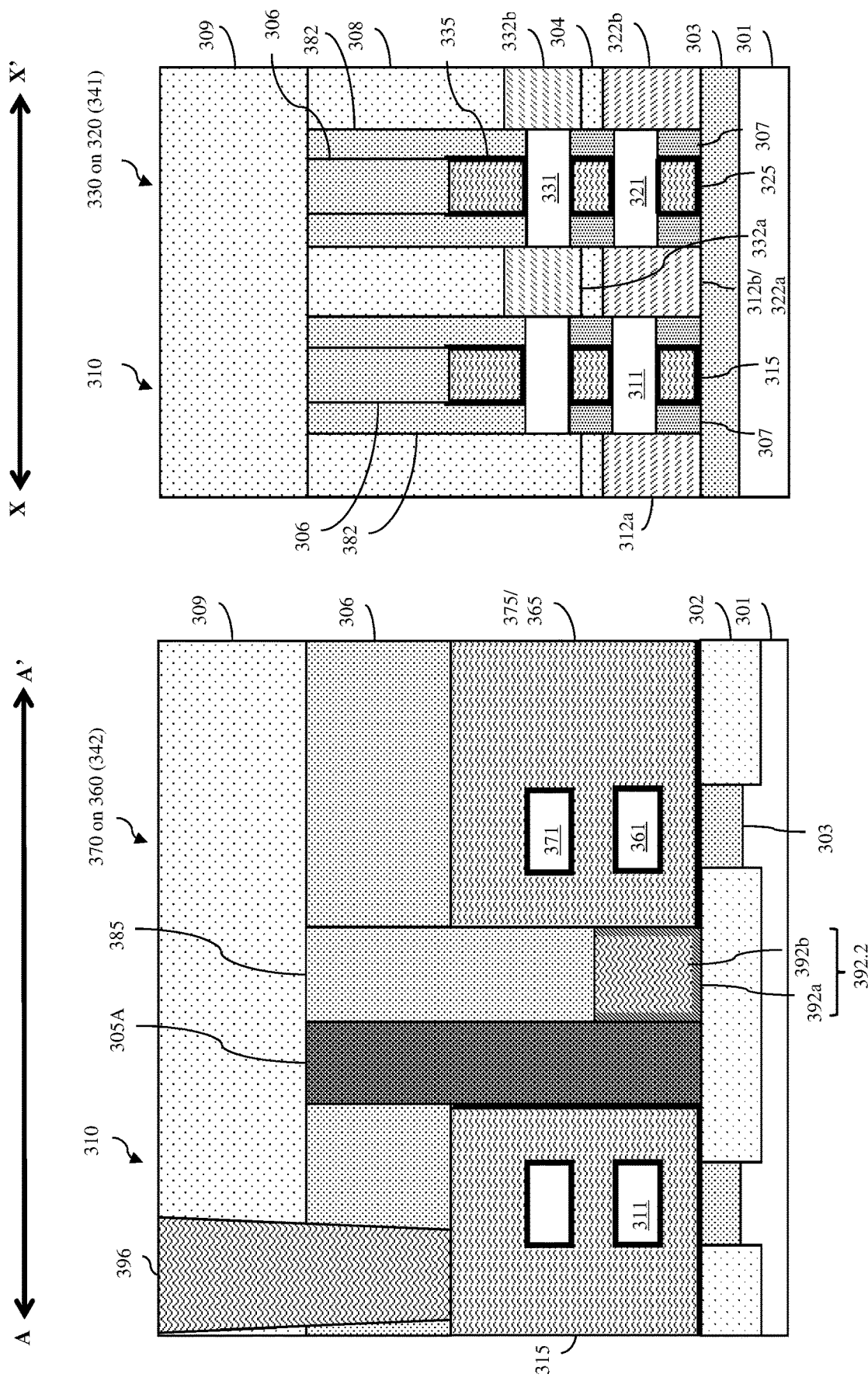

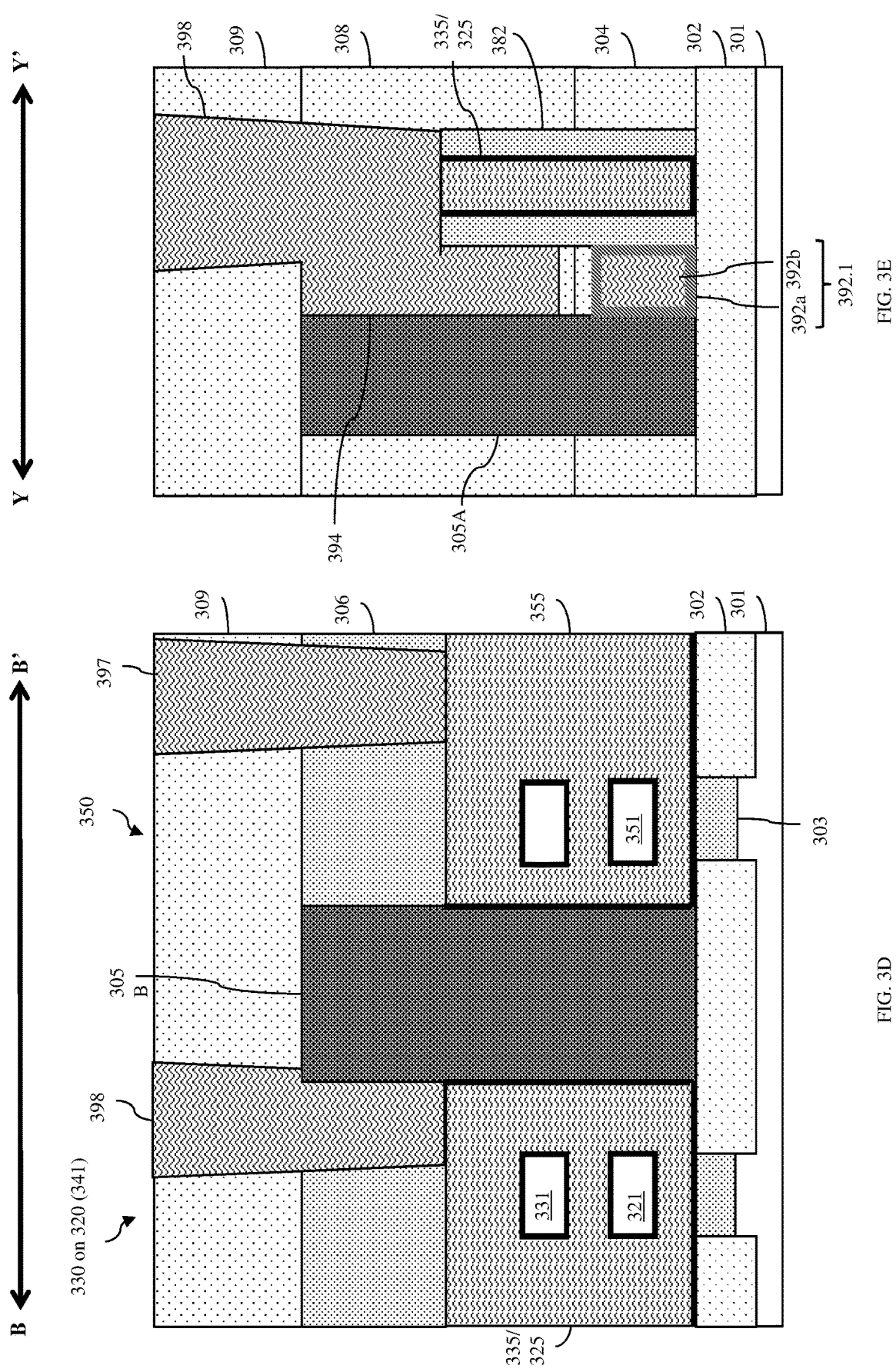

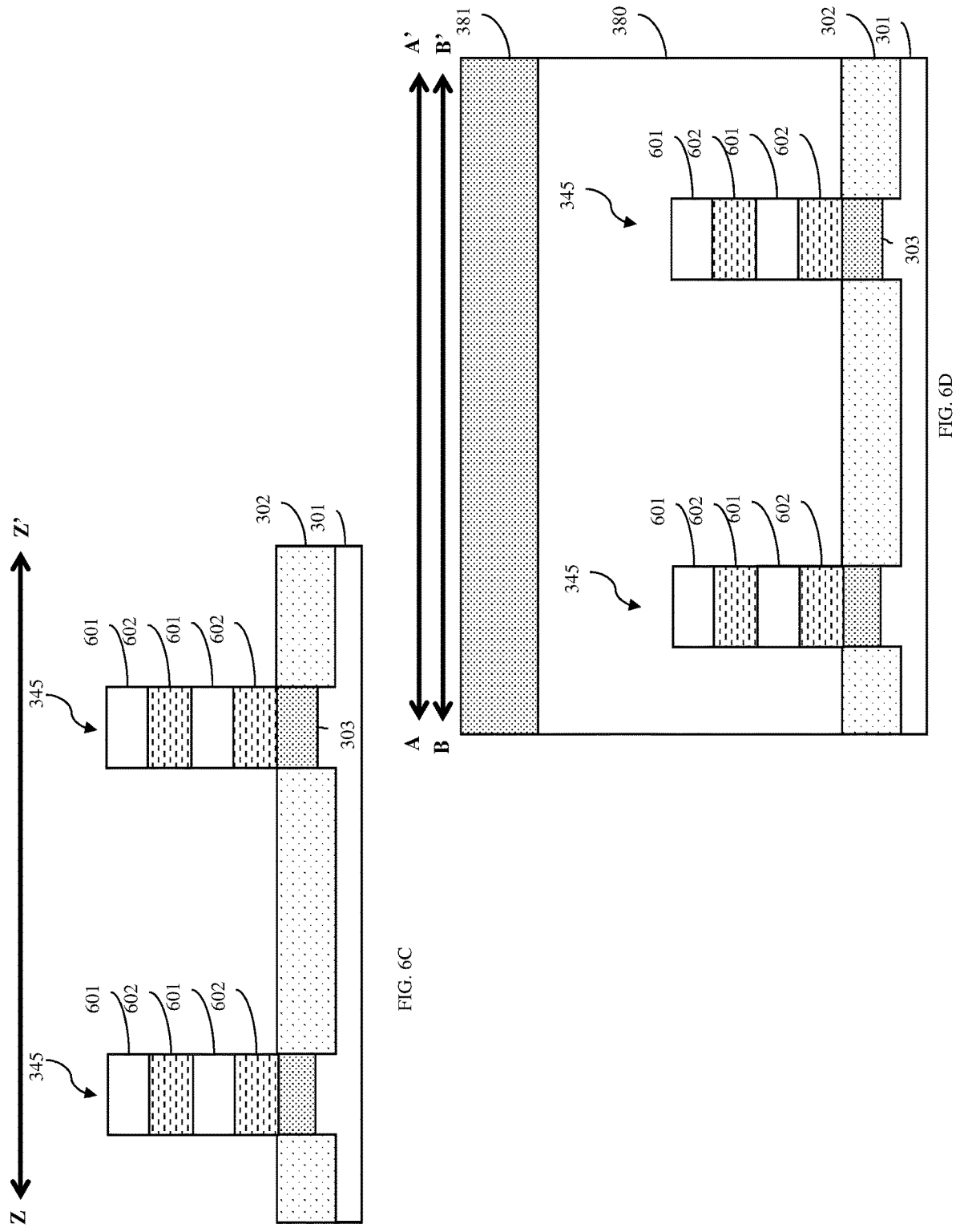

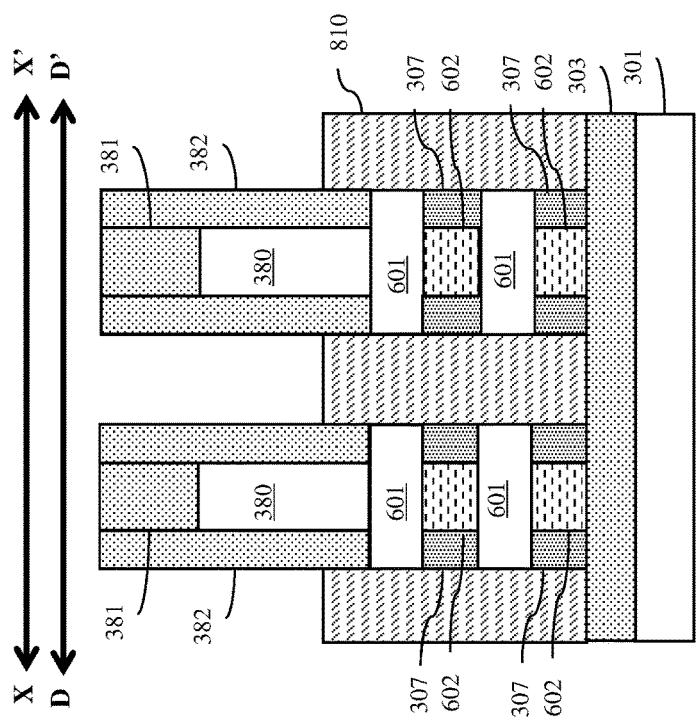
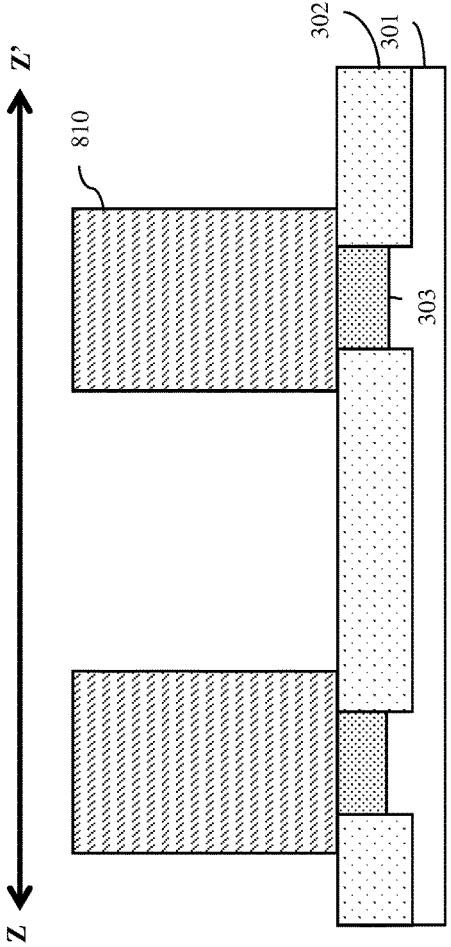
FIG. 10A
FIG. 10B

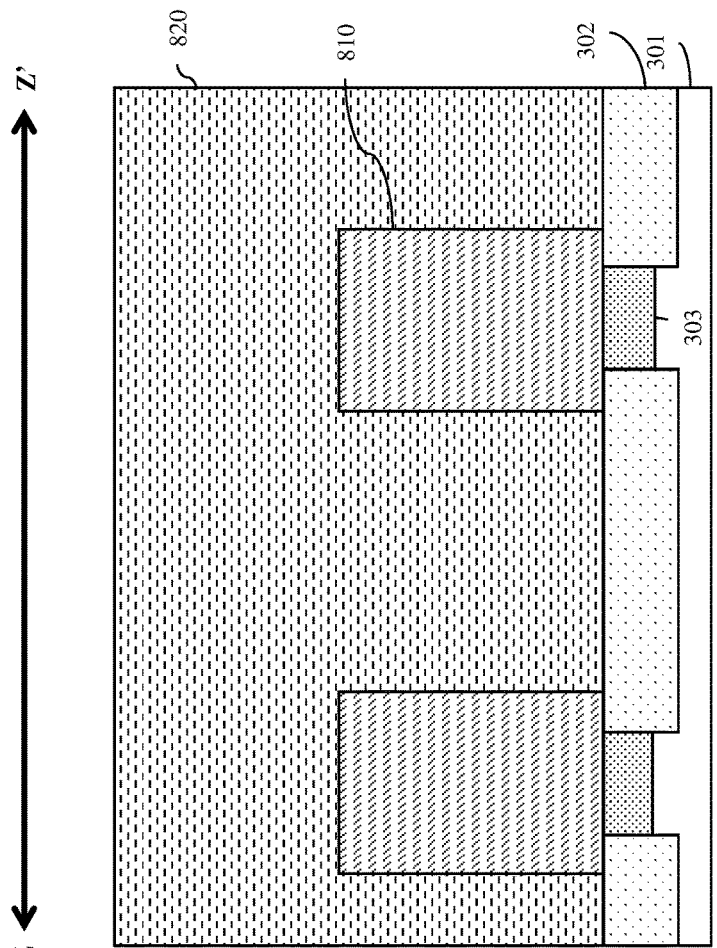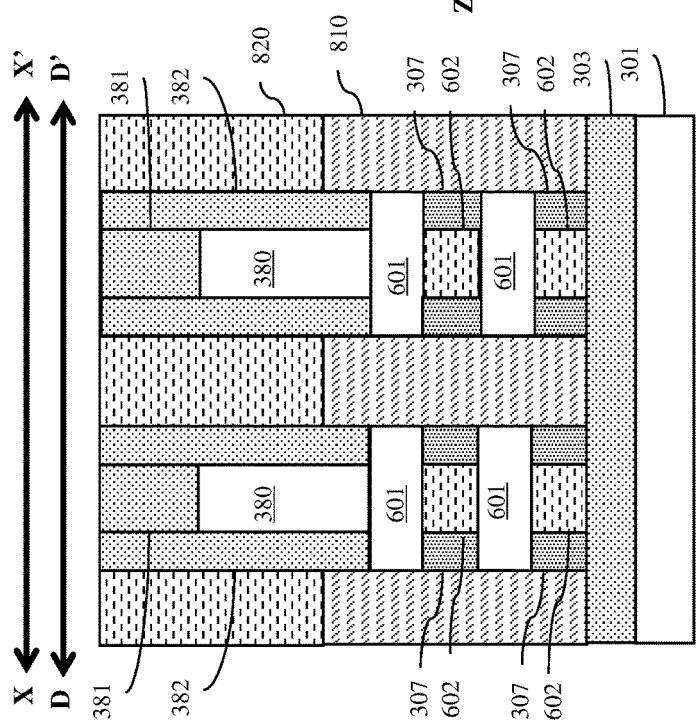
FIG. 11A
FIG. 11B

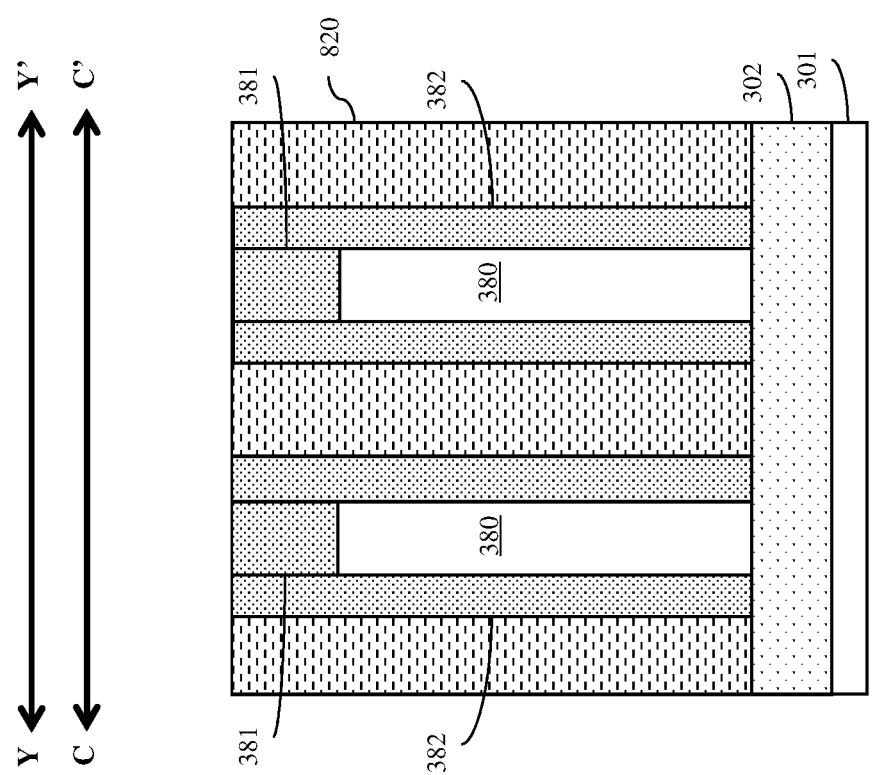

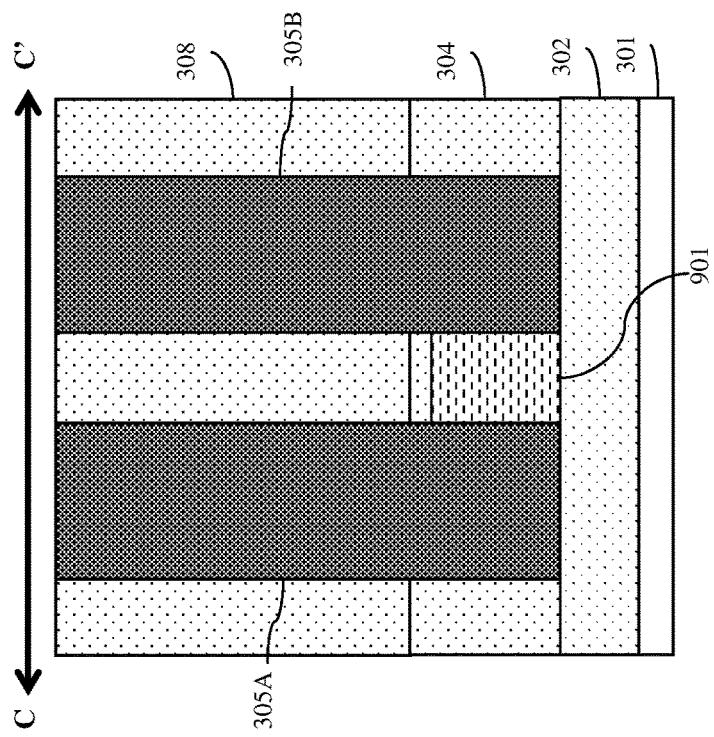
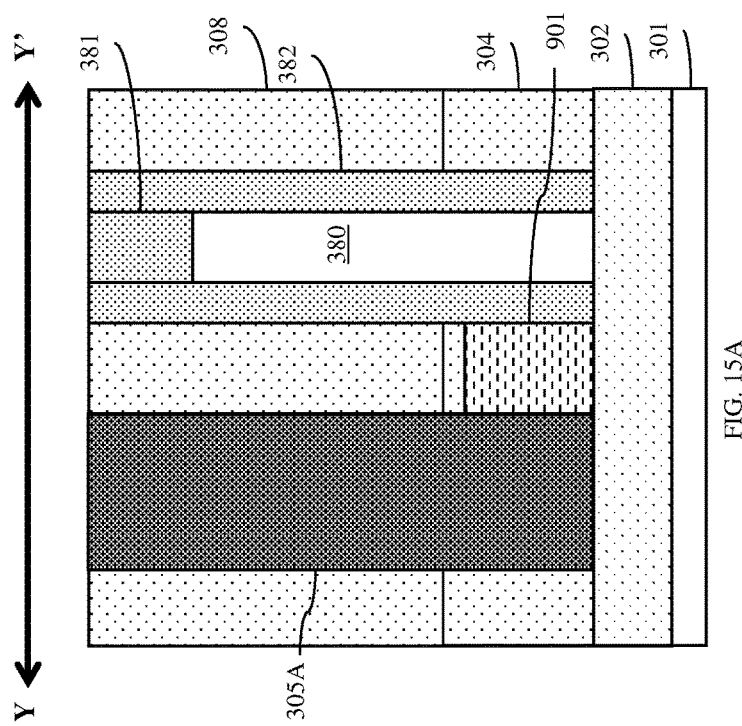

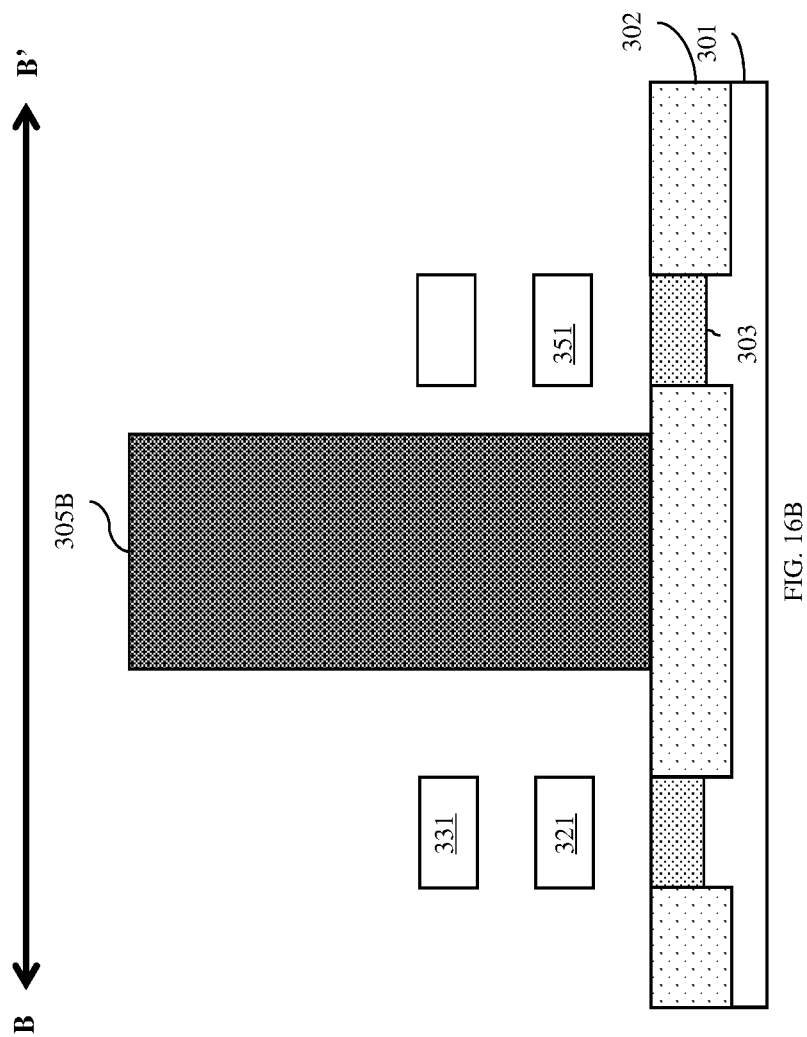

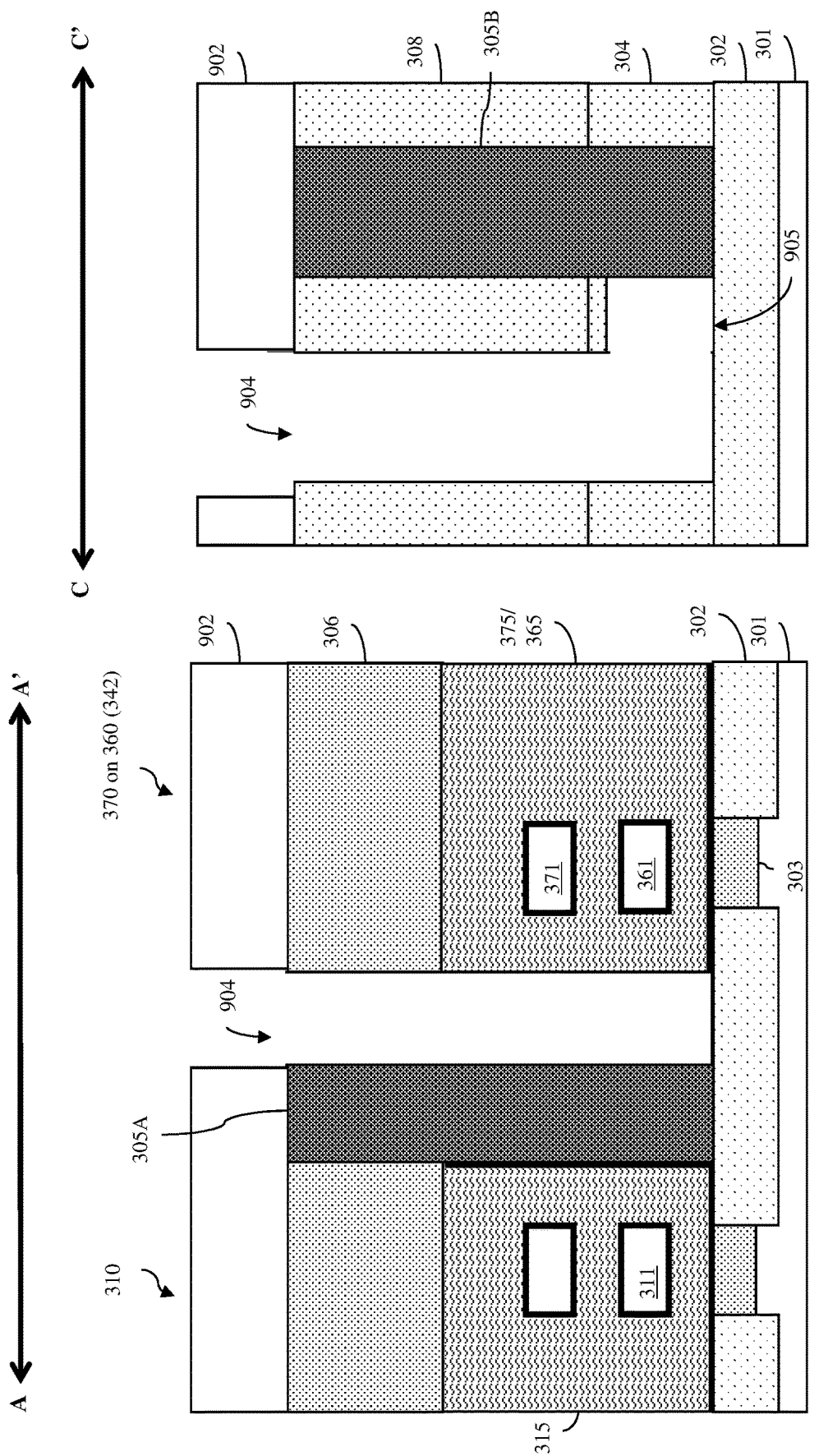

US 10,756,096 B2

INTEGRATED CIRCUIT STRUCTURE WITH COMPLEMENTARY FIELD EFFECT TRANSISTOR AND BURIED METAL INTERCONNECT AND METHOD

BACKGROUND

Field of the Invention

The present invention relates to complementary field effect transistors (CFETs) and, more particularly, to an integrated circuit (IC) structure with a CFET and a buried metal interconnect that enables an electrical connection to a source/drain region of a lower-level transistor within the CFET and to a method of forming the IC structure.

Description of Related Art

Gate-all-around field effect transistors (GAAFETs) (e.g., nanowire-type GAAFETs or nanosheet-type GAAFETs) have been developed in order to improve drive current and electrostatics and to allow for device size scaling, increased device density and reduced area consumption. A GAAFET includes elongated nanoshape(s) (e.g., nanowire(s) or nanosheet(s)), which extend laterally between source/drain regions, and a wrap-around gate structure, which wraps around the nanoshape(s) such that the nanoshape(s) function as channel region(s).

Recently, complementary field effect transistors (CFETs) have been developed in order to further increase on-chip device density and reduce area consumption. A CFET typically includes a pair of N-type and P-type GAAFETs that are stacked one above the other and that have a common gate structure as opposed to being positioned side by side with discrete gate structures. Specifically, a CFET includes an N-type GAAFET on one-level, a P-type GAAFET on an adjacent level (i.e., above or below) and, a common gate that extends vertically across and wraps around the stacked channel regions of the N-type and P-type GAAFETs. Typically, the source/drain regions of the lower-level GAAFET will be electrically isolated from the source/drain regions of the upper-level GAAFET by one or more isolation layers. Such CFETs can, for example, be incorporated into a six-transistor (6T) static random access memory (SRAM) cell, one for each pair of pull-down and pull-up field effect transistors, respectively. While using CFETs can increase on-chip device density and reduce area consumption, providing signal connections to the source/drain regions of the lower-level GAAFETs (e.g., to achieve the cross-couple connection in an SRAM cell) can be quite complex.

SUMMARY

In view of the foregoing, disclosed herein are integrated circuit (IC) structure embodiments that include a buried metal interconnect for electrically connecting a source/drain region of a lower-level gate-all-around field effect transistor (GAAFET) of a complementary field effect transistor (CFET) to another component (e.g., the gate of an adjacent GAAFET or CFET). One exemplary embodiment of the IC structure can include a static random access memory (SRAM) cell with first and second CFETs, where each CFET includes a pull-up GAAFET stacked on and having a common gate with a pull-down GAAFET and where each pull-down GAAFET has a common source/drain region with a pass-gate GAAFET. In this case, the buried metal interconnect can electrically connect the common source/drain region of the first pass-gate GAAFET and the first pull-up GAAFET (which is the lower-level GAAFET of the first CFET) to the common gate of the second pull-down and pull-up GAAFETs (which make up the second CFET). Also disclosed herein are methods for forming the above-described IC structure embodiments. These methods can include forming an interconnect placeholder during formation of source/drain regions for lower-level GAAFETs. Subsequently and, particularly, after formation of source/drain regions for upper-level GAAFETs and further after replacement metal gate processing, the interconnect placeholder can be exposed, removed and replaced with a buried metal interconnect (also referred to herein as a replacement buried metal interconnect).

More particularly, disclosed herein are embodiments of an integrated circuit (IC) structure that includes a complementary field effect transistor (CFET). The CFET can include a P-type gate-all-around field effect transistor (GAAFET) stacked on and having a common gate with an N-type GAAFET or vice versa. In any case, the CFET can include first-type source/drain regions for a lower-level GAAFET, an isolation layer above the first-type source/drain regions; and, on the isolation layer, second-type source/drain regions for an upper-level GAAFET. The IC structure can further include a buried metal interconnect, which is in contact with a sidewall of one of the first-type source/drain regions of the lower-level GAAFET of the CFET. This buried metal interconnect can electrically connect that first-type source/drain region to another IC component. For example, the buried metal interconnect can electrically connect a selected first-type source/drain region of the lower-level GAAFET of the CFET to the gate of an additional GAAFET, which is positioned laterally adjacent and parallel to the CFET. This additional GAAFET can be, for example, a conventional single-level GAAFET or, alternatively, another CFET. In any case, due to the processing technique (referred to herein as replacement metal interconnect processing) that is used to form the buried metal interconnect, the buried metal interconnect can include a metal wire and also a conductive liner, which is immediately adjacent to bottom, side and top surfaces of the metal wire. Furthermore, the isolation layer can extend laterally onto and at least partially over that buried metal interconnect.

One exemplary IC structure embodiment can include a static random access memory (SRAM) cell. The SRAM cell can include a first CFET, including a first pull-up GAAFET stacked on and having a common gate with a first pull-down GAAFET, and a first pass-gate GAAFET that abuts the first pull-down GAAFET such that the first pass-gate GAAFET and the first pull-down GAAFET have a common N-type source/drain region. The SRAM cell can further a second CFET, including a second pull-up GAAFET stacked on and having a common gate with a second pull-down GAAFET, and a second pass-gate GAAFET that abuts the second pull-down GAAFET such that the second pass-gate GAAFET and the second pull-down GAAFET have a common N-type source/drain region. The various first GAAFETs can be adjacent and parallel to the second GAAFETs, but asymmetrically oriented with the first and second pass-gate GAAFETs being on opposite sides of the SRAM cell. In this IC structure embodiment, the common N-type source/drain region of the first pass-gate GAAFET and the first pull-down GAAFET (which is the lower-level GAAFET of the first CFET) and the common gate of the second pull-up GAAFET and the second pull-down GAAFET (which make up the second CFET) can be electrically connected by the buried metal interconnect.

Also disclosed herein are embodiments of a method for forming the above-described IC structure embodiments. Generally, the method embodiments can include forming, on a semiconductor substrate, first-type source/drain regions for lower-level gate-all-around field effect transistors (GAAFETs). During formation of the first-type source/drain regions, an interconnect placeholder can also be formed such that it extends essentially perpendicularly from a sidewall of a first-type source/drain region of a lower-level GAAFET of a complementary field effect transistor (CFET). An isolation layer can be formed over the first-type source/drain regions and the interconnect placeholder. Subsequently, second-type source/drain regions for at least an upper-level GAAFET of the CFET can be formed on the isolation layer (e.g., aligned above the first-type source/drain regions for the lower-level GAAFET of that CFET). Following formation of the second-type source/drain regions, replacement metal gate processing can be performed to form metal gates for the lower-level and upper-level GAAFETs. The metal gates can include a common metal gate for the lower-level and upper-level GAAFETs within each CFET. After replacement metal gate processing is performed, replacement metal interconnect processing can be performed. That is, the interconnect placeholder can be selectively removed and replaced with a buried metal interconnect. Replacement metal interconnect processing can be performed so as to electrically connect the selected first-type source/drain region of the lower-level GAAFET of the CFET to another IC component. For example, replacement metal interconnect processing can be performed so as to electrically connect the selected first-type source/drain region of the lower-level GAAFET of the CFET to the gate of an additional GAAFET (e.g., to the gate of a conventional single-level GAAFET or to the gate of a lower-level GAAFET of another CFET), which is positioned laterally adjacent and parallel to the CFET.

In one exemplary method embodiment, the above-described technique can be used to form an integrated circuit (IC) structure that incorporates a six-transistor (6T) static random access memory (SRAM) cell and a buried metal interconnect that enables a cross-couple connection between transistors within the SRAM cell. This exemplary method embodiment can include forming N-type source/drain regions for lower-level N-type gate-all-around field effect transistors (N-type GAAFETs) for an SRAM cell. These lower-level N-type GAAFETs can include a first pass-gate GAAFET and a first pull-down GAAFET (which will be a lower-level GAAFET in a first complementary field effect transistor (CFET)) that abuts the first pass-gate GAAFET such that the first pass-gate GAAFET and the first pull-down GAAFET have a common N-type source/drain region. The lower-level N-type GAAFETs can further include a second pull-down GAAFET (which will be a lower-level GAAFET in a second CFET), and a second pass-gate GAAFET that abuts the second pass-gate GAAFET such that the second pull-down GAAFET and the second pass-gate GAAFET similarly have a common N-type source/drain region. It should be noted that the various first GAAFETs will be formed adjacent and parallel to the second GAAFETs, but asymmetrically oriented with the first and second pass-gate GAAFETs being on opposite sides of the SRAM cell.

This exemplary method embodiment can further include, during formation of the N-type source/drain regions, forming of an interconnect placeholder such that it extends essentially perpendicularly from a sidewall of the common N-type source/drain region of the first pass-gate GAAFET and the first pull-down GAAFET toward the common N-type source/drain region of the second pass-gate GAAFET and the second pull-down GAAFET.

This exemplary method embodiment can further include forming an isolation layer over the N-type source/drain regions and the interconnect placeholder. Then, P-type source/drain regions for upper-level P-type GAAFETs of the SRAM cell can be formed on the isolation layer. Specifically, P-type source/drain regions for a first pull-up GAAFET (which will be an upper-level GAAFET in the first CFET) can be formed on the isolation layer and aligned above the N-type source/drain regions of the first pull-down GAAFET. P-type source/drain regions for a second pull-up GAAFET (which will be an upper-level GAAFET in the second CFET) can also be formed on the isolation layer and aligned above the N-type source/drain regions of the second pull-down GAAFET.

Following formation of the P-type source/drain regions, replacement metal gate processing can be performed to form metal gates for the lower-level N-type field effect transistors and the upper-level P-type field effect transistors. The metal gates can include discrete metal gates for the first pass-gate GAAFET and the second pass-gate GAAFET as well as a common metal gate for the first pull-down GAAFET and the first pull-up GAAFET in the first CFET and another common metal gate for the second pull-down GAAFET and the second pull-up GAAFET in the second CFET.

After replacement metal gate processing, replacement metal interconnect processing can be performed. That is, the interconnect placeholder can be selectively removed and replaced with a buried metal interconnect that electrically connects the common lower-level N-type source/drain region of the first pass-gate GAAFET and the first pull-down GAAFET (which is the lower-level GAAFET of the first CFET) and the common metal gate of the second pull-down GAAFET and the second pull-up GAAFET (which make up the second CFET).

BRIEF DESCRIPTION OF THE SEVERAL VIEWS OF THE DRAWINGS

The present invention will be better understood from the following detailed description with reference to the drawings, which are not necessarily drawn to scale and in which:

FIG. 3A is a layout diagram and FIGS. 3B-3H are different cross-section diagrams of a disclosed integrated circuit (IC) structure, including a 6T-SRAM cell that incorporates CFETs and a buried metal interconnect, which is formed according to the disclosed method;

FIGS. 6A-6D are different cross-section diagrams illustrating a partially completed IC structure formed according to the disclosed method;

FIGS. 10A-10B are different cross-section diagrams illustrating a partially completed IC structure formed according to the disclosed method;

FIGS. 11A-11C are different cross-section diagrams illustrating a partially completed IC structure formed according to the disclosed method;

FIGS. 15A-15E are different cross-section diagrams illustrating a partially completed IC structure formed according to the disclosed method;

FIGS. 16A-16B are different cross-section diagrams illustrating a partially completed IC structure formed according to the disclosed method;

FIGS. 20A-20C are different cross-section diagrams illustrating a partially completed IC structure formed according to the disclosed method;

DETAILED DESCRIPTION

As mentioned above, a complementary field effect transistor (CFET) typically includes an N-type gate-all-around field effect transistor (GAAFET) on one-level, a P-type GAAFET on an adjacent level (i.e., above or below) and, a common gate that extends vertically across and wraps around the stacked channel regions of the N-type and P-type GAAFETs. Typically, the source/drain regions of the lower-level GAAFET will be electrically isolated from the source/drain regions of the upper-level GAAFET by one or more isolation layers. Such CFETs can, for example, be incorporated into a six-transistor (6T) static random access memory (SRAM) cell, one for each pair of pull-down and pull-up field effect transistors, respectively. While using CFETs can increase on-chip device density and reduce area consumption, providing signal connections to the source/drain regions of the lower-level GAAFETs (e.g., to achieve the cross-couple connection in an SRAM cell) can be quite complex.

Figure 1:
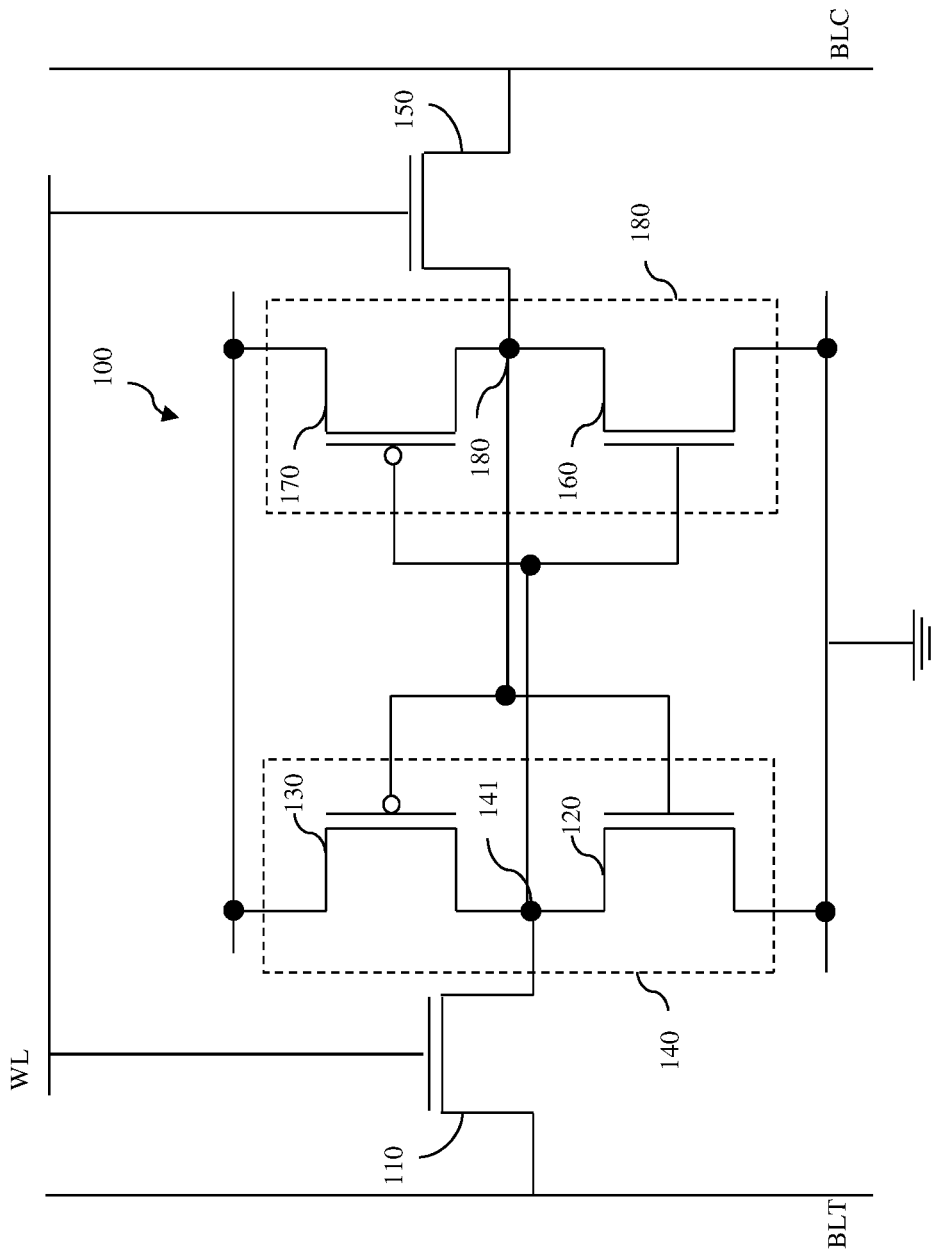
FIG. 1 is a schematic diagram of a six-transistor (6T) static random access memory (SRAM) cell.

For example, consider an exemplary 6T-SRAM cell 100, as shown in the schematic diagram of FIG. 1. The 6T-SRAM cell 100 includes first pass-gate 110, pull-down 120 and pull-up 130 field effect transistors (FETs) and second pass-gate 150, pull-down 160 and pull-up 170 FETs. The first pull-down and pull-up FETs 120 and 130 are connected in series, forming a first inverter 140. Similarly, the second pull-down and pull-up FETs 160 and 170 are connected in series, forming a second inverter 180. Additionally, the source/drain regions of the first pass-gate FET 110 are connected to a true bitline and a first storage node 141, respectively, where the first storage node 141 is at the junction between the first pull-down and pull-up FETs 120 and 130. The source/drain regions of the second pass-gate FET 150 are connected to a complementary bitline (BLC) and a second storage node 181, respectively, where the second storage node 181 at the junction between the second pull-down and pull-up FETs 160 and 170. A cross-couple connection connects the first FETs 110, 120 and 130 to the second FETs 150, 160 and 170. Specifically, the gates of the second pull-down and pull-up FETs 160 and 170 are connected to the first storage node 141 (i.e., the junction between the first FETs 110, 120, and 130) and the gates of the first pull-down and pull-up FETs 120 and 130 are connected to the second storage node 181 (i.e., the junction between the second FETs 150, 160 and 170). Finally, the gates of both the first pass-gate FET 110 and the second pass-gate FET 150 are connected to a wordline (WL).

Figure 2:
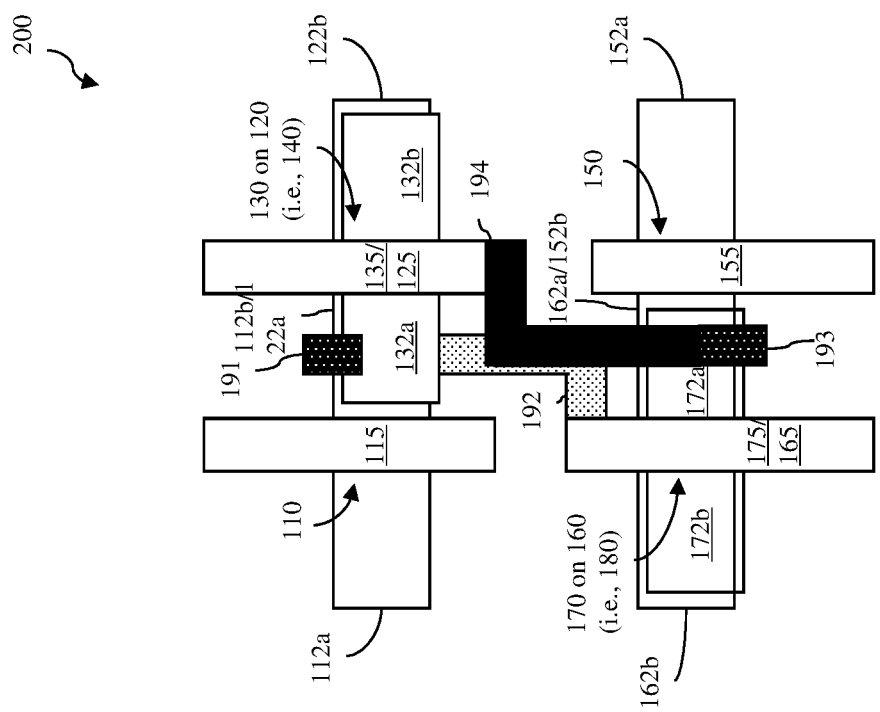
FIG. 2 is an exemplary layout for a 6T-SRAM cell that incorporates complementary field effect transistors (CFETs)
Figure 3A:
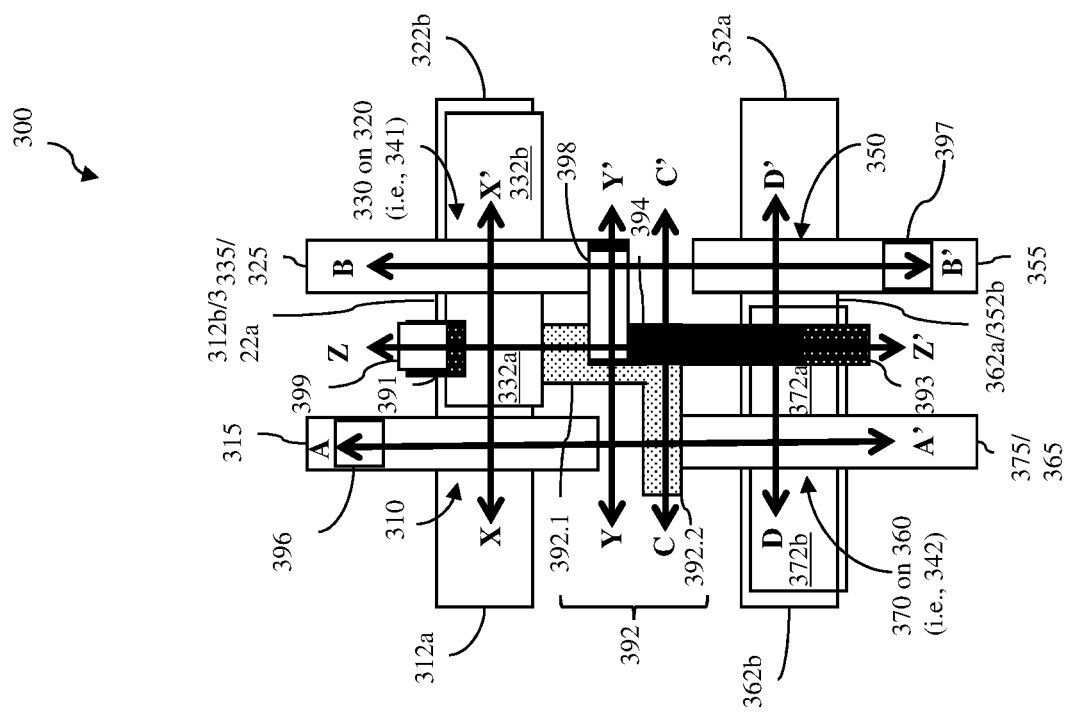
Figure 3F:
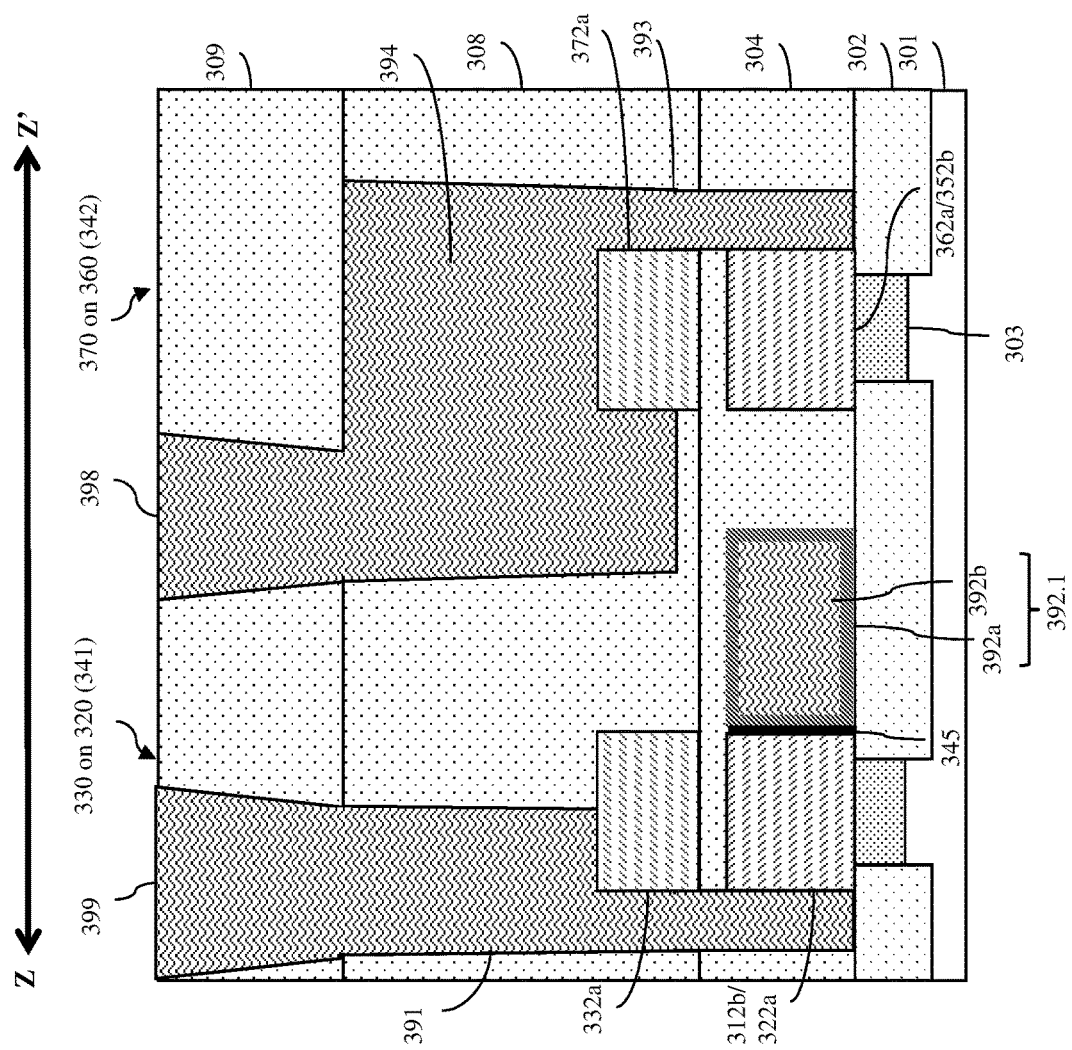
Figure 3G:
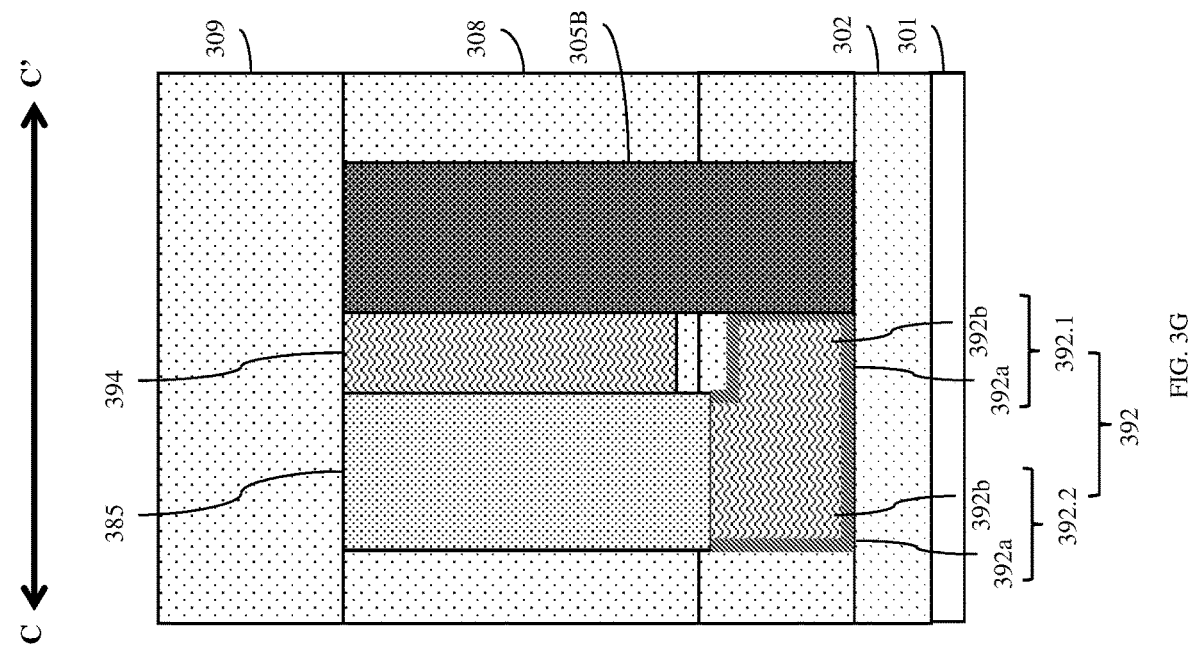
Figure 3H:
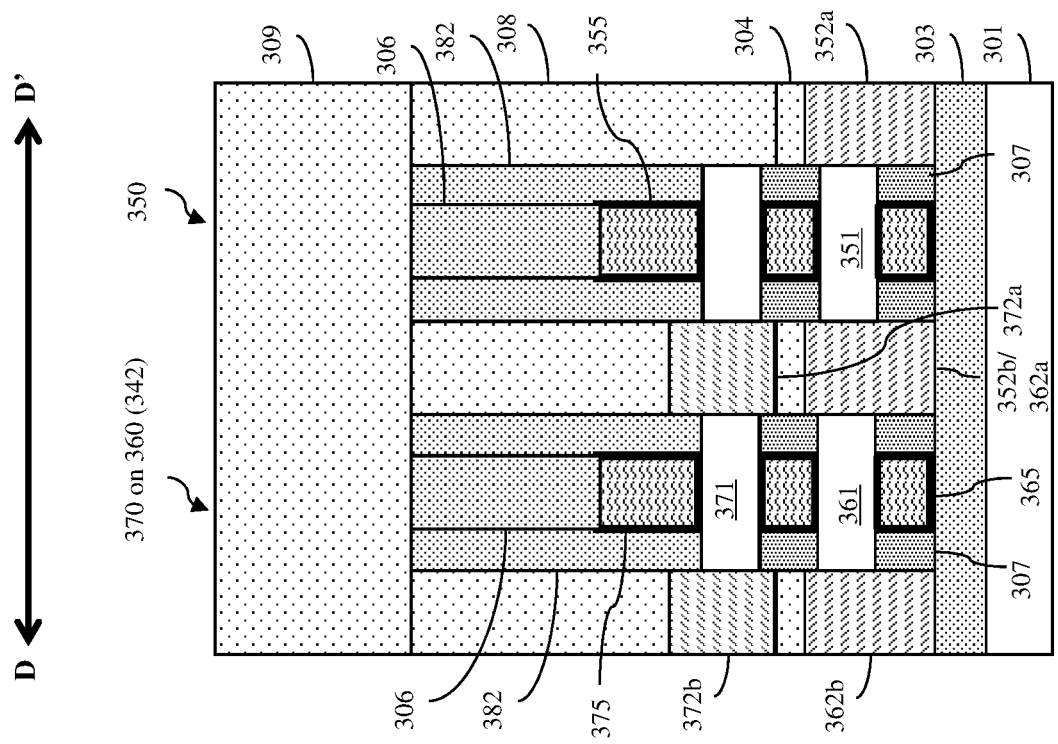

FIG. 2 is an exemplary layout that can be used when such a 6T-SRAM cell incorporates GAAFETs including CFETs for the pairs of pull-up and pull-down transistors. As illustrated, this SRAM cell includes the first pass-gate GAAFET 110; a first CFET, which includes a first pull-down GAAFET 120 and a first pull-up GAAFET 130 stacked on the first pull-down GAAFET 120; a second pass-gate GAAFET 150; and a second CFET, which includes a second pull-down GAAFET 160 and a second pull-up GAAFET 170 stacked on the second pull-down GAAFET 160. The first pass-gate GAAFET 110 has a channel region extending laterally between source/drain regions 112a-112b and a gate 115 adjacent to the channel region. The first CFET includes the first pull-down GAAFET 120, which has a channel region extending laterally between source/drain regions 122a-122b with the source/drain region 122a abutting the source/drain region 112b (i.e., with regions 112b/122a being a common source/drain region). The first CFET also includes the first pull-up GAAFET 130, which has a channel region extending laterally between source/drain regions 132a-132b with the source/drain region 132a aligned above the common source/drain region 112b/122a and the source/drain region 132b aligned above the source/drain region 122b. The first CFET further includes a common gate 135/125 adjacent to the channel regions of the stacked first pull-up and pull-down GAAFETs 130 and 120. The second pass-gate GAAFET 150 has a channel region extending laterally between source/drain regions 152a-152b and a gate 155 adjacent to the channel region. The second CFET includes the second pull-down GAAFET 160, which has a channel region extending laterally between source/drain regions 162a-162b with the source/drain region 162a abutting the source/drain region 152b (i.e., with regions 162a/152b being a common source/drain region). The second CFET also includes the second pull-up GAAFET 170, which has a channel region extending laterally between source/drain regions 172a-172b with the source/drain region 172a aligned above the common source/drain region 162a/152b and the source/drain region 172b aligned above the source/drain region 162b. The second CFET further includes a common gate 175/165 adjacent to the channel regions of the stacked second pull-up and pull-down GAAFETs 170 and 160.

As illustrated, the first pass-gate GAAFET 110 and the second pass-gate GAAFET are on opposite sides of the SRAM cell, as are the first CFET and the second CFET. Thus, the first pass-gate GAAFET 110 is adjacent and parallel to the second CFET with the gate 115 of the first pass-gate GAAFET 110 being in end-to-end alignment with the common gate of 175/165 of the second pull-up and pull-down GAAFETs in the second CFET. Additionally, the second pass-gate GAAFET 150 is adjacent and parallel to the first CFET with the gate 155 of the second pass-gate GAAFET 150 being in end-to-end alignment with the common gate 135/125 of the first pull-up and pull-down GAAFETs in the first CFET.

The cross-couple connection between the first pass-gate, pull-down and pull-up GAAFETs 110, 120 and 130 and the second pass-gate, pull-down and pull-up GAAFETs 150, 160, and 170 is achieved through the use of interconnects 191-194. Specifically, the upper level source/drain region 132a for the first pull-up GAAFET 130 can be electrically connected by an interconnect 191 to the lower level common source/drain region 112b/122a for the first pass-gate and pull-down GAAFETs 110 and 120, below. This lower level common source/drain region 112b/122a can further be electrically connected by a buried interconnect 192 to the common gate 175/165 for the second pull-up and pull-down GAAFETs 170 and 160. The upper level source/drain region 172a for the second pull-up GAAFET 170 can be electrically connected by the interconnect 193 to the lower level common source/drain region 152b/162a for the second pass-gate and pull-down GAAFETs 150 and 160, below. Finally, the upper level source/drain region 172a can further be electrically connected by the interconnect 194 to the common gate 135/125 for the first pull-up and pull-down GAAFETs 130 and 120. It should be noted that the interconnect 194 can abut the interconnect 193, as illustrated. Alternatively, these interconnects 193 and 194 can be physically separated. It should be understood that a full layout drawing of an SRAM cell would also include various other components including other contacts (e.g., source/drain contacts, gate contacts, etc.). These other components have been omitted from FIG. 2 in order to avoid clutter and allow the reader to focus on the cross-couple connection at issue with the SRAM cell.

Current techniques for forming an SRAM cell with the layout shown in FIG. 2 include epitaxially growing an in situ doped semiconductor to form the buried interconnect 192, which electrically connects the lower level common source/drain region 112b/122a for the first pass-gate and pull-down GAAFETs 110 and 120 to the common gate 175/165 for the second pull-up and pull-down GAAFETs 170 and 160. The technique results in a relatively high resistance interconnect and, thereby a weak cross-couple connection. In order to reduce resistance, techniques have been proposed for forming a metal silicide buried interconnect 192 immediately following formation of the lower level source/drain regions. However, when formed at this stage in the processing, the metal silicide will be subjected to a high-K reliability anneal during subsequent replacement metal gate formation. This high-K reliability anneal can, however, cause the metal silicide to degrade such that this technique also results in a weak cross-couple connection.

In view of the foregoing, disclosed herein are integrated circuit (IC) structure embodiments that include a buried metal interconnect for electrically connecting a source/drain region of a lower-level gate-all-around field effect transistor (GAAFET) of a complementary field effect transistor (CFET) to another component (e.g., the gate of an adjacent GAAFET or CFET). One exemplary embodiment of the IC structure can include a static random access memory (SRAM) cell with first and second CFETs, where each CFET includes a pull-up GAAFET stacked on and having a common gate with a pull-down GAAFET and where each pull-down GAAFET has a common source/drain region with a pass-gate GAAFET. In this case, the buried metal interconnect can electrically connect the common source/drain region of the first pass-gate GAAFET and the first pull-up GAAFET (which is the lower-level GAAFET of the first CFET) to the common gate of the second pull-down and pull-up GAAFETs (which make up the second CFET). Also disclosed herein are methods for forming the above-described IC structure embodiments. These methods can include forming an interconnect placeholder during formation of source/drain regions for lower-level GAAFETs. Subsequently and, particularly, after formation of source/drain regions for upper-level GAAFETs and further after replacement metal gate processing, the interconnect placeholder can be exposed, removed and replaced with a buried metal interconnect (also referred to herein as a replacement buried metal interconnect).

More particularly, referring to FIGS. 3A-3H disclosed herein are IC structure embodiments that include a semiconductor substrate 301 and, above the semiconductor substrate 301, a buried metal interconnect 392 that electrically connects a source/drain region 322a of a lower-level GAAFET 320 of a CFET 341 to another IC component on the semiconductor substrate 301. As mentioned above, a CFET includes P-type gate-all-around field effect transistor (GAAFET) stacked on and having a common gate with an N-type GAAFET or vice versa. Thus, for purposes of this disclosure, a lower-level GAAFET refers to a GAAFET on a first active device level proximal to a semiconductor substrate 301 and an upper-level GAAFET refers to a GAAFET on a second active device level above the first active device level and distal to the semiconductor substrate.

The CFET 341 can include a lower-level GAAFET with a first-type conductivity (e.g., N-type conductivity). The lower-level GAAFET can include first-type (e.g., N-type) source/drain regions 322a-322b and at least one channel region 321 in the form of a nanowire or nanosheet extending laterally between the first-type source/drain regions 322a-322b. The CFET 341 can further include an isolation layer 304 above the first-type source/drain regions 322a-322b. The CFET 341 can further include an upper-level GAAFET 330 having a second-type conductivity (e.g., P-type conductivity) that is different from the first-type conductivity. The upper-level GAAFET 330 can include second-type (e.g., P-type) source/drain regions 332a-332b on the isolation layer 304 aligned above the first-type source/drain regions 322a-322b and at least one channel region 331 aligned above the channel region(s) 321 and extending laterally between the second-type source/drain regions 332a-332b. The CFET 341 can further include a common gate 335/325 that wraps around the channel region(s) 321 of the lower-level GAAFET 320 and also the channel region(s) 331 of the upper-level GAAFET 330. Gate sidewall spacers 382 and inner spacers 307 can electrically isolated the common gate 335/325 from both the first-type source/drain regions 322a-322b and the second-type source/drain regions 332a-332b.

The buried metal interconnect 392 can be in contact with a sidewall of one of the first-type source/drain regions (e.g., see the selected first-type source/drain region 322a) of the lower-level GAAFET 320. The isolation layer 304 can further extend laterally onto the buried metal interconnect 392 such that the buried metal interconnect 392 is electrically isolated from the second-type source/drain region (e.g., 332b) above. This buried metal interconnect 392 can electrically connect the selected first-type source/drain region 322a of the lower-level GAAFET 320 of the CFET 341 to another IC component on the semiconductor substrate 301. For example, the buried metal interconnect 392 can electrically connect the selected first-type source/drain region 322a of the lower-level GAAFET 320 of the CFET 341 to the gate of one or more additional GAAFETs positioned laterally adjacent and parallel to the CFET. For example, the buried metal interconnect 392 can also be in contact with the gate of a conventional single-level GAAFET (not shown). Alternatively, the buried metal interconnect 392 can be in contact with the common gate 375/365 of the upper and lower-level GAAFETs 370 and 360 of another CFET 342, as illustrated. In any case, due to the processing technique (referred to herein as replacement metal interconnect processing) that is used to form the buried metal interconnect 392, the buried metal interconnect 392 can include a metal wire 392b and a conductive liner 392a, which is immediately adjacent to and covers the bottom surface, side surfaces and at least a portion of the top surface of the metal wire 392b. The conductive liner 392a can be, for example, one or more conformal conductive layers suitable for promoting adhesion and/or providing a diffusion barrier (e.g., titanium, titanium nitride, tantalum, tantalum nitride, or any other conductive material). The metal wire 392b can be made of one or more layers of metal and/or metal alloy fill materials (e.g., ruthenium, tungsten, cobalt, nickel, aluminum, copper, or any other suitable metal wire material).

It should be understood that, as discussed above, the disclosed IC structure embodiments include at least one CFET 341 and a buried metal interconnect 392 that provides an electrical connection between a source/drain region of a lower-level GAAFET of the CFET to another IC component. FIG. 3A and FIGS. 3B-3H are specifically a layout diagram and different cross-section diagrams, respectively, of one exemplary IC structure embodiment where CFETs 341 and 342 are incorporated into the six-transistor (6T) static random access memory (SRAM) cell 300, where each CFET includes a pair of pull-down and pull-up GAAFETs for the SRAM cell, and where the buried metal interconnect 392 provides a local electrical connection that enables the required cross-couple connection for the 6T-SRAM cell 300. The exemplary IC structure embodiment shown in FIGS. 3A-3H is described in greater detail below. However, it should be understood that the description and drawings are not intended to be limiting. Other structures that similarly include a buried metal interconnect that provides a local electrical connection between to a source/drain region of a lower-level GAAFET of a CFET and another component of the IC are anticipated.

More specifically, the exemplary IC structure embodiment shown in FIGS. 3A-3H can include a 6T-SRAM cell 300 on a semiconductor substrate 301. The semiconductor substrate 301 can be a silicon substrate or any other suitable semiconductor substrate. This 6T-SRAM cell 300 can electrically isolated from the semiconductor substrate 301, for example, by a combination of a buried isolation layer 303 and shallow trench isolation (STI) regions 302 (as illustrated) or by any other suitable means of isolation. The buried isolation layer 303 and STI regions 302 can be made of the same isolation material. For example, the buried isolation layer 303 can be a silicon dioxide layer and the STI regions 302 can silicon dioxide-filled shallow trenches. Alternatively, the buried isolation layer 303 and the STI regions 302 can be made of different isolation materials. For example, the buried isolation layer 303 can be a silicon nitride layer and the STI regions 302 can be silicon dioxide-filled shallow trenches.

The 6T-SRAM cell 300 can include multiple lower-level N-type GAAFETs. These lower-level N-type GAAFETs can include a first pass-gate GAAFET 310, a first pull-down GAAFET 320, a second pass-gate GAAFET 350 and a second pull-down GAAFET 360. The first pass-gate GAAFET 310 can include N-type source/drain regions 312a-312b, at least one channel region 311 in the form of a nanowire or nanosheet extending laterally between the N-type source/drain regions 312a-312b, and a replacement metal gate 315 that wraps around the channel region(s) 311. The first pull-down GAAFET 320 can include N-type source/drain regions 322a-322b, at least channel region 321 in the form of a nanowire or nanosheet extending laterally between the N-type source/drain regions 322a-322b, and a replacement metal gate 325 that wraps around the channel region(s) 321. As illustrated, the first pass-gate GAAFET 310 can abut the first pull-down GAAFET 320 with the N-type source/drain region 312b of the first pass-gate GAAFET 310 being immediately adjacent to the N-type source/drain region 322a of the first pull-down GAAFET 320 such that these two GAAFETs 310 and 320 are considered to have a common N-type source/drain region 312b/322a (also referred to herein as a shared source/drain region). Similarly, the second pass-gate GAAFET 350 can include N-type source/drain regions 352a-352b, at least one channel region 351 in the form of a nanowire or nanosheet extending laterally between the N-type source/drain regions 352a-352b, and a replacement metal gate 355 that wraps around the channel region(s) 351. The second pull-down GAAFET 360 can include N-type source/drain regions 362a-362b, at least one channel region 361 in the form of a nanowire or nanosheet extending laterally between the N-type source/drain regions 362a-362b, and a replacement metal gate 365 that wraps around the channel region(s) 361. Furthermore, as illustrated, the second pass-gate GAAFET 350 can abut the second pull-down GAAFET 360 with the N-type source/drain region 352b of the second pass-gate GAAFET 350 being immediately adjacent to the N-type source/drain region 362a of the second pull-down GAAFET 360 such that these two GAAFETs 350 and 360 are considered to have a common N-type source/drain region 352b/362a.

As discussed in greater detail below with regard to the method embodiments, the N-type source/drain regions of the lower-level N-type GAAFETs can be made of an epitaxial monocrystalline semiconductor material (e.g., epitaxial silicon or epitaxial silicon carbide), which is doped with an N-type dopant so as to have a relatively high N-type conductivity level (i.e., N+ conductivity). The channel regions of the lower-level N-type GAAFETs can be made of silicon, which is undoped (i.e., intrinsic) or which is doped with a P-type dopant so that the channel regions have a P-type conductivity at a relatively low conductivity level (i.e., P− conductivity). Those skilled in the art will recognize that a gate structure generally includes one or more gate dielectric layer immediately adjacent to the channel region(s) and one or more gate conductor layer(s) on the gate dielectric layer. Exemplary gate dielectric and gate conductor materials that can be used for the replacement metal gates of the N-type GAAFETs are discussed in greater detail below.

The 6T-SRAM cell 300 can further include multiple upper-level P-type GAAFETs.

These upper-level P-type GAAFETs can include a first pull-up GAAFET 330 and a second pull-up GAAFET 370. The first pull-up GAAFET 330 can be stacked above and can have a common gate with the first pull-down GAAFET 320 such that the first pull-up GAAFET 330 and the first pull-down GAAFET 320 form a first CFET 341. The second pull-up GAAFET 370 can be stacked above and have a common gate with the second pull-down GAAFET 360 such that the second pull-up GAAFET 370 and the second pull-down GAAFET 360 form a second CFET 342.

More specifically, an isolation layer 304 with an essentially planar top surface can cover the N-type source/drain regions of each of the lower-level N-type GAAFETs described above and can further be above the STI regions 302 on opposing sides of and between the N-type source/drain regions. The isolation layer 304 can be, for example, a silicon dioxide layer, a silicon nitride layer or a layer of any other suitable isolation material.

The first pull-up GAAFET 330 can include P-type source/drain regions 332a-332b on the isolation layer 304 aligned above the N-type source/drain regions 322a-322b of the first pull-down GAAFET 320, at least one channel region 331 in the form of a nanowire or nanosheet extending laterally between the P-type source/drain regions 332a-332b, and a replacement metal gate 335 that wraps around the channel region(s) 331. As illustrated, the replacement metal gate 335 of the first pull-up GAAFET 330 can be continuous with the replacement metal gate 325 of the first pull-down GAAFET 320 (i.e., configured as a common replacement metal gate 335/325 with an upper portion that wraps around the channel region(s) 331 of the first pull-up GAAFET 330 and a lower portion that wraps around the channel region(s) 321 of the first pull-down GAAFET 320). Similarly, the second pull-up GAAFET 370 can include P-type source/drain regions 372a-372b on the isolation layer 304 aligned above the N-type source/drain regions 362a-362b of the second pull-down GAAFET 360, at least one channel region 371 in the form of a nanowire or nanosheet extending laterally between the P-type source/drain regions 372a-372b, and a replacement metal gate 375 that wraps around the channel region(s) 371. As illustrated, the replacement metal gate 375 of the second pull-up GAAFET 370 can be continuous with the replacement metal gate 365 of the second pull-down GAAFET 360 (i.e., configured as a common replacement metal gate 375/365 with an upper portion that wraps around the channel region(s) 371 of the second pull-up GAAFET 370 and a lower portion that wraps around the channel region(s) 361 of the second pull-down GAAFET 360).

As discussed in greater detail below with regard to the method embodiments, the P-type source/drain regions of the upper-level P-type GAAFETs can be made of an epitaxial monocrystalline semiconductor material (e.g., epitaxial silicon or epitaxial silicon germanium), which is doped with a P-type dopant so as to have a relatively high P-type conductivity level (i.e., P+ conductivity). The channel regions of the upper-level P-type GAAFETs can be made of silicon, which is undoped (i.e., intrinsic) or which is doped with a P-type dopant so that the channel regions have a P-type conductivity at a relatively low conductivity level (i.e., P– conductivity). Those skilled in the art will recognize that a gate structure generally includes one or more gate dielectric layer immediately adjacent to the channel region(s) and one or more gate conductor layer(s) on the gate dielectric layer. Exemplary gate dielectric and gate conductor materials that can be used for the replacement metal gates of the N-type GAAFETs are discussed in greater detail below.

Within the 6T-SRAM cell 300, the first pass-gate GAAFET 310 and first CFET 341 can be adjacent and parallel to the second pass-gate GAAFET 350 and second CFET 342, but asymmetrically oriented with the first and second pass-gate GAAFETs being on opposite sides of the SRAM cell 300. In this configuration, the replacement metal gate 315 of the first pass-gate GAAFET 310 is positioned laterally adjacent and parallel to the common replacement metal gate 335/325 of the first CFET 341. The common replacement metal gate 375/365 of the second CFET 342 is positioned laterally adjacent and parallel to the second gate 355 of the second pass-gate GAAFET 350. Furthermore, the common replacement metal gate 375/365 of the second CFET 342 is in end-to-end alignment with the replacement metal gate 315 of the first pass-gate GAAFET 310 and the replacement metal gate 352 of the second pass-gate GAAFET 350 is in end-to-end alignment with the common replacement metal gate 335/325 of the first CFET 341.

The 6T-SRAM cell 300 further includes gate cut isolation regions. The gate cut isolation regions can include a first gate cut isolation region 305A positioned laterally between adjacent ends of the replacement metal gate 315 of the first pass-gate GAAFET 310 and the common replacement metal gate 375/365 of the second CFET 341, thereby electrically isolating replacement metal gate 315 from the common replacement metal gate 375/365. The gate cut isolation regions can further include a second gate cut isolation region 305B positioned laterally between adjacent ends of the common replacement metal gate 335/325 of the first CFET 341 and the replacement metal gate 355 of the second pass-gate GAAFET 350, thereby electrically isolating the common replacement metal gate 335/325 from the replacement metal gate 355. As illustrated, the gate cut isolation regions 305A-305B can be offset (i.e., stepped) with the distance between the channel region(s) 311 of the first pass-gate GAAFET 310 and the first gate cut isolation region 305A can be less than the distance between the channel regions 321 and 331 of the first CFET 341 and the second gate cut isolation region 305B (see FIGS. 3B and 3D) and further with the distance between the channel regions 371 and 361 of the second CFET 342 and the first gate cut isolation region 305A being greater than the distance between the channel region 351 of the second pass-gate GAAFET 350 and the second gate cut isolation region 305B. Those skilled in the art will recognize that a gate cut isolation region typically refers to a cut or trench that is formed during processing vertically through and entirely across an elongated gate structure, thereby dividing it in two. The elongated gate structure can be an elongated sacrificial gate structure, which is divided into two sacrificial gates that are subsequently replaced with metal gates. Alternatively, the elongated gate structure can be an elongated replacement metal gate structure. In any case, the cut or trench is subsequently filled with an insulative fill material to complete the gate cut isolation region. The insulative fill material can be, for example, silicon carbide, silicon oxycarbide or any other suitable insulative fill material.

In this exemplary IC structure embodiment, the buried metal interconnect 392 can electrically connect the common N-type source/drain region 312b/322a of the first pass-gate GAAFET 310 and the first pull-up GAAFET 320 (which is the lower-level GAAFET of the first CFET 341) to the common replacement metal gate 375/365 of the second pull-up GAAFET 370 and the second pull-down GAAFET 360 (which make up the second CFET 342). As mentioned above, the buried metal interconnect 392 can include a metal wire 392b and a conductive liner 392a adjacent to bottom, side and top surfaces of the metal wire 392*b*. The conductive liner 392*a* can be, for example, one or more conformal conductive layers suitable for promoting adhesion and/or providing a diffusion barrier (e.g., titanium, titanium nitride, tantalum, tantalum nitride, or any other conductive material). The metal wire 392*b* can be made of one or more layers of metal and/or metal alloy fill materials (e.g., ruthenium, tungsten, cobalt, nickel, aluminum, copper, or any other suitable metal wire material). In this case, the buried metal interconnect 392 can be essentially L-shaped with a first segment 392.1 and a second segment 392.2.

The first segment 392.1 can have one end in direct contact with the sidewall of one of the common N-type source/drain region 312*b*/322*a* of the first pass-gate GAAFET 310 and the first pull-down GAAFET 320 and an opposite end in contact with the second segment 392.2. Optionally, the first segment 392.1 can further have a metal silicide layer 345 covering the end adjacent to the common N-type source/drain region 312*b*/322*a* such that the metal silicide layer 345 is positioned laterally between that sidewall of that common N-type source/drain region 312*b*/322*a* and the metal wire 392*b* of the first segment 392.1. The first segment 392.1 can further be parallel to and positioned laterally between the replacement metal gates 315 and 335/325 of the first pass-gate GAAFET 310 and the first CFET 341 and a sidewall of this first segment 392.1 can be in contact with a sidewall of the first gate cut isolation region 305A.

The second segment 392.2 can be essentially perpendicular to the first segment 392.1 and can be positioned laterally between and immediately adjacent to lower portions of both the first gate cut isolation region 305A and the common replacement metal gate 375/365 of the second pull-up GAAFET 370 and the second pull-down GAAFET 360 (i.e., the second CFET 342).

It should be noted that, due to the processing techniques used for form this buried metal interconnect 392, discussed in greater detail below, the first segment 392.1 and the N-type source/drain regions of the various lower-level N-type GAAFETs have essentially co-planar top surfaces and the second segment 392.2 has a top surface that is above (as illustrated), at, or even below the level of the top surface of the first segment 392.1. The top surface of the metal wire 392*b* in the first segment 392.1 is entirely covered by the conductive liner 392*a*, whereas the top surface of the metal wire 392*b* in the second segment 392.2 is devoid of the conductive liner 392*a*. The isolation layer 304 extends laterally over and covers the first segment 392.1 and also fills the space between the first segment 392.1 and the common N-type source/drain region 362*a*/352*b* of the second pass-gate GAAFET 350 and the second pull-down GAAFET 360, thereby electrically isolating the buried metal interconnect 392 from source/drain regions other than the common N-type source/drain regions 312*b*/322*a* (e.g., see FIG. 3F). Gate sidewall spacers 382 electrically isolate the buried metal interconnect 392 from replacement metal gates other than the common replacement metal gate 375/365 (e.g., see FIG. 3E). Dielectric fill material 385 covers the top surface of the second segment 392.1 and can be positioned laterally between and immediately adjacent to upper portions of both the first gate cut isolation region 305A and the common replacement metal gate 375/365 of the second pull-up GAAFET 370 and the second pull-down GAAFET 360 (i.e., the second CFET 342). The dielectric fill material 385 can be, for example, silicon nitride or any other suitable dielectric fill material.

The above-described exemplary IC structure embodiment can further include, but is not limited to, the following additional components. Specifically, the structure can include dielectric gate caps 306 on the various replacement metal gates of the GAAFETs in the 6T-SRAM cell 300 and a combination of inner spacers 307 and gate sidewall spacers 382, which electrically isolate the replacement metal gates from the adjacent source/drain regions of those GAAFETs. The inner spacers 307 can be made, for example, of a low-K dielectric material, or any other suitable isolation material. The gate sidewall spacers 382 can be made, for example, of silicon nitride, silicon carbon nitride, silicon boron carbon nitride or any other suitable gate sidewall spacer material. The dielectric gate caps 306 can be made, for example, of silicon nitride or any other suitable dielectric gate cap material.

The exemplary IC structure embodiment can further include one or more layers 308-309 of interlayer dielectric (ILD) material that cover the 6T-SRAM cell 300. For example, a first layer 308 of ILD material can be above and immediately adjacent to the P-type source/drain regions of the upper-level P-type GAAFETs 330 and 360 and can further be above and immediately adjacent to those portions of the isolation layer 304 that are not covered by P-type source/drain regions (e.g., aligned above the N-type source/drain regions 312*a* and 352*a* of the first pass-gate GAAFET 310 and the second pass-gate GAAFET 350). The top surface of this first layer 308 of ILD material can be essentially co-planar with the top surfaces of the gate sidewall spacers 382, gate caps 306, gate cut isolation regions 305A-305B, and the dielectric fill material 385. A second layer 309 of ILD material can be above and immediately adjacent to the co-planar top surfaces of the gate sidewall spacers 382, gate caps 306, gate cut isolation regions 305A-305B, the dielectric fill material 385, and the first layer 308. The ILD material can be, for example, silicon dioxide or any other suitable ILD material.

The exemplary IC structure can further include various other local metal interconnects 391 and 393-394 used to achieve the required cross-couple connection between the first pass-gate 310, pull-down 320 and pull-up 330 GAAFETs and the second pass-gate 350, pull-down 360 and pull-up 370 GAAFETs. Specifically, a local metal interconnect 391 can extend vertically through the first layer 308 of ILD material and the isolation layer 304 below and can further be positioned laterally immediately adjacent to sidewalls of the P-type source/drain region 332*a* of the first pull-up GAAFET 330 and the common N-type source/drain region 312*b*/322*a* of the first pass-gate GAAFET 310 and the first pull-down GAAFET 320 (see FIG. 3F). As discussed above, the buried metal interconnect 392 can provide the electrical connection between the common N-type source/drain region 312*b*/322*a* for the first pass-gate and pull-down GAAFETs 310 and 320 and the common replacement metal gate 375/365 of the second pull-up and pull-down GAAFETs 370 and 360 (i.e., the second CFET 342). Another local metal interconnect 393 can extend vertically through the first layer 308 of ILD material and the isolation layer 304 below and can further be positioned laterally immediately adjacent to sidewalls of the P-type source/drain region 372*a* of the second pull-up GAAFET 370 and the common N-type source/drain region 352*b*/362*a* of the second pass-gate GAAFET 350 and the second pull-down GAAFET 360 (see FIG. 3F). Finally, yet another local metal interconnect 394 can be within the first layer 308 of ILD material and can electrically connect the P-type source/drain region 372*a* of the second pull-up GAAFET 370 to the common replacement metal gate 335/325 for the first pull-up and pull-down GAAFETs 330 and 320 (i.e., the first CFET 341) (see FIGS. 3E-3G). It should be noted that the metal interconnect 394 can abut the metal interconnect 393, as illustrated. Alternatively, these metal interconnects 393 and 394 can be physically separated.

The exemplary IC structure embodiment can further include various middle-of-the-line contacts. These contacts can include first and second wordline contacts. The first wordline contact 396 can extend essentially vertically through the second layer 309 of ILD material and through a dielectric gate cap 306 to the replacement metal gate 315 of the first pass-gate GAAFET 310. The second wordline contact 397 can extend essentially vertically through the second layer 309 of ILD material and through another dielectric gate cap 306 to the replacement metal gate 355 of the second pass-gate GAAFET 350. These contacts can further include first and second bitline contacts. The first bitline contact 398 can extend essentially vertically through the second layer 309 of ILD material and through a dielectric gate cap to the common replacement metal gate 375/365 of the first pull-up and pull-down GAAFETs 330 and 320 (i.e., the first CFET 341) and can further abut the local metal interconnect 394. The second bitline contact 399 can land on, for example, the metal interconnect 391 (as illustrated) or, alternatively, the buried metal interconnect (if sufficiently electrically isolated).

Also disclosed herein are embodiments of a method for forming the above-described IC structure embodiments. Generally, the method embodiments can include forming, on a semiconductor substrate, first-type source/drain regions for lower-level gate-all-around field effect transistors (GAAFETs). During formation of the first-type source/drain regions, an interconnect placeholder can also be formed such that it extends essentially perpendicularly from a sidewall of a given one of the first-type source/drain regions of a lower-level GAAFET of a complementary field effect transistor (CFET). An isolation layer can be formed over the first-type source/drain regions and the interconnect placeholder. Subsequently, second-type source/drain regions for at least an upper-level GAAFET of the CFET can be formed on the isolation layer (e.g., aligned above the first-type source/drain regions for the lower-level GAAFET of that CFET). Following formation of the second-type source/drain regions, replacement metal gate processing can be performed to form metal gates for the lower-level and upper-level GAAFETs. The metal gates can include a common metal gate for the lower-level and upper-level GAAFETs within each CFET. After replacement metal gate processing is performed, replacement metal interconnect processing can be performed. That is, the interconnect placeholder can be selectively removed and replaced with a buried metal interconnect. Replacement metal interconnect processing can be performed so as to electrically connect the selected first-type source/drain region of the lower-level GAAFET of the CFET to another IC component. For example, replacement metal interconnect processing can be performed so as to electrically connect the selected first-type source/drain region of the lower-level GAAFET of the CFET to the gate of an additional GAAFET (e.g., to the gate of a conventional single-level GAAFET or to the gate of a lower-level GAAFET of another CFET), which is positioned laterally adjacent and parallel to the CFET.

The above-described technique can be used to form at least one CFET and a buried metal interconnect that provides an electrical connection between a source/drain region of a lower-level GAAFET of that CFET to another IC component. For purposes of illustration, the above-described technique is described in greater detail below and illustrated in the flow diagram of FIG. 4 with respect to the formation of the exemplary IC structure embodiment shown in FIGS. 3A-3H and including a 6T-SRAM cell 300 and a buried metal interconnect 392 that enables the required cross-couple connection. However, it should be understood that the description and drawings are not intended to be limiting. Other method embodiments, which use replacement metal interconnect processing to form a buried metal interconnect that provides a local electrical connection between to a source/drain region of a lower-level GAAFET of a CFET and another component of an IC, are anticipated.

Figure 4:
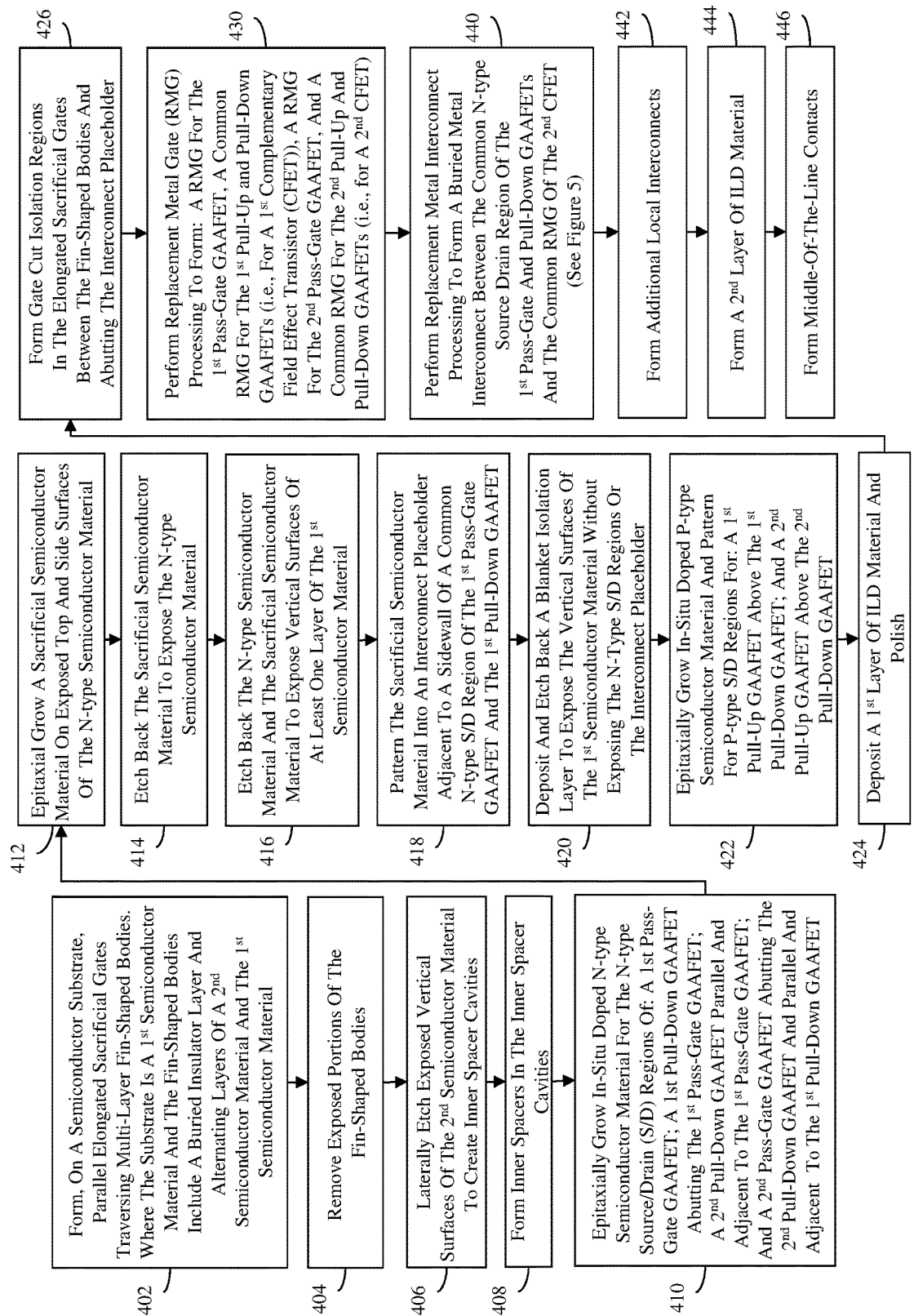
FIG. 4 is a flow diagram illustrating a disclosed method of forming the IC structure of FIGS. 3A-3H.

Specifically, referring to FIG. 4, a disclosed method embodiment can include performing preliminary gate-all-around field effect transistor (GAAFET) processing (see process step 402, see FIGS. 6A-6D). This preliminary GAAFET processing can include providing a semiconductor wafer that includes a semiconductor substrate 301 and a multi-layer stack on the semiconductor substrate 301. The semiconductor substrate 301 can be a first semiconductor material (e.g., silicon). The multi-layer stack can include a buried isolation layer 303 (e.g., a silicon dioxide layer or any other suitable buried isolation layer). The multi-layer stack can further include alternating layers of a second semiconductor material 602 (e.g., silicon germanium) and the first semiconductor material 601. It should be noted that the alternating layers should include at least two layers of the first semiconductor material 601 and, optionally, may include more than two layers. The first semiconductor material 601 in the multi-layer stack can be intrinsic (i.e., undoped). Alternatively, since the lower layer(s) of the first semiconductor material 601 will be used for forming channel regions for lower-level N-type GAAFETs and the upper layer(s) of the first semiconductor material 601 will be used for forming channel regions for upper-level P-type GAAFETs, the lower layer(s) of the first semiconductor material 601 can be doped with a P-type dopant so as to have a P-type conductivity at a relatively low conductivity level (e.g., P– conductivity) and the upper layer(s) of the first semiconductor material 601 can be doped with an N-type dopant so as to have an N-type conductivity at a relatively low conductivity level (e.g., N– conductivity).

This preliminary GAAFET processing can further include forming, from the multi-layer stack, multiple parallel fin-shaped bodies 395. For purposes of this disclosure, a fin-shaped body refers to a relatively tall and thin essentially rectangular-shaped body. Techniques for forming such fin-shaped bodies (e.g., lithographic patterning and etch techniques, sidewall image transfer techniques, etc.) are well known in the art. Thus, the details of this technique have been omitted from this specification in order to allow the reader to focus on the salient aspects of the disclosed embodiments.

This preliminary GAAFET processing can further include forming shallow trench isolation (STI) regions on the semiconductor substrate 301 laterally surrounding lower portions of the fin-shaped bodies 395. Specifically, a blanket layer of isolation material (e.g., silicon dioxide or some other suitable isolation material) can be deposited over the partially completed structure and then etched back to expose the alternating layers of the second semiconductor material 602 and the first semiconductor material 601, thereby forming the STI regions 302.

The preliminary GAAFET processing can further include forming parallel, elongated sacrificial gates 380 with sacrificial gate caps 381, respectively, on the STI regions 302 and further traversing the fin-shaped bodies 395 (i.e., on the top surface and opposing sidewalls of the fin-shaped bodies).

For example, a thin conformal dielectric layer (e.g., a thin silicon dioxide layer (not shown)) can be deposited over the partially completed structure. Then, a blanket sacrificial gate layer can be deposited onto the conformal dielectric layer. This blanket sacrificial gate layer can be, for example, a polysilicon layer, an amorphous silicon layer or any other suitable sacrificial gate material that is different from the materials of the multi-layer fin-shaped bodies 395 (e.g., different from the first and second semiconductor materials) and that can be selectively and isotropically etched away from these materials during subsequent processing. The sacrificial gate layer can then be polished (e.g., using a CMP process) and a sacrificial dielectric cap layer (e.g., a silicon nitride cap layer) can be deposited onto the sacrificial gate layer. The resulting sacrificial gate stack can then be lithographically patterned and etched to form a pair of elongated sacrificial gates 380, each having a sacrificial gate cap 381 and each traversing first portions and, particularly, designated channel regions of a pair of adjacent fin-shaped bodies 395. In this case, second portions and, particularly, designated source/drain regions are exposed on opposing sides of the sacrificial gates 380.

The preliminary GAAFET processing can further include forming gate sidewall spacers 382 positioned laterally adjacent to the external sidewalls of the sacrificial gates 380. The gate sidewall spacers 382 can be formed using conventional gate sidewall spacer formation techniques. That is, a gate sidewall spacer material layer can be conformally deposited over the partially completed structure and then an anisotropic etch process can be performed to essentially remove the dielectric spacer material from horizontal surfaces. The remaining vertical portions of the gate sidewall spacer material layer on the sidewalls of each sacrificial gate 380 will form a gate sidewall spacer 382. The gate sidewall spacer material layer can be, for example, silicon nitride, silicon carbon nitride, silicon boron carbon nitride or any other suitable gate sidewall spacer material. In any case, the gate sidewall spacer material layer shall be made of a different dielectric material than the sacrificial dielectric cap layer.

Figure 7A:
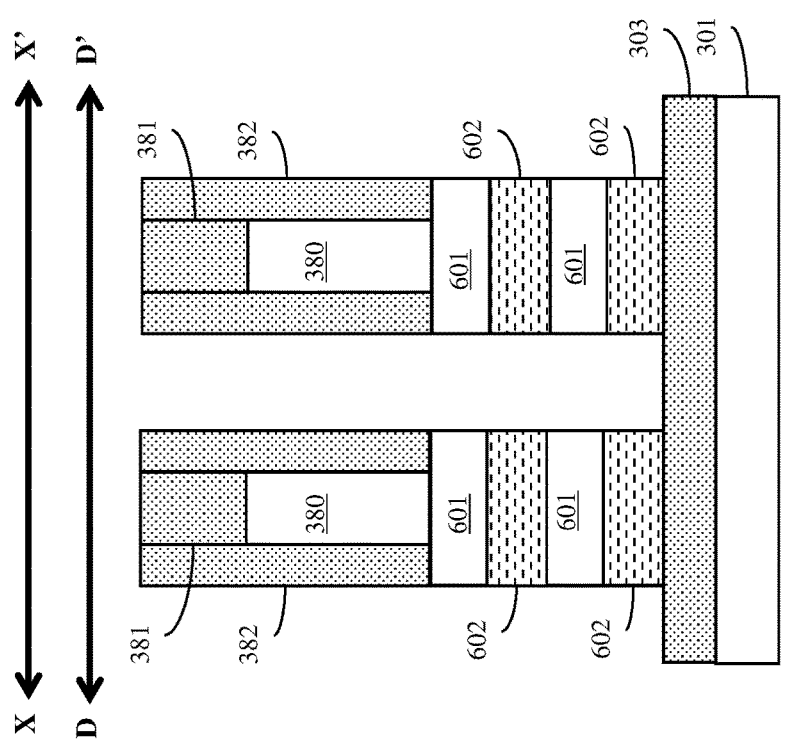
FIGS. 7A-7B are different cross-section diagrams illustrating a partially completed IC structure formed according to the disclosed method.
Figure 7B:
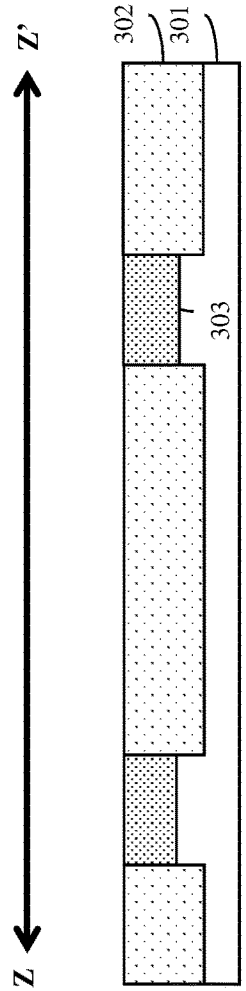

Source/drain recesses can then be formed in the designated source/drain regions of the fin-shaped bodies 395, which are exposed on the opposing sides of the sacrificial gates 380 (see process step 404 and FIGS. 7A-7B). Specifically, an anisotropic etch process can be performed, wherein the etch chemistries used are selective for the first and second semiconductor materials 601-602 of the fin-shaped bodies 395 over the dielectric materials of the gate sidewall spacers 382, the sacrificial gate caps 381 and the buried isolation layer 303. Thus, this etch process will remove exposed semiconductor material in the designated source/drain regions of the fin-shaped bodies 395 on opposing sides of the sacrificial gates 380 and will stop on the buried isolation layer 303. Additionally, as a result of this etch process, vertical surfaces of the the designated channel regions of the fin-shaped bodies 395 will be exposed within each source/drain recess and these vertical surfaces will be essentially vertically aligned with the outermost edges of the gate sidewall spacers 382.

Figure 8:
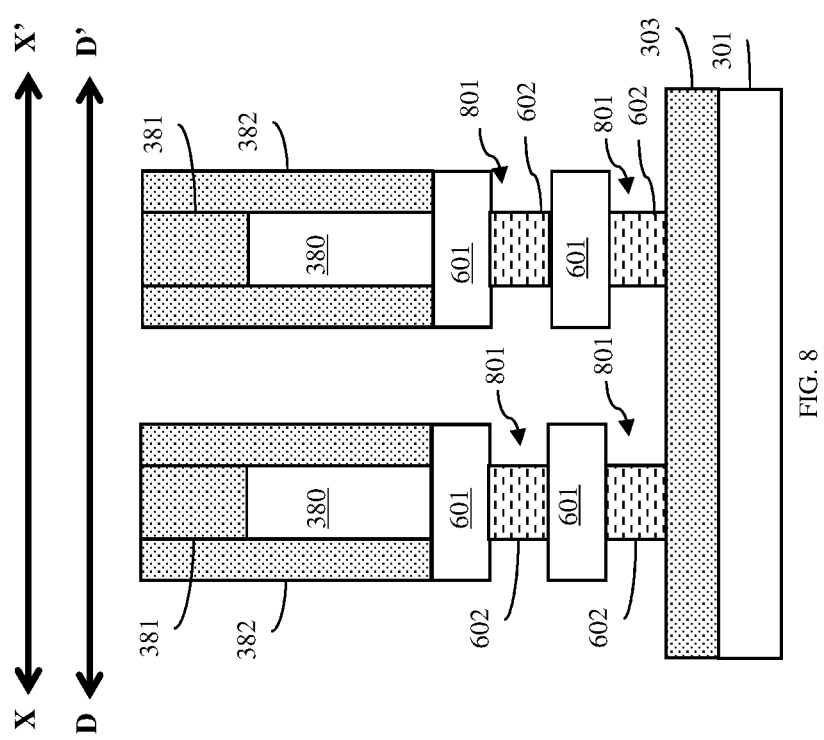
FIG. 8 is a cross-section diagram illustrating a partially completed IC structure formed according to the disclosed method.
Figure 9:
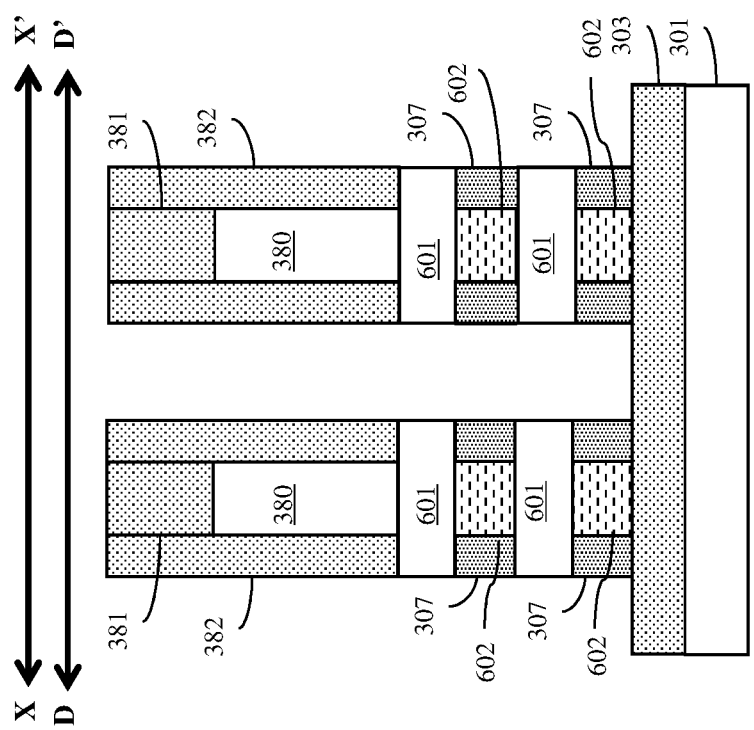
FIG. 9 is a cross-section diagram illustrating a partially completed IC structure formed according to the disclosed method.

Next, the second semiconductor material 602, which is exposed at these vertical surfaces, can be laterally etched to form inner spacer cavities 801 (see process step 406 and FIG. 8). Specifically, the inner spacer cavities 801 will be formed at the sides of the source/drain recesses and aligned with below the gate sidewall spacers 382. Inner spacers 307 can then be formed within the inner spacer cavities 801 (see process step 408 and FIG. 9). For example, a thin layer of inner spacer isolation material can be deposited so as to fill the cavities 801. Then, a selective anisotropic etch process can be performed to selectively remove any of this inner spacer isolation material that extends outside the inner spacer cavities 801. The inner spacer isolation material can be, for example, a low-K dielectric material or any other suitable isolation material that is different from dielectric materials of the gate sidewall spacers 382, sacrificial gate caps 381, buried isolation layer 303 and STI regions 302 so that this inner spacer isolation material can be selectively etched away.

Subsequently, N-type source/drain regions for lower-level N-type gate-all-around field effect transistors (N-type GAAFETs) for the SRAM cell can be formed and, during formation of the N-type source/drain regions, an interconnect placeholder 901 can be formed (see process steps 410-418).

Specifically, a first epitaxial semiconductor material 810 and, particularly, an in-situ doped N-type semiconductor material (e.g., N-type silicon or silicon carbide) can be epitaxially grown laterally in the source/drain recesses from exposed vertical surfaces of the first semiconductor material 601 on opposing sides of the designated channel regions (i.e., on the opposing sides of the first portions of the fin-shaped bodies below the sacrificial gates) (see process step 410 and FIGS. 10A-10B). Next, a second epitaxial semiconductor material 820 and, particularly, a sacrificial semiconductor material (e.g., silicon germanium) can be epitaxially grown on exposed top and side surfaces of the first epitaxial semiconductor material 810 (see process step 412 and FIGS. 11A-11C). Subsequently, a selective anisotropic etch process can be performed to etch back the second epitaxial semiconductor material 820 and expose the top surface of the first epitaxial semiconductor material 810 (see process step 414 and FIGS. 12A-12C). Once the top surface of the first epitaxial semiconductor material 810 is exposed, the selective anisotropic etch process can continue so as to etch back exposed top surfaces of both the first epitaxial semiconductor material 810 and the second epitaxial semiconductor material 820 to a predetermined level, which is below the level of at least the uppermost layer of the first semiconductor material 601 remaining fin-shaped bodies and which is also above the level of at least the lowermost layer of the first semiconductor material 601.

Figure 12B:
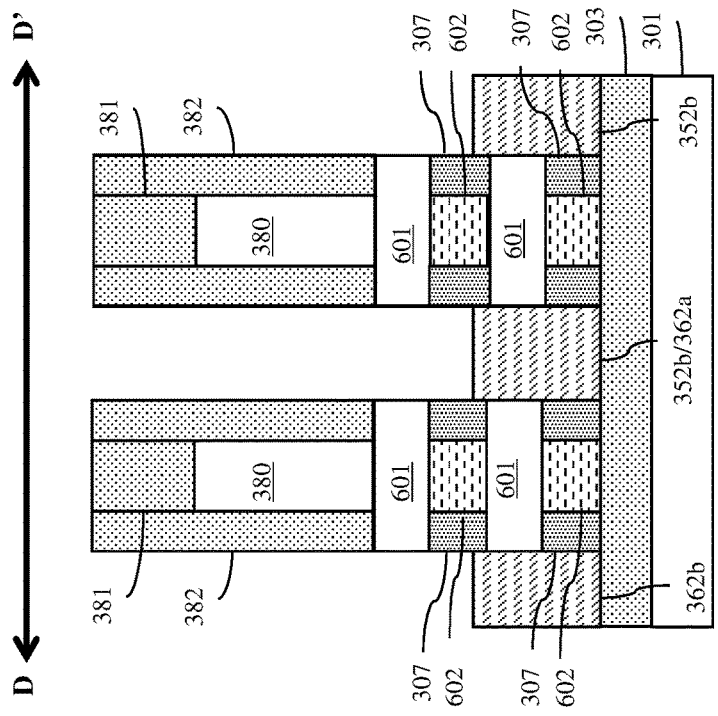
FIGS. 12A-12C are different cross-section diagrams illustrating a partially completed IC structure formed according to the disclosed method.
Figure 12A:
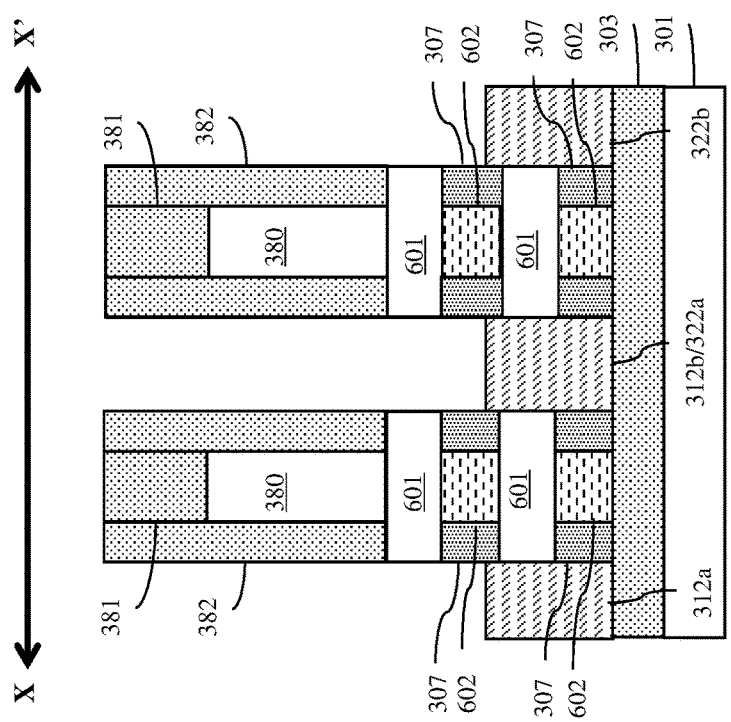
Figure 12C:
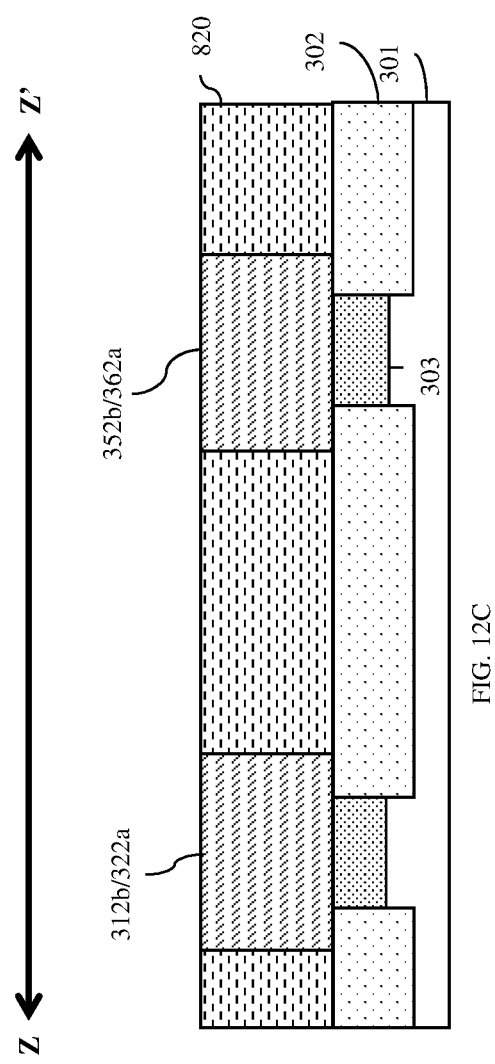

As illustrated in FIGS. 12A-12C, process step 414 results in N-type source/drain regions for four lower-level N-type GAAFETs for the 6T-SRAM cell 300. Specifically, this process step 414 results in formation of N-type source/drain regions 312a-312b and 322a-322b for a first pass-gate GAAFET 310 and a first pull-down GAAFET 320, respectively, from a first fin-shaped body with the N-type source/drain region 312b of the first pass-gate GAAFET 310 abutting the N-type source/drain region 322a of the first pull-down GAAFET 320 such that these regions form a common N-type source/drain regions 312b/322a (also referred to herein as a shared N-type source/drain region). This process step 414 also results in N-type source/drain regions 352a-352b and 362a-362b for a second pass-gate GAAFET 350 and a second pull-down GAAFET 360, respectively, from a second fin-shaped body with the N-type source/drain region 352b of the second pass-gate GAAFET 350 abutting the N-type source/drain region 362a of the second pull-down GAAFET 360 such that these regions form a common N-type source/drain regions 352b/362a (also referred to herein as a shared N-type source/drain region). The N-type source/drain regions of the first GAAF-ETs can be adjacent and parallel to the N-type source/drain regions of the second GAAFETs, but asymmetrically oriented such that the first and second pass-gate GAAFETs are on opposite sides of the SRAM cell.

Figure 13A:
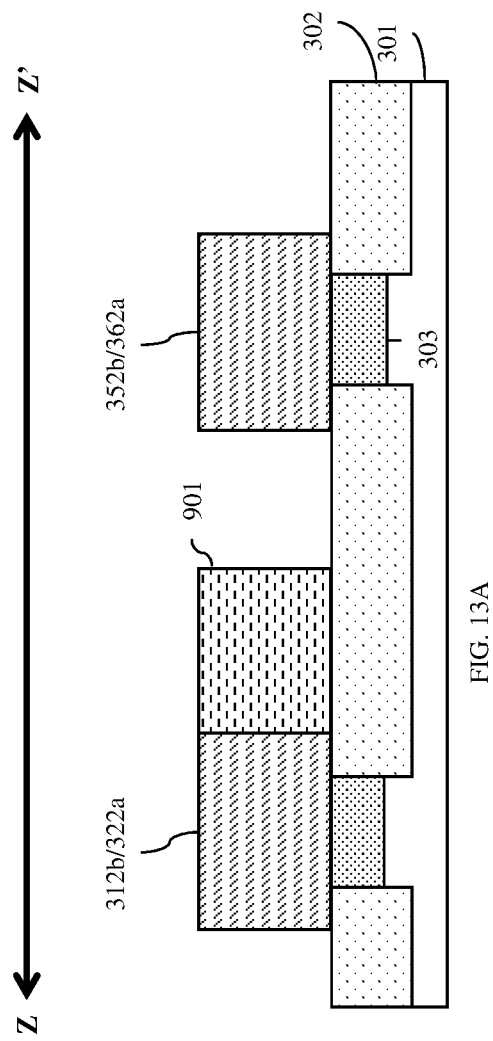
FIGS. 13A-13B are different cross-section diagrams illustrating a partially completed IC structure formed according to the disclosed method.
Figure 13B:
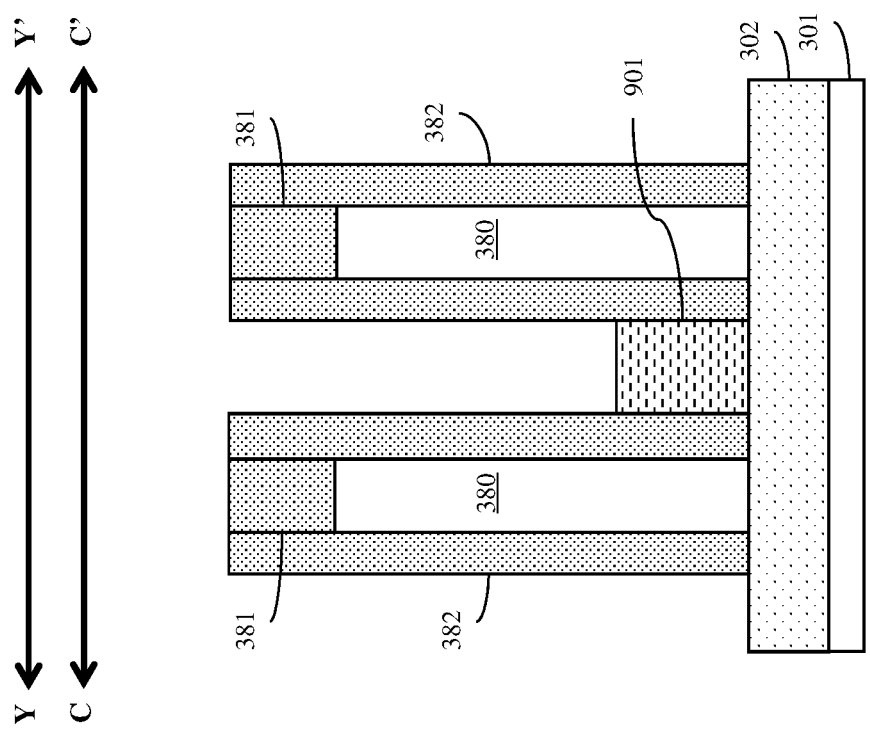
Figure 14B:
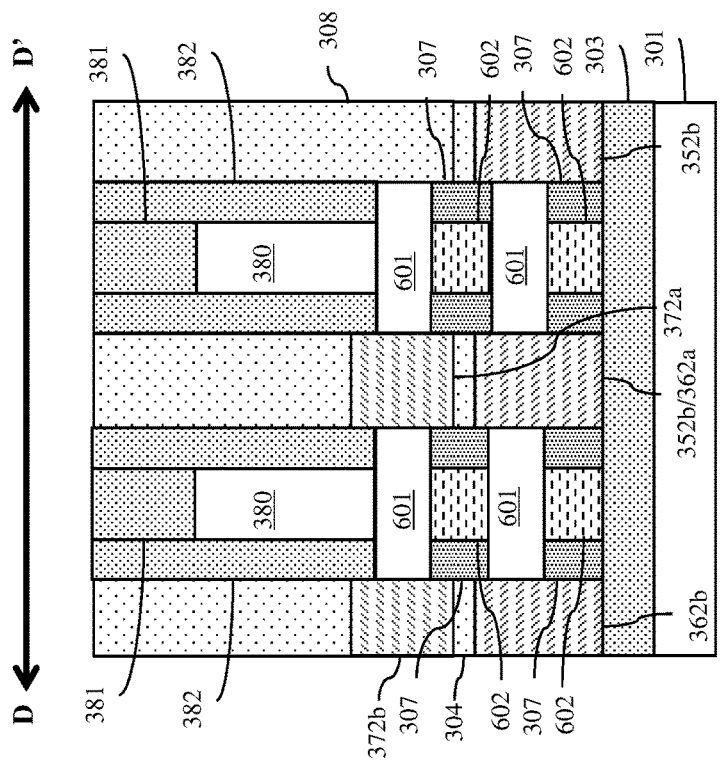
FIGS. 14A-14D are different cross-section diagrams illustrating a partially completed IC structure formed according to the disclosed method.
Figure 14A:
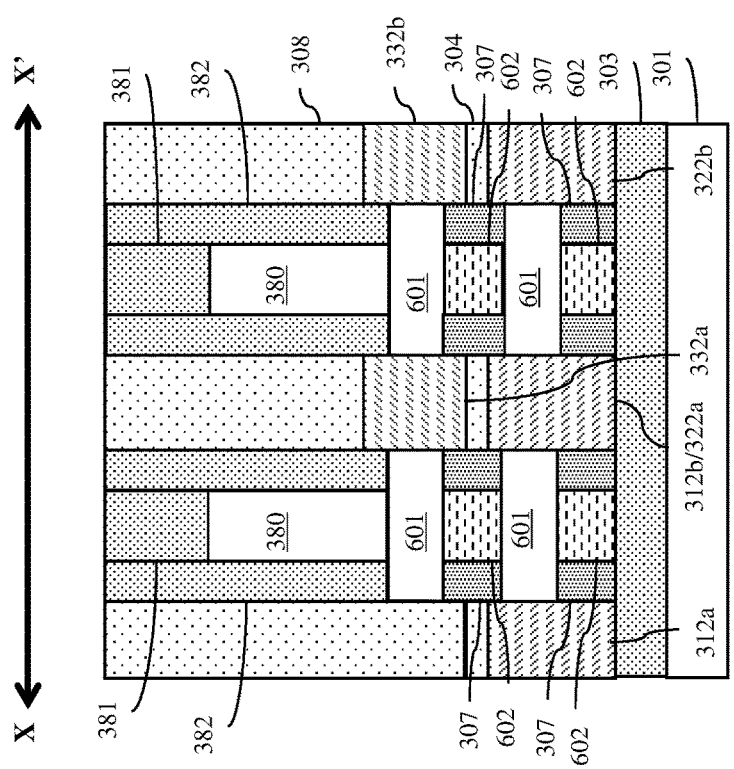
Figure 14C:
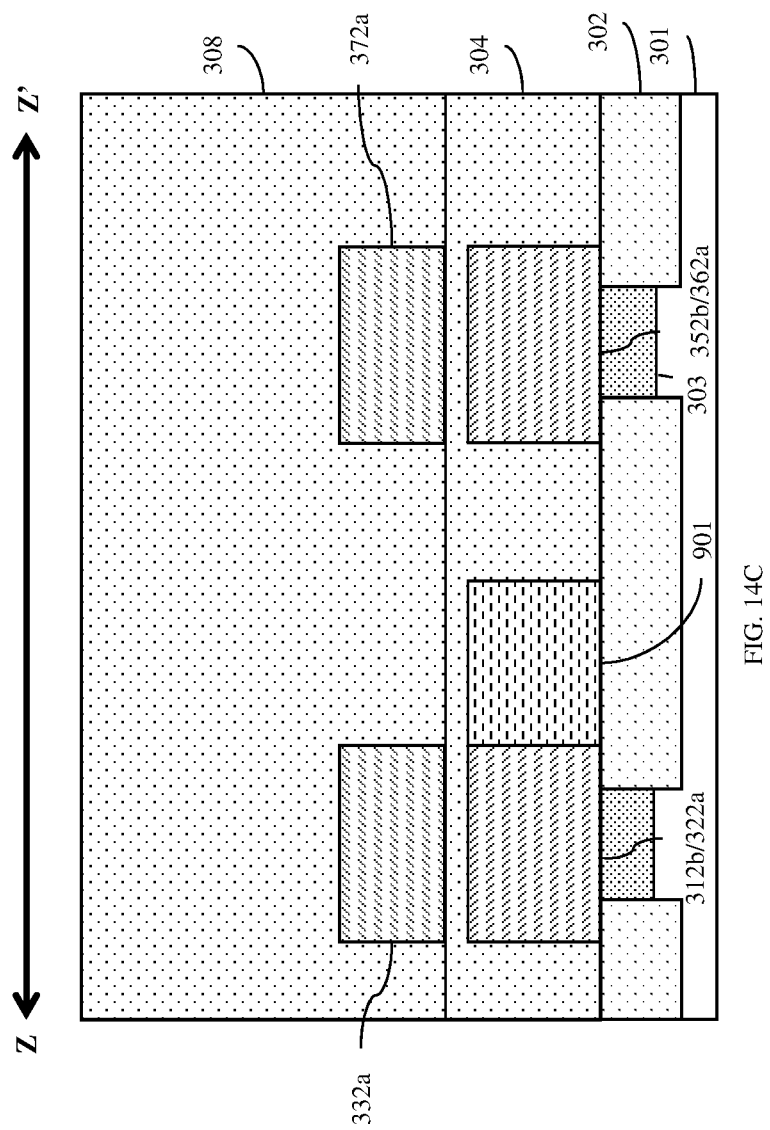
Figure 14D:
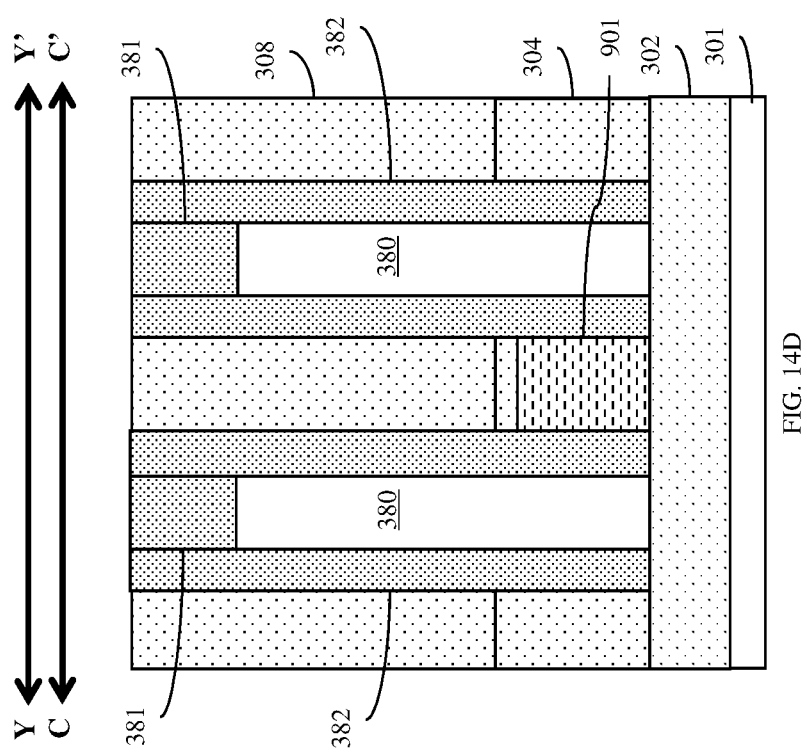
Figure 15C:
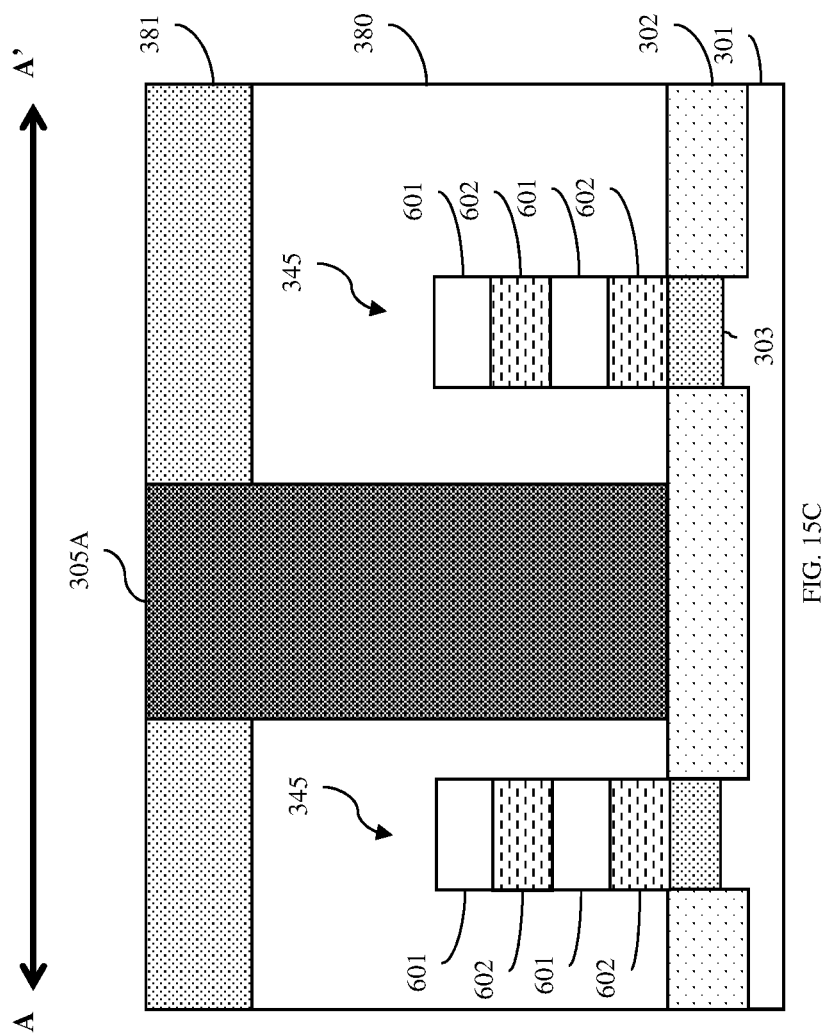
Figure 15D:
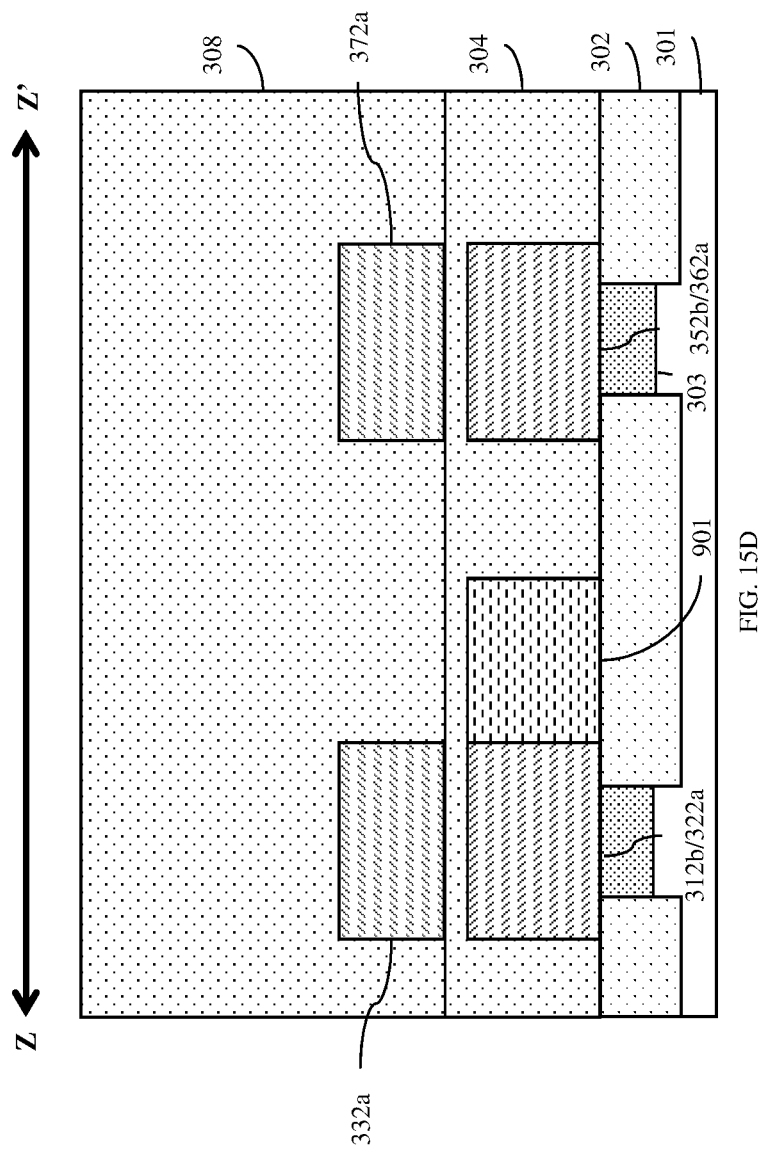
Figure 15E:
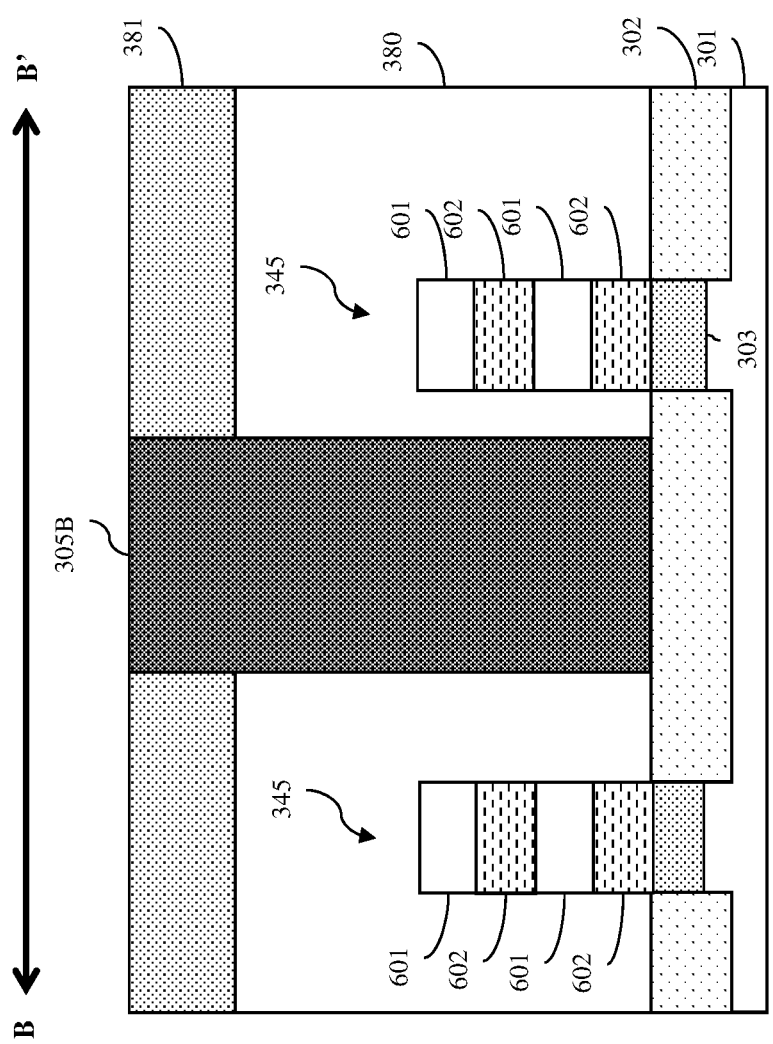
Figure 16A:
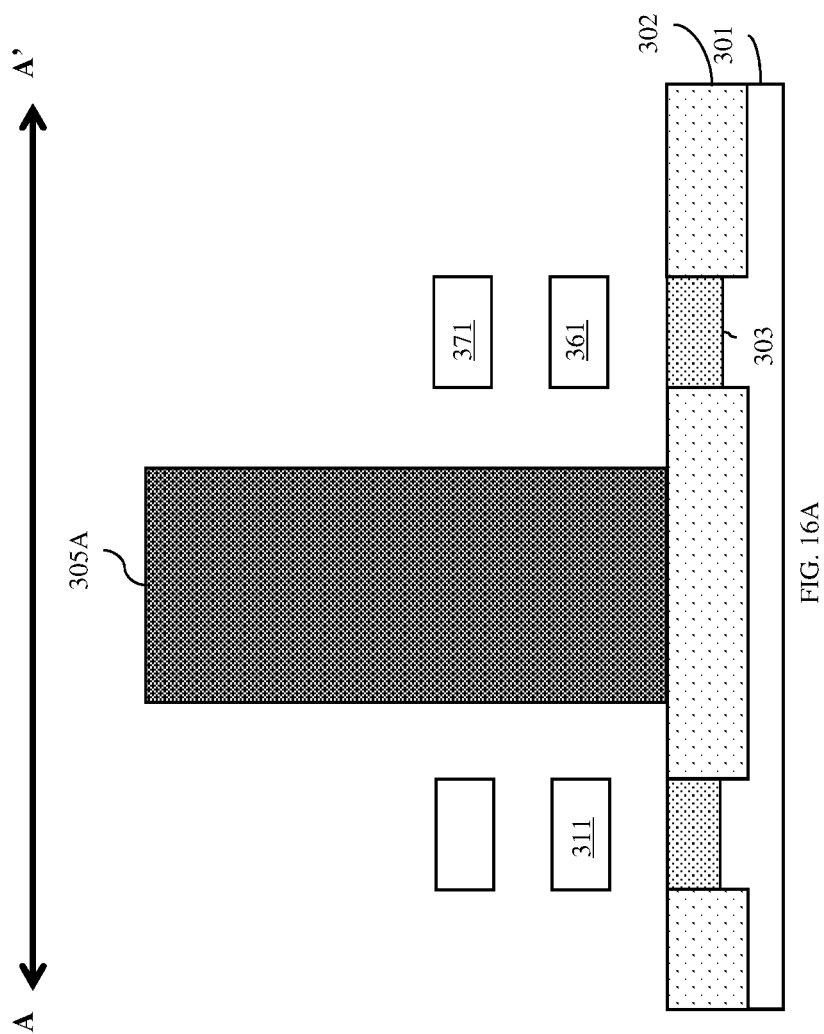

At this point in the processing, the second epitaxial semiconductor material 820 (i.e., the sacrificial semiconductor material) will be positioned laterally adjacent to opposing sidewalls of each of the N-type source/drain regions. Furthermore, the N-type source/drain regions and the second epitaxial semiconductor material 820 will have essentially co-planar top surfaces. The second epitaxial semiconductor material 820 can then be lithographically patterned and etched to form an interconnect placeholder 901 (see process step 418 and FIGS. 13A-13B). This patterning process step 418 can be performed such that the interconnect placeholder 901 extends essentially perpendicularly from a sidewall of the common N-type source/drain region 312b/322a of the first pass-gate GAAFET 310 and the first pull-down GAAFET 320 toward the common N-type source/drain region 352b/362a of the second pass-gate GAAFET 350 and the second pull-down GAAFET 360. The resulting interconnect placeholder 901 will be positioned laterally between and parallel to the elongated sacrificial gates 380 and the N-type source/drain regions and the interconnect placeholder 901 will have essentially co-planar top surfaces.

Once the interconnect placeholder 901 is formed, a blanket isolation layer 304 (e.g., a blanket silicon dioxide layer) can be deposited over the partially completed structure and, particularly, over the N-type source/drain regions and the interconnect placeholder 901 (see process step 420). This blanket isolation layer 304 can then be etched back so as to expose vertical surfaces of at least the uppermost layer of the first semiconductor material 601 remaining in the designated channel regions without also exposing the N-type source/drain regions and the interconnect placeholder 901.

Next, P-type source/drain regions for upper-level P-type GAAFETs for the SRAM cell can be formed (see process step 422 and FIGS. 14A-14D). Specifically, yet another epitaxial semiconductor material and, particularly, an in-situ doped P-type semiconductor material (e.g., P-type silicon or silicon germanium) can be epitaxially grown laterally in the source/drain recesses above the isolation layer 304 from exposed vertical surfaces of at least the uppermost layer of the first semiconductor material 601 on opposing sides of the designated channel regions (i.e., on the opposing sides of the first portions of the fin-shaped bodies below the sacrificial gates). The P-type semiconductor material can subsequently be lithographically patterned and etched so that P-type source/drain regions 332a-332b for a first pull-up GAAFET 330 (which will be an upper-level GAAFET in a first CFET 341) are on the isolation layer 304 and aligned above the N-type source/drain regions 322a-322b of the first pull-down GAAFET 320 and further so that P-type source/drain regions 372a-372b for a second pull-up GAAFET 370 (which will be an upper-level GAAFET in a second CFET 342) are on the isolation layer 304 and aligned above the N-type source/drain regions 362a-362b of the second pull-down GAAFET 360. The patterning process can further be performed so as to remove any P-type semiconductor material from above the N-type source/drain region 312a of the first pass-gate GAAFET 310 and also from above the N-type source/drain region 352a of the second pass-gate GAAFET 350.

Following formation of the P-type source/drain regions, a first layer 308 of interlayer dielectric (ILD) material (e.g., silicon dioxide) can be deposited over the partially completed structure and polished (e.g., using a chemical mechanical polishing (CMP) process) (see process step 424 and FIGS. 14A-14D).

Gate cut isolation regions 305A-305B can then be formed (see process step 426 and FIGS. 15A-15E). Cuts or trenches can be lithographically patterned and etched such that these trenches extend essentially vertically through and entirely across the sacrificial gates 380, respectively, thereby dividing each elongated sacrificial gate into two discrete sacrificial gates. The resulting sacrificial gates will include a sacrificial gate for the first pass-gate GAAFET, a common sacrificial gate for a first complementary field effect transistor (CFET) that includes the first pull-down GAAFET and the first pull-up GAAFET, a sacrificial gate for a second pass-gate GAAFET, and a common sacrificial gate for a second CFET that includes the second pull-down GAAFET and the second pull-up GAAFET. The cuts through the sacrificial gates can be offset with a first cut for the first gate cut isolation region 305A being closer to the first fin-shaped body at the first pass-gate GAAFET 310 and with a second cut for the second gate cut isolation region 305B being closer to the second fin-shaped body at the second pass-gate GAAFET 350 (see FIGS. 15C and 15E). An insulative fill material can then be deposited so as to fill the cuts and a polishing process (e.g., a CMP process) can be performed so as to complete the first and second gate cut isolation regions 305A-305B, respectively. The insulative fill material can be, for example, silicon carbide, silicon oxycarbide or any other suitable insulative fill material.

Replacement metal gate (RMG) processing can then be performed to form replacement metal gates for the lower-level N-type field effect transistors and the upper-level P-type field effect transistors (see process step 430). Specifically, the sacrificial gates can be selectively removed. That is, a selective etch process can be performed in order to selectively etch away the material of the sacrificial gate over the semiconductor materials of the remaining portions of the fin-shaped bodies below the sacrificial gates and also over the adjacent dielectric materials (e.g., of the gate sidewall spacers and the ILD material), thereby forming gate openings for the first pass-gate GAAFET, for the first CFET, for the second pass-gate GAAFET, and for the second CFET. Within each gate openings, the top and opposing sides of a remaining portion of a fin-shaped body are exposes. As mentioned above, formation of the sacrificial gates 380 typically includes deposition of a thin conformal silicon dioxide layer prior to deposition and patterning of the sacrificial gate material. This thin conformal silicon dioxide layer will protect the semiconductor material of the fin-shaped bodies during removal of the sacrificial gates. Following removal of the sacrificial gates 380, this silicon dioxide layer can also be removed from the gate openings (e.g., by dilute hydrofluoric acid (DHF)).

Once the gate openings are formed, the remaining second semiconductor material 602 exposed within the gate openings can be selectively etched away, thereby creating, within each gate opening, multiple, stacked, elongated nanoshapes (e.g., nanowires or nanosheets) of the first semiconductor material 601 (see process steps 16A-16B). Specifically, if the first semiconductor material 601 is silicon and the second semiconductor material 602 is silicon germanium, the silicon germanium can be selectively etched over the silicon and adjacent dielectric materials using any of the following exemplary processes: a thermal etch process (e.g., using gaseous hydrochloric acid (HCl)), a dry plasma etch process, or a wet etch process with process specifications designed to ensure the selective etch of silicon germanium over silicon and various dielectric materials. Alternatively, any other suitable isotropic selective etch process that selectively etches silicon germanium could be used.

The resulting partially completed structure will include: (a) within a first gate opening, at least one nanoshape for at least one channel region 311 of the first pass-gate GAAFET 310 extending laterally between the N-type source/drain regions 312a-312b and at least one unused nanoshape (i.e., at least one non-functional nanoshape) above the channel region 311; (b) with a second gate opening, at least one nanoshape for at least one channel region 321 of the first pull-down GAAFET 320 extending laterally between the N-type source/drain regions 322a-322b and at least one nanoshape for at least one channel region 331 for the first pull-up GAAFET 330 above the channel region 321 and extending laterally between the P-type source/drain regions 332a-332b; (c) within a third gate opening, at least one nanoshape for at least one channel region 351 of the second pass-gate GAAFET 350 extending laterally between the N-type source/drain regions 352a-352b and at least one unused nanoshape (i.e., at least one non-functional nanoshape) above the channel region 351; and (d) within a fourth gate opening, at least one nanoshape for at least one channel region 361 of the second pull-down GAAFET 360 extending laterally between the N-type source/drain regions 362a-362b and at least one nanoshape for at least one channel region 371 for the second pull-up GAAFET 370 above the channel region 371 and extending laterally between the P-type source/drain regions 372a-372b.

Figure 17A:
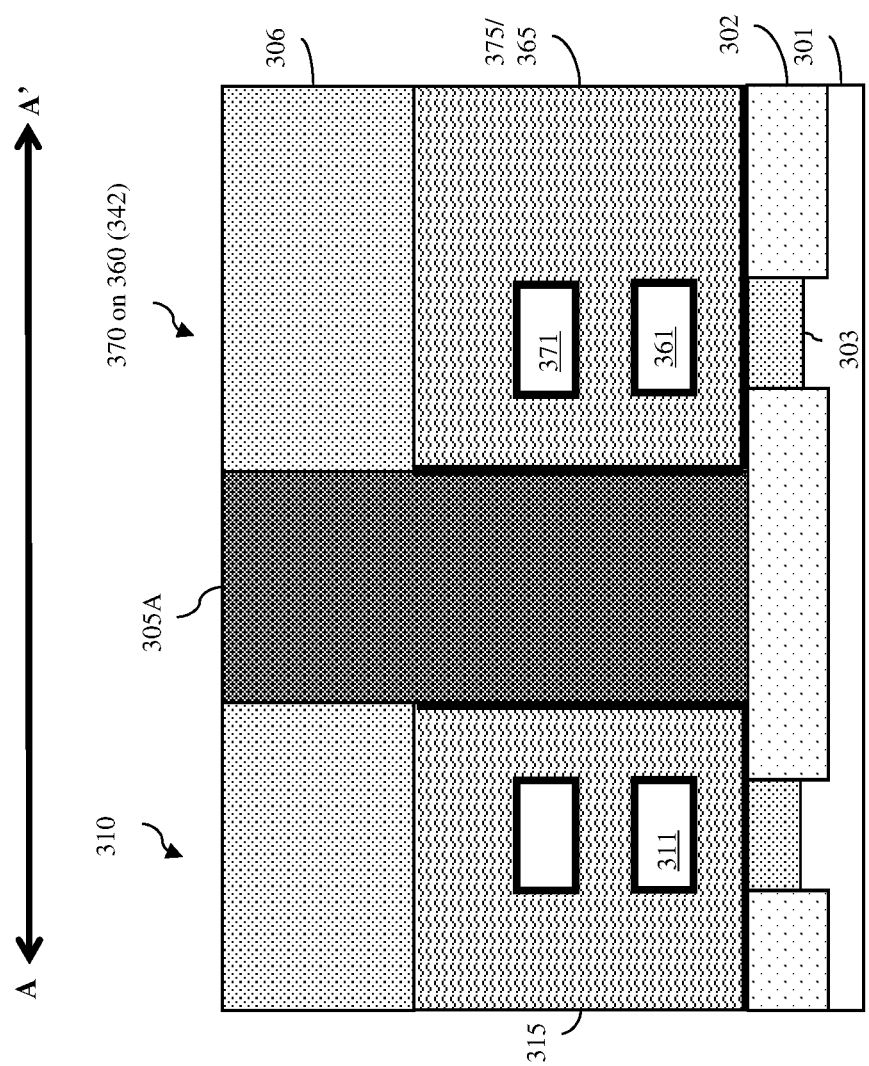
FIGS. 17A-17B are different cross-section diagrams illustrating a partially completed IC structure formed according to the disclosed method.
Figure 17B:
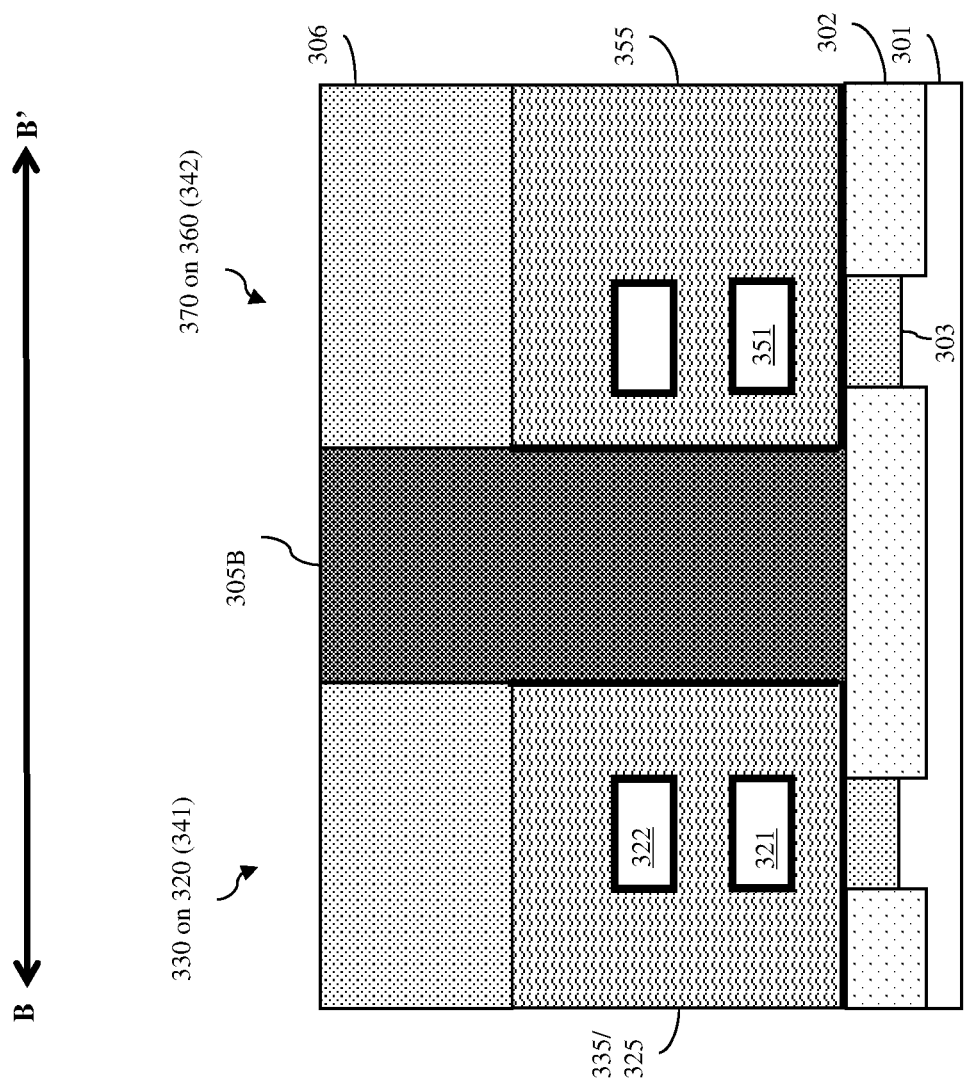

Replacement metal gates can then be performed so as to form replacement metal gates in each of these gate openings (see process step 430 and FIGS. 17A-17B). These RMGs can be formed using conventional RMG formation techniques. That is, a gate dielectric layer (e.g., a high-K gate dielectric layer) can be conformally deposited so that the exposed surfaces of the nanoshape(s) within gate openings are covered (i.e., so that the gate dielectric layer wraps completely around each nanoshape within each gate opening). Those skilled in the art will recognize that, due to the conformal deposition process, the gate dielectric layer may also cover other exposed surfaces within the gate opening (e.g., exposed surfaces of gate sidewall spacers and the buried isolation layer 303). One or more metal gate conductor layers can then be deposited so as to fill the gate openings and a polishing process (e.g., a CMP process) can be performed so as to remove any RMG materials from above the top surface of the first layer 308 of ILD material. See the detailed discussion below regarding the exemplary RMG materials that can be used. In any case, the resulting RMGs will include: (a) a RMG 315 for the first pass-gate GAAFET 310 wrapping around the channel region(s) 311 of the first pass-gate GAAFET 310 and further around the unused nanoshape(s) above; (b) a common RMG 335/325 for the first pull-up GAAFET and the first pull-down GAAFET 320 (i.e., for the first CFET 341) with a lower portion wrapping around the channel region(s) 321 of the first pull-down GAAFET 320 and an upper portion wrapping around the channel region(s) 331 for the first pull-up GAAFET 330 above; (c) a RMG 355 for the second pass-gate GAAFET 350 wrapping around the channel region(s) 351 for the second pass-gate GAAFET 350 and further around the unused nanoshape(s) above; and (d) a common RMG 375/365 for the second pull-up GAAFET 370 and the second pull-down GAAFET 360 (i.e., for the second CFET 342) with a lower portion wrapping around the channel region(s) 361 of the second pull-down GAAFET 360 and with an upper portion wrapping around the channel region(s) 371 for the second pull-up GAAFET 370 above.

Next, dielectric gate caps 306 can be formed on the top surfaces of the RMGs. For example, the gate conductor material within the gate openings can be recessed (i.e., etched back) and a dielectric gate cap layer (e.g., a silicon nitride gate cap layer) can be deposited over the partially completed structure. A polishing process (e.g., a CMP process) can then be performed so as to remove any of the dielectric gate cap material from above the top surface of the first layer 308 of ILD material, thereby forming the dielectric gate caps 306.

Figure 5:
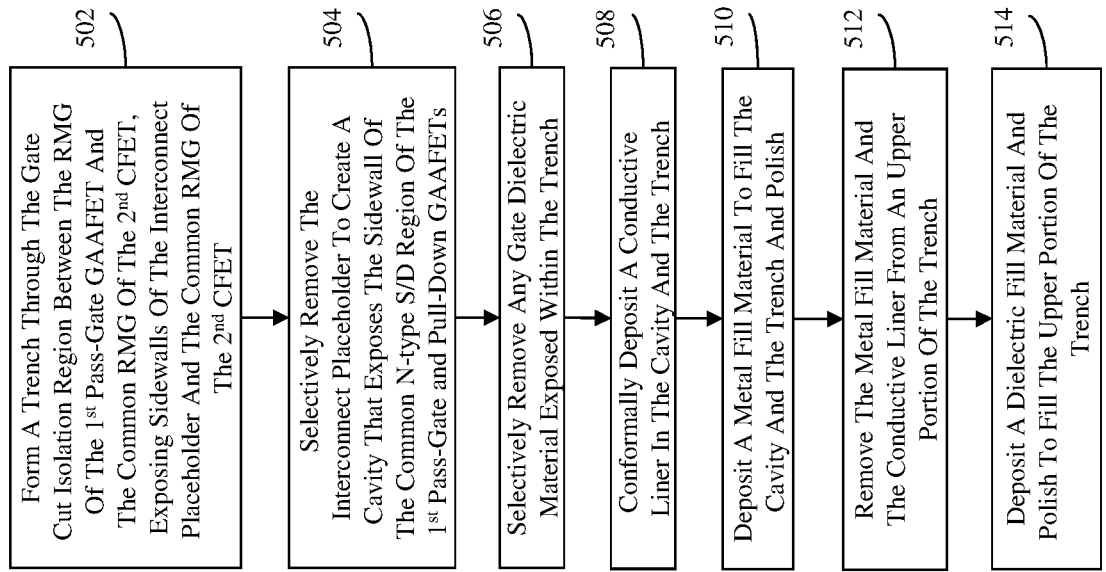
FIG. 5 is a flow diagram further illustrating process step 440 of the flow diagram of FIG. 4.
Figure 6A:
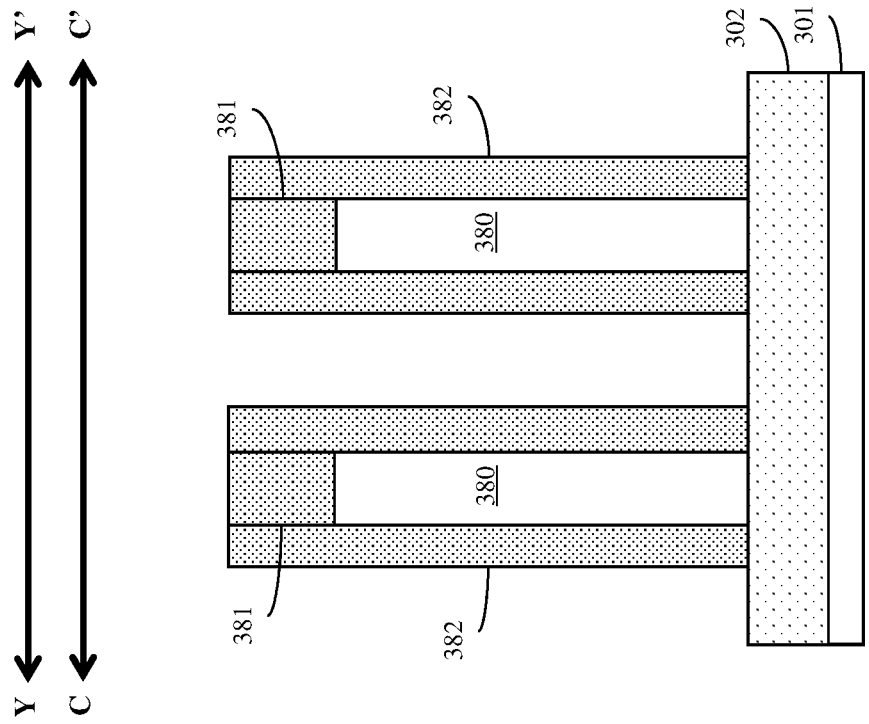
Figure 6B:
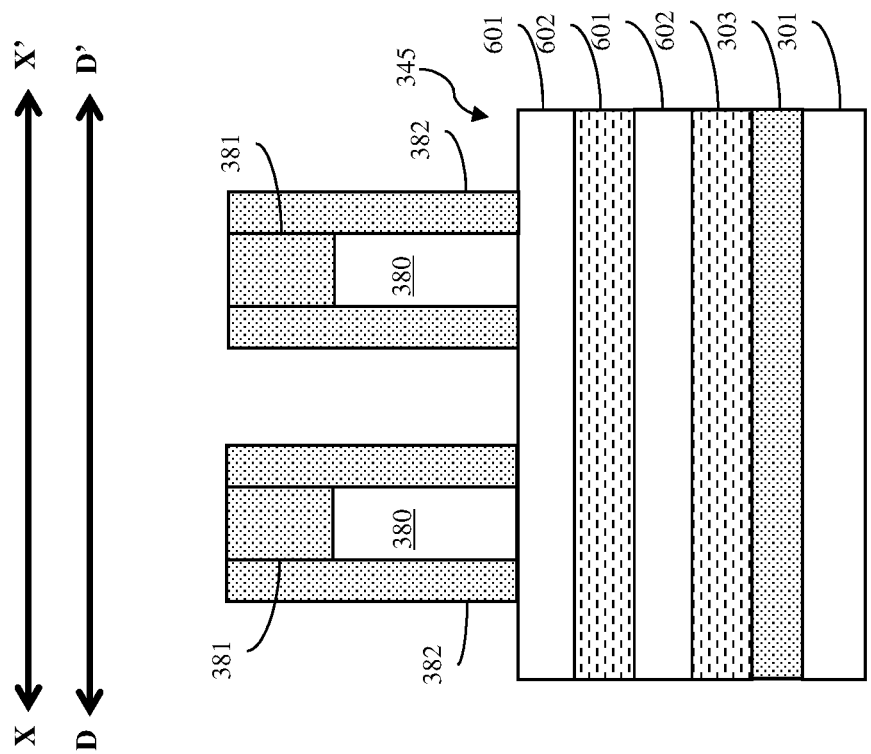
Figure 18B:
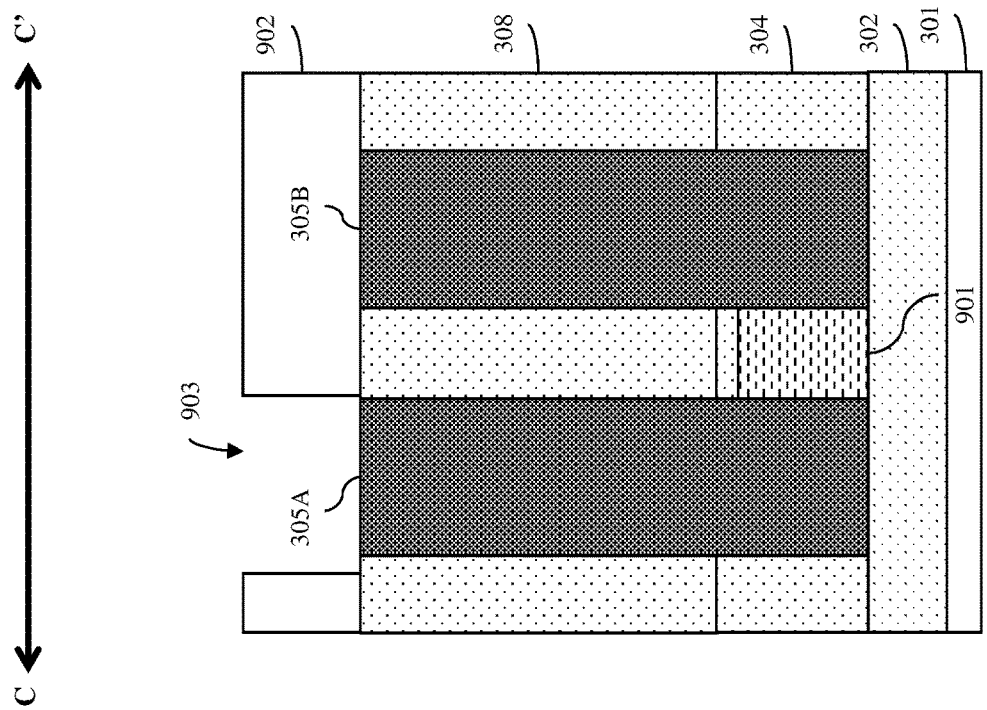
FIGS. 18A-18B are different cross-section diagrams illustrating a partially completed IC structure formed according to the disclosed method.
Figure 18A:
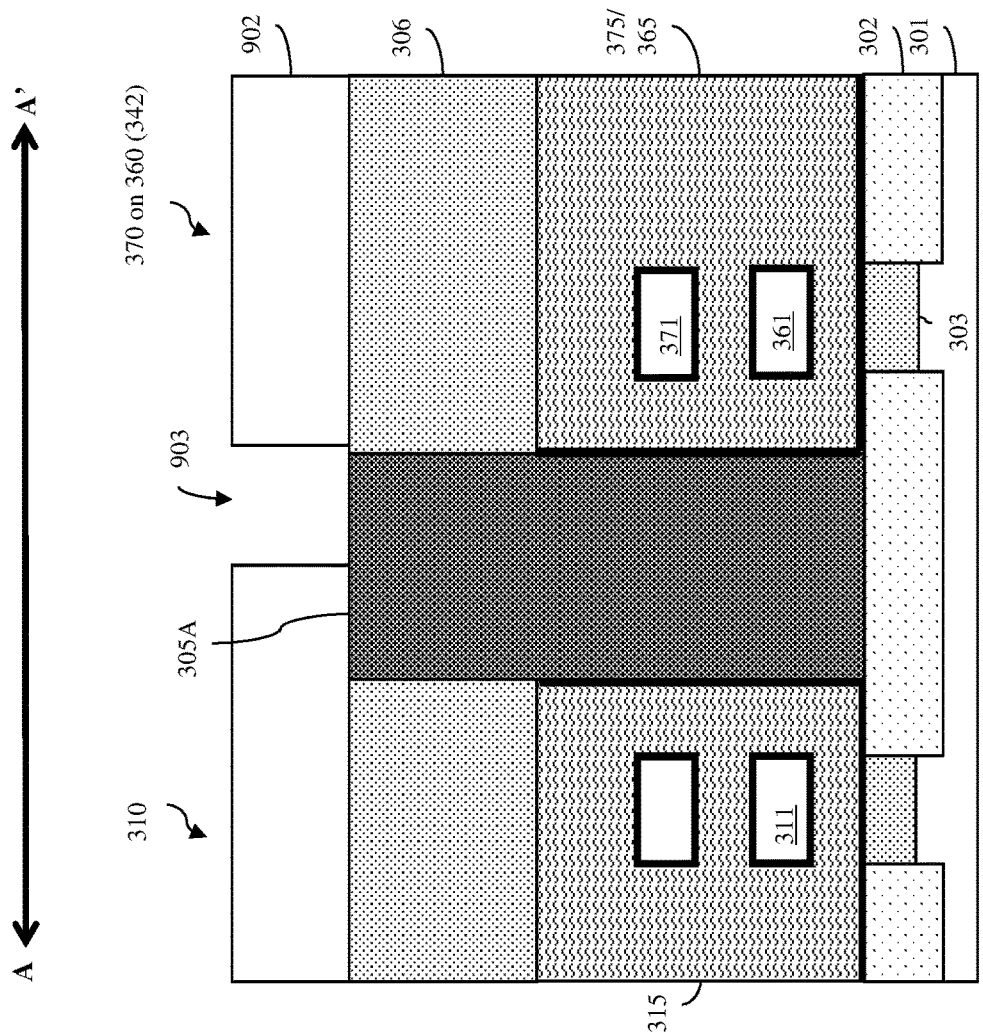
Figure 19B:
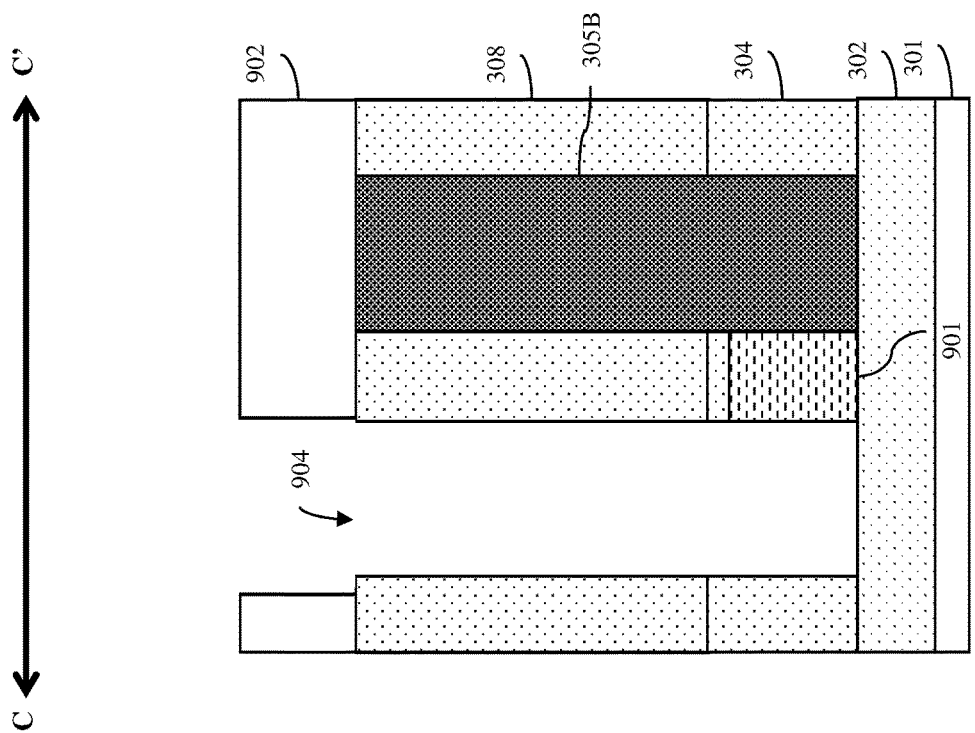
FIGS. 19A-19B are different cross-section diagrams illustrating a partially completed IC structure formed according to the disclosed method.
Figure 19A:
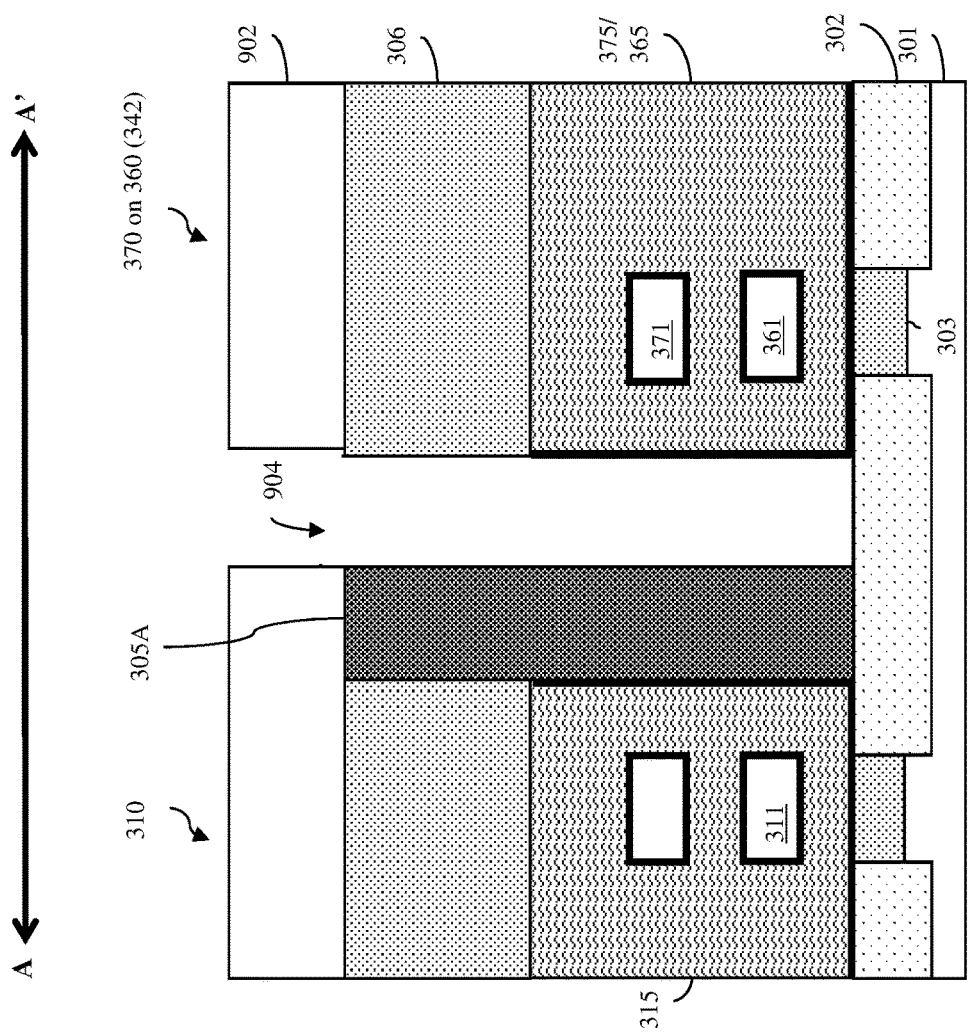

Replacement metal interconnect processing can then be performed in order to form a buried metal interconnect 392 between the common N-type source/drain region 312b/322a of the first pass-gate GAAFET 310 and the first pull-down GAAFET 320 and the common RMG 375/365 of the second pull-up GAAFET 370 and the second pull-down GAAFET 360 (i.e., of the second CFET 342) (see process step 440). Specifically, as illustrated in the flow diagram of FIG. 5, this replacement metal interconnect processing can include forming a mask layer 902 on the top surface of the first layer 308 of ILD material and further extending over the top surfaces of the dielectric gate caps 306 and gate cut isolation regions 305A-305B (see FIGS. 18A-18B). This mask layer 902 can further be lithographically patterned and etched with an opening 903 that extends across the interface between the first gate cut isolation region 305A and the common RMG 375/365 of the second pull-up GAAFET 370 and the second pull-down GAAFET 360 (i.e., the second CFET 342). This opening can then be extended vertically through the first gate cut isolation region 305A, thereby forming a trench 904 that exposes sidewalls of both the interconnect placeholder 901 and the common RMG 375/365 (see process step 502 and FIGS. 19A-19B).

Figure 20C:
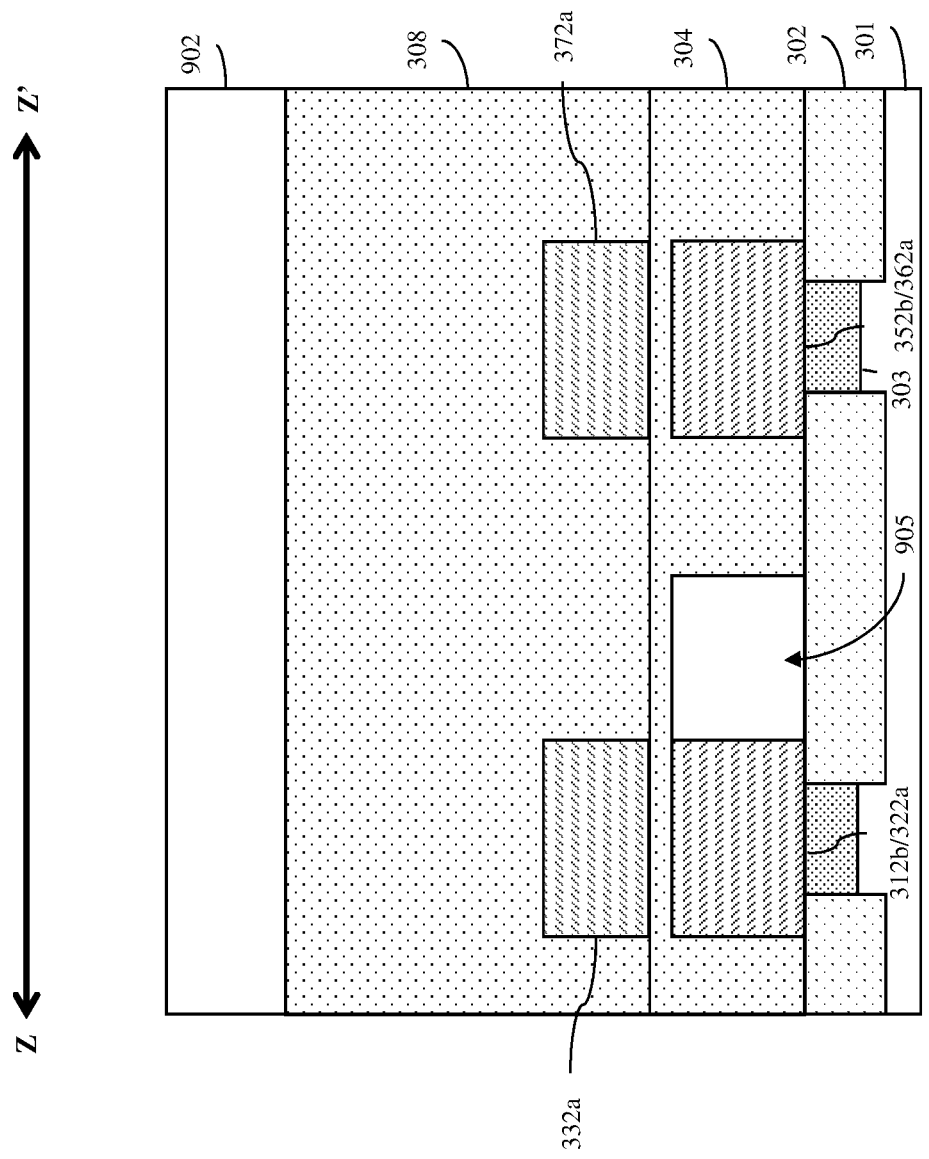
Figures 21A, 21B:
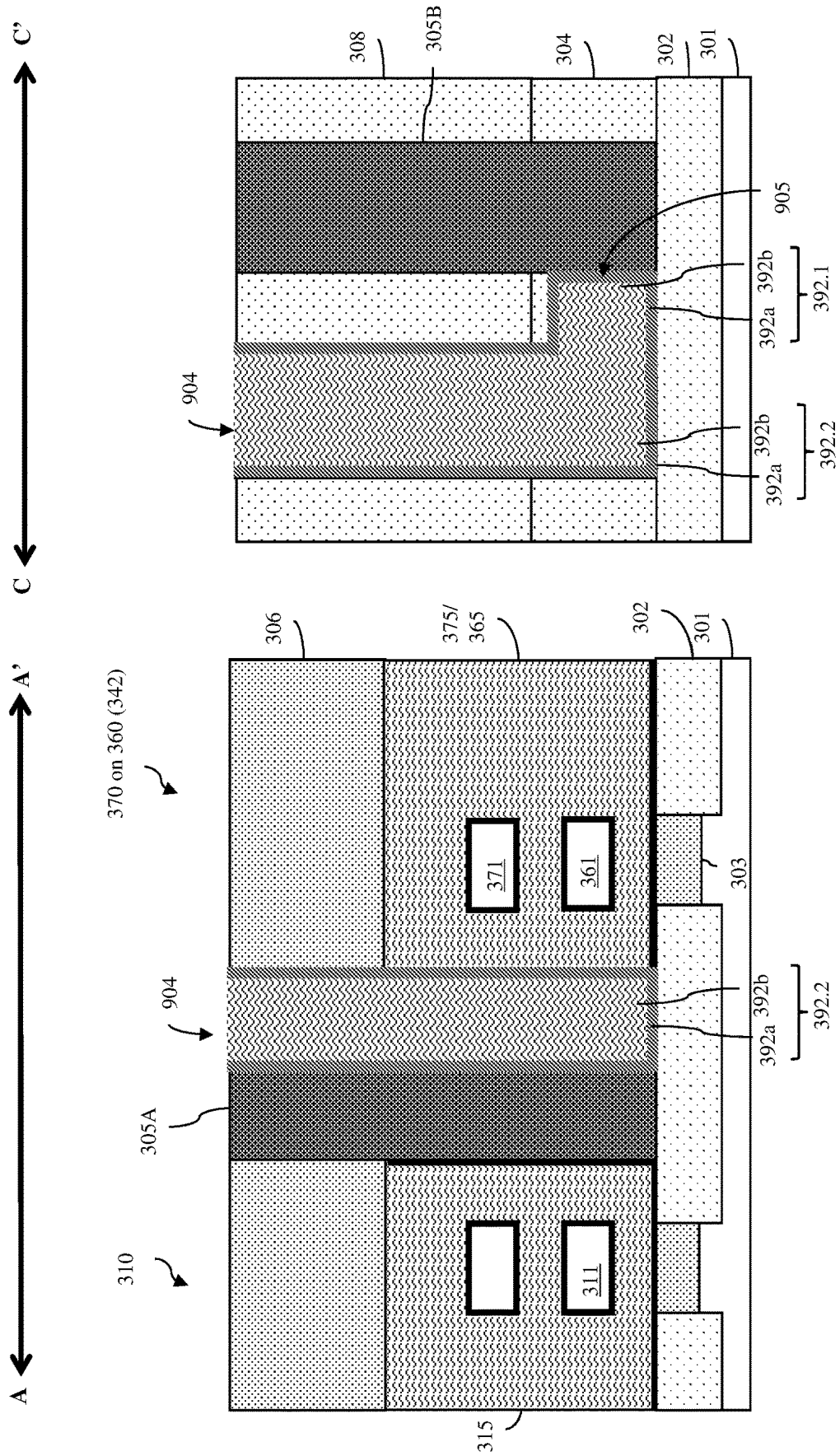
FIGS. 21A-21D are different cross-section diagrams illustrating a partially completed IC structure formed according to the disclosed method.
Figure 21D:
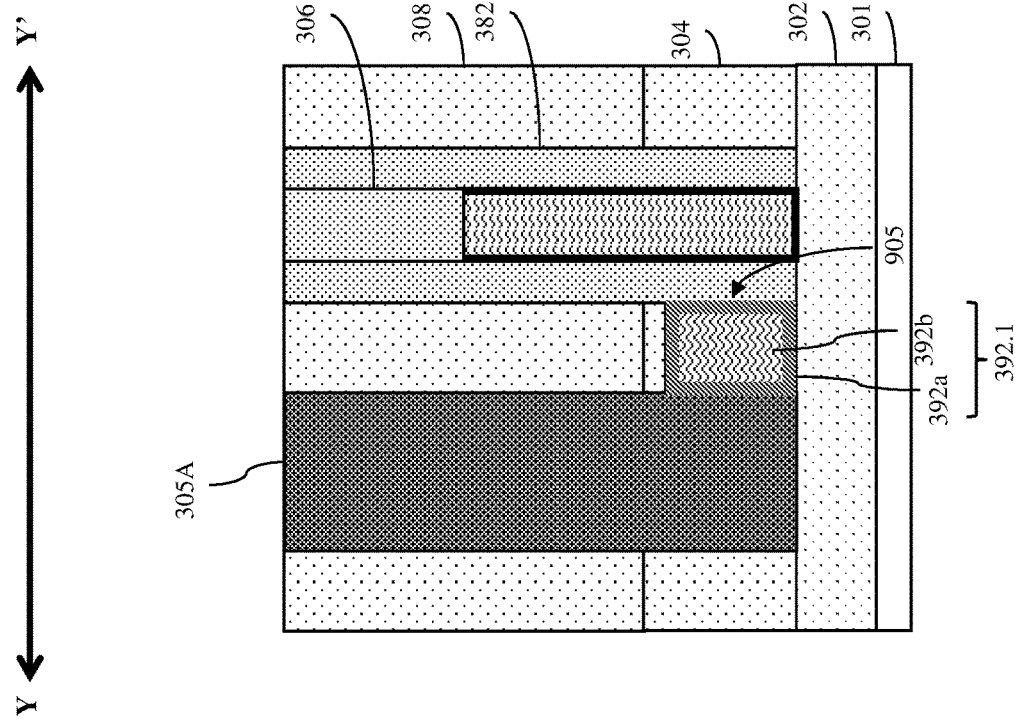
Figure 21C:
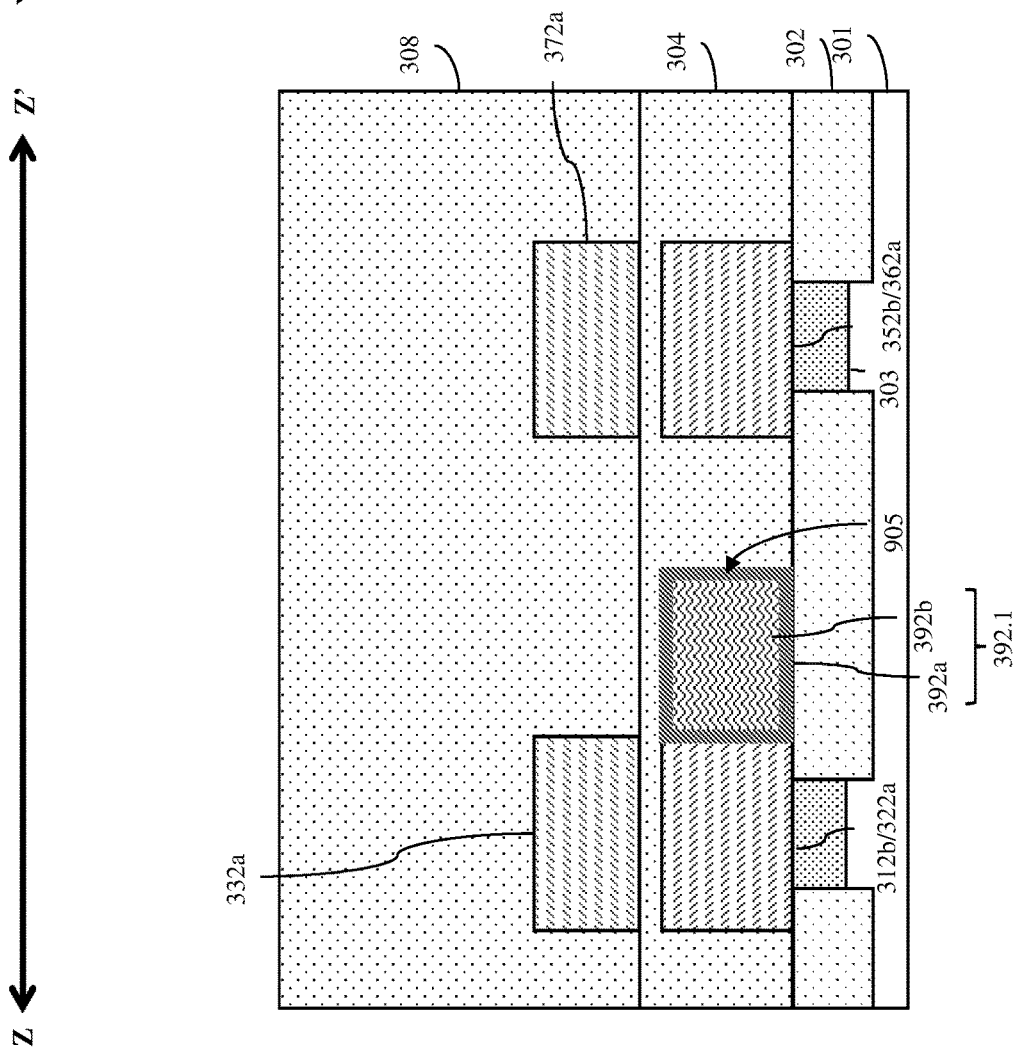

Next, a selective isotropic etch process can be performed so as to selectively remove the interconnect placeholder 901 (see process step 504 and FIGS. 20A-20C). For example, if the N-type source/drain regions are silicon and the sacrificial semiconductor material of the interconnect placeholder 901 is silicon germanium, the silicon germanium can be selectively etched using, for example, a thermal etch process (e.g., using gaseous hydrochloric acid (HCl)), a dry plasma etch process, or a wet etch process with process specifications designed to ensure the selective etch of silicon germanium over silicon and various dielectric materials. Alternatively, any other suitable isotropic selective etch process that selectively etches the interconnect placeholder 901 could be used. As illustrated, removal of the interconnect placeholder 901 creates a cavity 905 that exposes the sidewall of the common N-type source/drain region 312b/322a of the first pass-gate GAAFET 310 and the first pull-down GAAFET 320. Additionally, any gate dielectric material exposed within the trench 904 can be selectively removed (e.g., using a selective isotropic etch process), thereby exposing the gate conductor material of the common RMG 375/365 within the trench 904 (see process step 506).

Figures 22A, 22B:
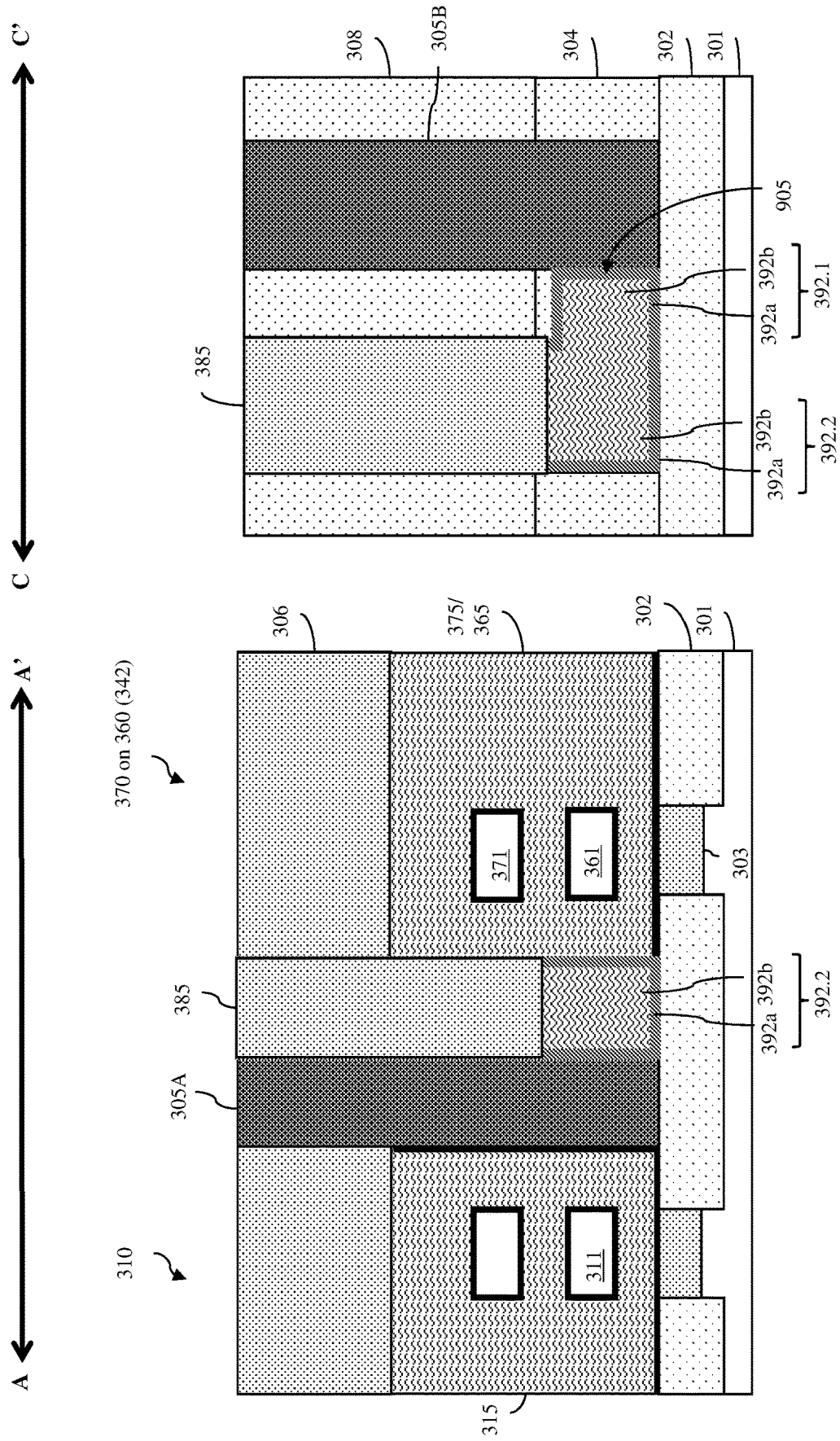
FIGS. 22A-22C are different cross-section diagrams illustrating a partially completed IC structure formed according to the disclosed method.
Figure 22C:
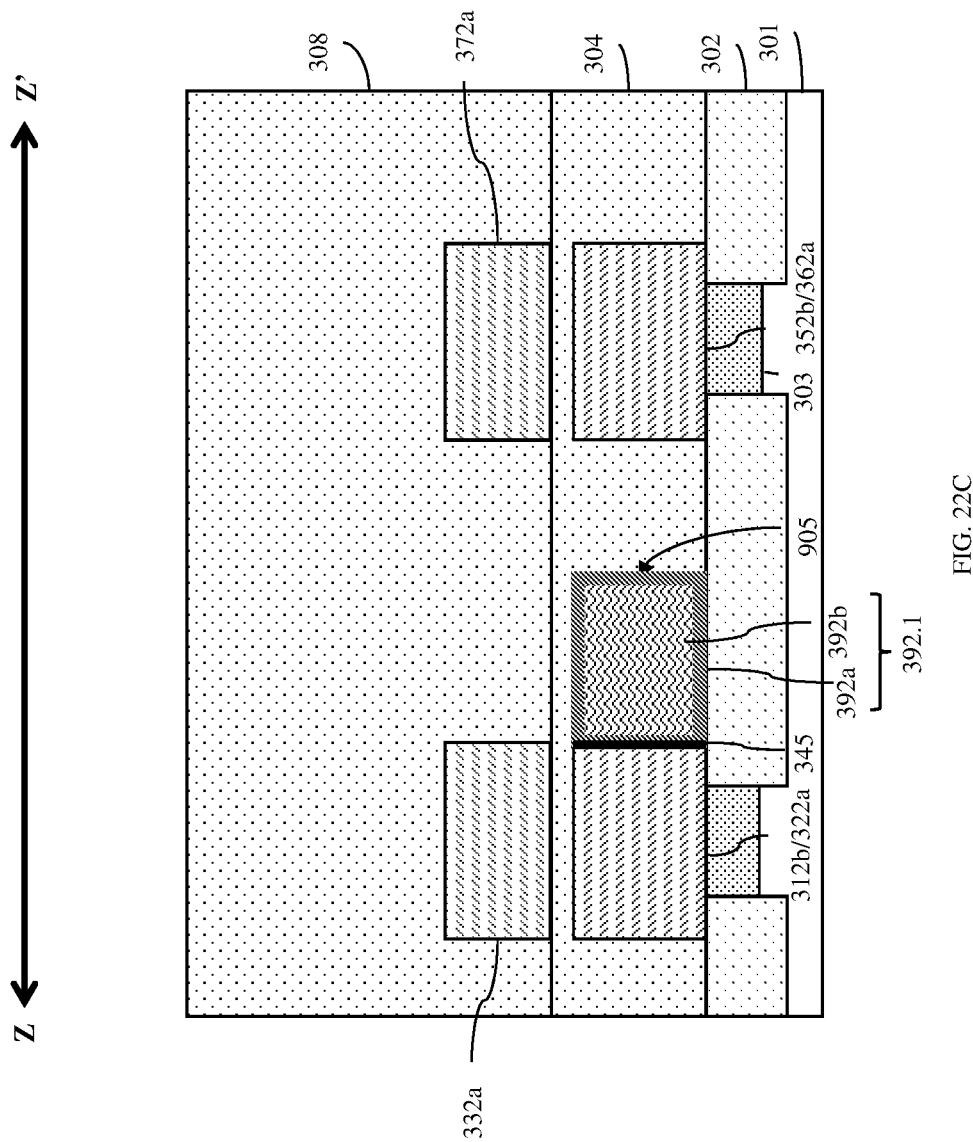

A replacement metal interconnect 392 can subsequently be formed within the cavity 905 and the lower portion of the trench 904. Specifically, a conductive liner 392a can be conformally deposited so as to line the cavity 905 and the trench 904 (see process step 508). The conductive liner 392a can be, for example, one or more conformal conductive layers suitable for promoting adhesion and/or providing a diffusion barrier (e.g., titanium, titanium nitride, tantalum, tantalum nitride, or any other conductive material). Subsequently, one or more layers of metal and/or metal alloy fill materials (e.g., ruthenium, tungsten, cobalt, nickel, aluminum, copper, or any other suitable metal wire material) can be deposited so as to fill the cavity 905 and trench 904 (see process step 510). A polishing process (e.g., a CMP process) can be performed so as to remove the metal interconnect material from above the level of the top surface of the first layer 308 of ILD material (see FIGS. 21A-21D). An etch process can then be performed so as to further remove the metal interconnect material (including the conductive liner and conductive fill material) from the upper portion of the trench 904, thereby forming a metal wire 392b (see process step 512). A dielectric fill material 385 can then be deposited on the metal wire 392b so as to fill the upper portion of the trench 904 and yet another polishing process (e.g., another CMP process) can be performed so as to remove the dielectric fill material 385 from above the level of the top surface of the first layer 308 of ILD material (see process step 514 and FIGS. 22A-22C). The buried metal interconnect 392 will, thus, be essentially L-shaped with a first segment 392.1 within the cavity 905 and a second segment 392.2 in the lower portion of the trench 904. A subsequent anneal process can result in the formation of a metal silicide layer 345 between that sidewall of that common N-type source/drain region 312b/322a and the metal wire 392b of the first segment 392.1.

Referring again to the flow diagram of FIG. 4, additional conventional processing can be performed in order to complete the SRAM cell 300, as shown in FIGS. 3A-3H. This processing can include, but is not limited to, the formation of additional local metal interconnects 391 and 393-394 (see process step 442), deposition of a second layer 309 of ILD material (see process step 444) on the first layer 308, and formation of middle-of-the-line contacts 396-399 in the second layer 309 (see process step 446).

In the disclosed method and structures described above, a semiconductor material refers to a material whose conducting properties can be altered by doping with an impurity. Exemplary semiconductor materials include, for example, silicon-based semiconductor materials (e.g., silicon, silicon germanium, silicon germanium carbide, silicon carbide, etc.) and gallium nitride-based semiconductor materials. A pure semiconductor material and, more particularly, a semiconductor material that is not doped with an impurity for the purposes of increasing conductivity (i.e., an undoped semiconductor material) is referred to in the art as an intrinsic semiconductor. A semiconductor material that is doped with an impurity for the purposes of increasing conductivity (i.e., a doped semiconductor material) is referred to in the art as an extrinsic semiconductor and will be more conductive than an intrinsic semiconductor made of the same base material. That is, extrinsic silicon will be more conductive than intrinsic silicon; extrinsic silicon germanium will be more conductive than intrinsic silicon germanium; and so on. Furthermore, it should be understood that different impurities (i.e., different dopants) can be used to achieve different conductivity types (e.g., P-type conductivity and N-type conductivity) and that the dopants may vary depending upon the different semiconductor materials used. For example, a silicon-based semiconductor material (e.g., silicon, silicon germanium, etc.) is typically doped with a Group III dopant, such as boron (B) or indium (In), to achieve P-type conductivity, whereas a silicon-based semiconductor material is typically doped a Group V dopant, such as arsenic (As), phosphorous (P) or antimony (Sb), to achieve N-type conductivity. A gallium nitride (GaN)-based semiconductor material is typically doped with magnesium (Mg) to achieve P-type conductivity or silicon (Si) to achieve N-type conductivity. Those skilled in the art will also recognize that different conductivity levels will depend upon the relative concentration levels of the dopant(s) in a given semiconductor region.

Additionally, in the disclosed methods and structures described above, the replacement metal gates (RMGs) can include a high-K gate dielectric layer and one or more metal gate conductor layers on the high-K gate dielectric layer. For the purpose of this disclosure, a high-K gate dielectric layer refers to a gate dielectric layer made of a dielectric material with a dielectric constant that is greater than the dielectric constant of silicon dioxide (i.e., greater than 3.9). Exemplary high-K dielectric materials include, but are not limited to, hafnium (Hf)-based dielectrics (e.g., hafnium oxide, hafnium silicon oxide, hafnium silicon oxynitride, hafnium aluminum oxide, etc.) or other suitable high-k dielectrics (e.g., aluminum oxide, tantalum oxide, zirconium oxide, etc.). The metal gate conductor layer(s) can include a conformal metal or metal alloy material layer selected for its suitability for both N-type and P-type field effect transistor operation and wrapping around the channel regions of the various GAAFETs. Alternatively, in the RMGs of the pass-gate GAAFETs and in the lower portions of the common RMGs for the CFETs, the metal gate conductor layer(s) can include a conformal metal or metal alloy material layer having a work function with the range of about 3.9 eV to about 4.2 eV, selected for its suitability specifically for N-type field effect transistor operation, and wrapped around the channel regions of the N-type GAAFETs. Exemplary metals (and metal alloys) having a work function within this range include, but are not limited to, hafnium, zirconium, titanium, tantalum, aluminum, and alloys thereof, such as, hafnium carbide, zirconium carbide, titanium carbide, tantalum carbide, and aluminum carbide. Furthermore, in the upper portions of the common RMGs for the CFETs, the metal gate conductor layer(s) can include a conformal metal or metal alloy material layer having a work function with the range of between about 4.9 eV and about 5.2 eV, selected for its suitability specifically for P-type field effect transistor operation, and wrapped around the channel regions of the P-type GAAFETs. Exemplary metals (and metal alloys) having a work function within this range include, but are not limited to, ruthenium, palladium, platinum, cobalt, and nickel, as well as metal oxides (aluminum carbon oxide, aluminum titanium carbon oxide, etc.) and metal nitrides (e.g., titanium nitride, titanium silicon nitride, tantalum silicon nitride, titanium aluminum nitride, tantalum aluminum nitride, etc.). In any case, the metal gate conductor layer(s) can also include a fill metal or fill metal alloy, such as tungsten, a tungsten alloy (e.g., tungsten silicide or titanium tungsten), cobalt, aluminum or any other suitable fill metal or fill metal alloy.

It should be understood that the terminology used herein is for the purpose of describing the disclosed structures and methods and is not intended to be limiting. For example, as used herein, the singular forms "a", "an" and "the" are intended to include the plural forms as well, unless the context clearly indicates otherwise. Additionally, as used herein, the terms "comprises" "comprising", "includes" and/or "including" specify the presence of stated features, integers, steps, operations, elements, and/or components, but do not preclude the presence or addition of one or more other features, integers, steps, operations, elements, components, and/or groups thereof. Furthermore, as used herein, terms such as "right", "left", "vertical", "horizontal", "top", "bottom", "upper", "lower", "under", "below", "underlying", "over", "overlying", "parallel", "perpendicular", etc., are intended to describe relative locations as they are oriented and illustrated in the drawings (unless otherwise indicated) and terms such as "touching", "in direct contact", "abutting", "directly adjacent to", "immediately adjacent to", etc., are intended to indicate that at least one element physically contacts another element (without other elements separating the described elements). The term "laterally" is used herein to describe the relative locations of elements and, more particularly, to indicate that an element is positioned to the side of another element as opposed to above or below the other element, as those elements are oriented and illustrated in the drawings. For example, an element that is positioned laterally adjacent to another element will be beside the other element, an element that is positioned laterally immediately adjacent to another element will be directly beside the other element, and an element that laterally surrounds another element will be adjacent to and border the outer sidewalls of the other element. The corresponding structures, materials, acts, and equivalents of all means or step plus function elements in the claims below are intended to include any structure, material, or act for performing the function in combination with other claimed elements as specifically claimed.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. An integrated circuit structure comprising:
    a complementary field effect transistor comprising:
        first-type source/drain regions for a lower-level transistor;
        an isolation layer above the first-type source/drain regions, wherein the isolation layer has an essentially planar top surface; and
        second-type source/drain regions for an upper-level transistor above and immediately adjacent to the planar top surface of the isolation layer;
    a metal interconnect entirely below a level of the planar top surface of the isolation layer; and
    an isolation region,
    wherein the metal interconnect has a first segment above and immediately adjacent to the isolation region and a second segment above and immediately adjacent to the isolation region and further perpendicular to the first segment,
    wherein the first segment is in contact with a sidewall of a selected first-type source/drain region of the first-type source/drain regions of the lower-level transistor,
    wherein the metal interconnect comprises a metal wire and a conductive liner immediately adjacent to bottom, side and top surfaces of the metal wire, and
    wherein the isolation layer extends laterally onto the first segment of the metal interconnect.

2. The integrated circuit structure of claim 1, further comprising an additional field effect transistor that is positioned laterally adjacent and parallel to the complementary field effect transistor,
    wherein the additional field effect transistor comprises a gate, and
    wherein the second segment of the metal interconnect is in contact with a metal gate conductor layer at a sidewall of the gate.

3. The integrated circuit structure of claim 2,
    wherein a top surface of the metal wire in the first segment is entirely covered by the conductive liner, and
    wherein a top surface of the metal wire in the second segment is devoid of the conductive liner.

4. The integrated circuit structure of claim 2, wherein the isolation layer extends laterally over the first segment such that the isolation layer is immediately adjacent to the conductive liner and wherein the integrated circuit structure further comprises a dielectric fill material on the second segment above and immediately adjacent to the metal wire.

5. The integrated circuit structure of claim 2, wherein the first segment further comprises a silicide layer positioned laterally between the sidewall of the selected first-type source/drain region of the lower-level transistor and the metal wire of the first segment of the metal interconnect.

6. The integrated circuit structure of claim 2, wherein the selected first-type source/drain region of lower-level transistor and the first segment of the metal interconnect have essentially co-planar top surfaces.

7. The integrated circuit structure of claim 2, further comprising a static random access memory cell,
    wherein, within the static random access memory cell, the complementary field effect transistor comprises: a first pull-down transistor and a first pull-up transistor stacked above the first pull-down transistor; and the additional field effect transistor comprises a second complementary field effect transistor comprising: a second pull-down transistor and a second pull-up transistor stacked above the second pull-down transistor,
    wherein the static random access memory cell further comprises a first pass-gate transistor that abuts the first pull-down transistor and a second pass-gate transistor that abuts the second pull-down transistor, and
    wherein the selected first-type source/drain region and the gate electrically connected by the metal interconnect are a common N-type source/drain region of the first pass-gate transistor and the first pull-down transistor and a common gate of the second pull-up transistor and the second pull-down transistor, respectively.

8. The integrated circuit structure of claim 7,
    wherein a gate of the first pass-gate transistor is in end-to-end alignment with the common gate of the second pull-up transistor and the second pull-down transistor,
    wherein a gate cut isolation region electrically isolates the gate of the first pass-gate transistor from the common gate of the second pull-up transistor and the second pull-down transistor,
    wherein the first segment of the metal interconnect is parallel to the gate of the first pass-gate transistor and to the common gate of the second pull-up transistor and the second pull-down transistor,
    wherein the first segment of the metal interconnect is further in contact with the gate cut isolation region, and
    wherein the second segment of the metal interconnect is positioned laterally between the gate cut isolation region and an end of the common gate of the second pull-up transistor and the second pull-down transistor.

9. An integrated circuit structure comprising:
a complementary field effect transistor comprising:
   first-type source/drain regions for a lower-level transistor;
   an isolation layer above the first-type source/drain regions; and
   second-type source/drain regions for an upper-level transistor on the isolation layer;
a metal interconnect in contact with a sidewall of a selected first-type source/drain region of the first-type source/drain regions of the lower-level transistor,
   wherein the metal interconnect comprises a metal wire and a conductive liner immediately adjacent to bottom, side and top surfaces of the metal wire, and
   wherein the isolation layer extends laterally onto the metal interconnect; and
an additional field effect transistor that is positioned laterally adjacent and parallel to the complementary field effect transistor,
   wherein the additional field effect transistor comprises a gate,
   wherein a first segment of the metal interconnect is in contact with the selected first-type source/drain region of the lower-level transistor,
   wherein a second segment of the metal interconnect is perpendicular to the first segment and in contact with a metal gate conductor layer of the gate,
   wherein a top surface of the metal wire in the first segment is entirely covered by the conductive liner, and
   wherein a top surface of the metal wire in the second segment is devoid of the conductive liner.

10. The integrated circuit structure of claim 9, wherein the isolation layer extends laterally over the first segment such that the isolation layer is immediately adjacent to the conductive liner and wherein the integrated circuit structure further comprises a dielectric fill material on the second segment above and immediately adjacent to the metal wire.

11. The integrated circuit structure of claim 9, wherein the first segment further comprises a silicide layer positioned laterally between the sidewall of the selected first-type source/drain region of the lower-level transistor and the metal wire of the first segment of the metal interconnect.

12. The integrated circuit structure of claim 9, wherein the selected first-type source/drain region of lower-level transistor and the first segment of the metal interconnect have essentially co-planar top surfaces.

13. The integrated circuit structure of claim 9, further comprising a static random access memory cell,
   wherein, within the static random access memory cell, the complementary field effect transistor comprises: a first pull-down transistor and a first pull-up transistor stacked above the first pull-down transistor; and the additional field effect transistor comprises a second complementary field effect transistor comprising: a second pull-down transistor and a second pull-up transistor stacked above the second pull-down transistor,
   wherein the static random access memory cell further comprises a first pass-gate transistor that abuts the first pull-down transistor and a second pass-gate transistor that abuts the second pull-down transistor, and
   wherein the selected first-type source/drain region and the gate electrically connected by the metal interconnect are a common N-type source/drain region of the first pass-gate transistor and the first pull-down transistor and a common gate of the second pull-up transistor and the second pull-down transistor, respectively.

14. The integrated circuit structure of claim 13,
   wherein a gate of the first pass-gate transistor is in end-to-end alignment with the common gate of the second pull-up transistor and the second pull-down transistor,
   wherein a gate cut isolation region electrically isolates the gate of the first pass-gate transistor from the common gate of the second pull-up transistor and the second pull-down transistor,
   wherein the first segment of the metal interconnect is parallel to the gate of the first pass-gate transistor and to the common gate of the second pull-up transistor and the second pull-down transistor,
   wherein the first segment of the metal interconnect is further in contact with the gate cut isolation region, and
   wherein the second segment of the metal interconnect is positioned laterally between the gate cut isolation region and an end of the common gate of the second pull-up transistor and the second pull-down transistor.

15. An integrated circuit structure comprising:
a complementary field effect transistor comprising:
   first-type source/drain regions for a lower-level transistor;
   an isolation layer above the first-type source/drain regions; and
   second-type source/drain regions for an upper-level transistor on the isolation layer;
a metal interconnect in contact with a sidewall of a selected first-type source/drain region of the first-type source/drain regions of the lower-level transistor,
   wherein the metal interconnect comprises a metal wire and a conductive liner immediately adjacent to bottom, side and top surfaces of the metal wire, and
   wherein the isolation layer extends laterally onto the metal interconnect;
additional field effect transistor that is positioned laterally adjacent and parallel to the complementary field effect transistor,
   wherein the additional field effect transistor comprises a gate,
   wherein a first segment of the metal interconnect is in contact with the selected first-type source/drain region of the lower-level transistor, and
   wherein a second segment of the metal interconnect is perpendicular to the first segment and in contact with a metal gate conductor layer of the gate; and
a static random access memory cell,
   wherein, within the static random access memory cell, the complementary field effect transistor comprises: a first pull-down transistor and a first pull-up transistor stacked above the first pull-down transistor; and the additional field effect transistor comprises a second complementary field effect transistor comprising: a second pull-down transistor and a second pull-up transistor stacked above the second pull-down transistor,
   wherein the static random access memory cell further comprises a first pass-gate transistor that abuts the first pull-down transistor and a second pass-gate transistor that abuts the second pull-down transistor, and
   wherein the selected first-type source/drain region and the gate electrically connected by the metal interconnect are a common N-type source/drain region of the first pass-gate transistor and the first pull-down transistor and a common gate of the second pull-up transistor and the second pull-down transistor, respectively.

16. The integrated circuit structure of claim 15,
wherein a top surface of the metal wire in the first segment is entirely covered by the conductive liner, and
wherein a top surface of the metal wire in the second segment is devoid of the conductive liner.

17. The integrated circuit structure of claim 15, wherein the isolation layer extends laterally over the first segment such that the isolation layer is immediately adjacent to the conductive liner and wherein the integrated circuit structure further comprises a dielectric fill material on the second segment above and immediately adjacent to the metal wire.

18. The integrated circuit structure of claim 15, wherein the first segment further comprises a silicide layer positioned laterally between the sidewall of the selected first-type source/drain region of the lower-level transistor and the metal wire of the first segment of the metal interconnect.

19. The integrated circuit structure of claim 15, wherein the selected first-type source/drain region of lower-level transistor and the first segment of the metal interconnect have essentially co-planar top surfaces.

20. The integrated circuit structure of claim 19,
wherein a gate of the first pass-gate transistor is in end-to-end alignment with the common gate of the second pull-up transistor and the second pull-down transistor,
wherein a gate cut isolation region electrically isolates the gate of the first pass-gate transistor from the common gate of the second pull-up transistor and the second pull-down transistor,
wherein the first segment of the metal interconnect is parallel to the gate of the first pass-gate transistor and to the common gate of the second pull-up transistor and the second pull-down transistor,
wherein the first segment of the metal interconnect is further in contact with the gate cut isolation region, and
wherein the second segment of the metal interconnect is positioned laterally between the gate cut isolation region and an end of the common gate of the second pull-up transistor and the second pull-down transistor.

* * * * *